United States Patent
Miura et al.

[19]

[11] Patent Number: 5,847,968
[45] Date of Patent: Dec. 8, 1998

[54] PRINTED CIRCUIT BOARD CAD DEVICE WHICH ALTERNATES PLACING COMPONENTS AND ROUTING CONNECTORS BETWEEN THEM

[75] Inventors: Shinji Miura, Kyoto; Masayuki Tsuchida, Osaka; Hirokazu Uemura, Yao; Hiroyuki Yoshimura, Ashiya; Yuichi Nishimura, Takarazuka, all of Japan

[73] Assignee: Matsushita Electric Industrial Co., Ltd., Osaka-Fu, Japan

[21] Appl. No.: 605,540

[22] Filed: Feb. 16, 1996

[30] Foreign Application Priority Data

Feb. 20, 1995 [JP] Japan .................... 7-031175

[51] Int. Cl.⁶ .................... H02B 1/24; G06F 17/50
[52] U.S. Cl. .................... 364/491; 364/489
[58] Field of Search .................... 364/488–491; 395/560

[56] References Cited

U.S. PATENT DOCUMENTS 5,187,668  2/1993  Okude et al. .................... 364/468
5,353,234  10/1994  Takigami .................... 364/489
5,493,510  2/1996  Shikata .................... 364/491
5,513,124  4/1996  Trimberger et al. .................... 364/481
5,535,134  7/1996  Cohn .................... 364/491

FOREIGN PATENT DOCUMENTS 314181  1/1991  Japan .

OTHER PUBLICATIONS

Coticchia et al, CAO/CAM/Che Systems, pp. 181–186, Jan. 1993.

Japanese Laid Open Patent Application, 314181, Jan. 1991.

*Primary Examiner*—Kevin J. Teska
*Assistant Examiner*—Dan Fiul
*Attorney, Agent, or Firm*—Price Gess & Ubell

[57] ABSTRACT

When a component is placed on a circuit board, a placement position is determined by method of elastic center. Then, it is determined whether the component was placed on the circuit board. After that, connectors are routed between the component and a design candidate component which is already placed. After that, the next component is set, and the above mentioned packaging processing is repeated.

21 Claims, 48 Drawing Sheets

Fig. 5A
| COMPONENT NUMBER | COMPONENT NAME | COORDINATES | SURFACE | ANGLE |
|---|---|---|---|---|
| IC1 | MN700 | (20,100) | 1 | 0 |
| IC3 | MN700 | (35,100) | 6 | 180 |
| ... | | | | |
Fig. 5B
| COMPONENT NAME | OUTLINE | TERMINAL OUTLINE | TERMINAL NUMBER | RELATIVE COORDINATES OF EACH TERMINAL |
|---|---|---|---|---|
| MN700 | (0,0),(3,0),(3,5),(0,5) | ... | ... | ... |
| ... | | | | |
Fig. 5C
| NET NAME | TERMINAL INFORMATION (COMPONENT NUMBER —TERMINAL NUMBER) |
|---|---|
| A | IC1-1,R20-1,IC3-5 |
| B | IC1-4,IC3-3 |
| ... | |
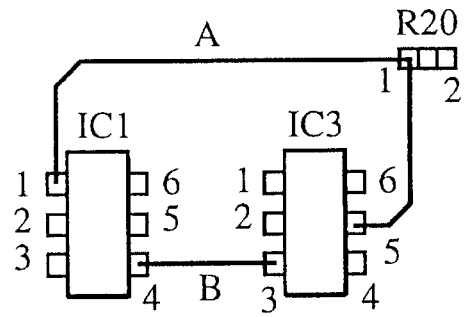
Fig. 5D
| ID | NET NAME | ID OF A SURFACE | NUMBER OF CONSTITUTING POINTS | COORDINATES OF CONSTITUTING POINTS |
|---|---|---|---|---|
| 1 | A1 | 1 | 6 | (19,103)(24,103)(54,88)... |
| ... | A2 | 1 | 6 | (19,120)(24,120)(58,92)... |
| 3 | A3 | 1 | 6 | (19,140)(24,140)... |
| 4 | A4 | 1 | 6 | (19,160)(24,160)... |
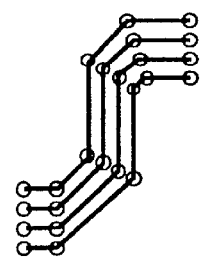

Fig. 6A

DESIGN CANDIDATE
COMPONENT
INFORMATION

| COMPONENT NUMBER |
|---|
| IC1 |
| IC2 |
| IC100 |
| IC200 |
| .... |

Fig. 6B

DESIGN METHOD
INFORMATION

| NET NAME | ROUTING METHOD |
|---|---|
| TN1 | EXTEND ROUTING |
| TN2 | EXTEND ROUTING |
| AD1 | ENTIRE ROUTING |
| AD2 | ENTIRE ROUTING |
| .... | .... |

Fig. 6C

| ID | TYPE OF PROHIBITION | CAUSE OF PROHIBITION | SURFACE | OUTLINE |
|---|---|---|---|---|
| 1 | PROHIBITION ON ROUTING CONNECTORS | PROHIBITION BY FOIL | 1 | (5,10),(8,10),(8,15),(5,15) |
| 2 | PROHIBITION ON ROUTING CONNECTORS | PROHIBITION BY COMPONENTS | 1 | ... |
| 3 | PROHIBITION ON ROUTING CONNECTORS | PROHIBITION BY FOIL | 1 | (5,15),(8,15),(8,20),(5,20) |
|   |   |   |   |   |

Fig. 6D

| ITEM | VALUE |
|---|---|
| WIDTH OF ROUTING FOIL | 0.2 |
| ROUTING FOIL MINIMUM INTERVAL | 0.15 |
| FOIL−TERMINAL PAD MINIMUM INTERVAL | 0.3 |
| .... |   |

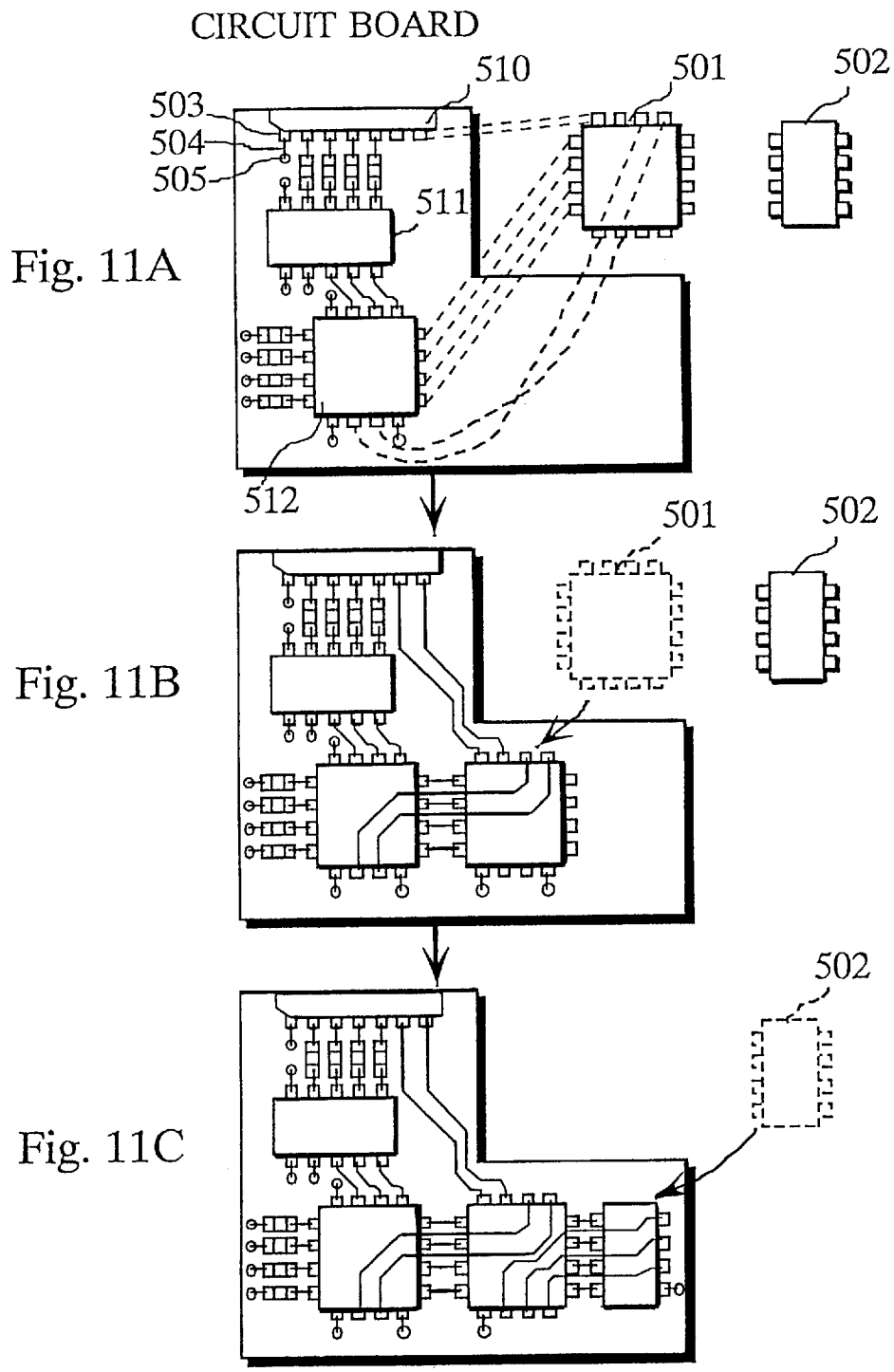

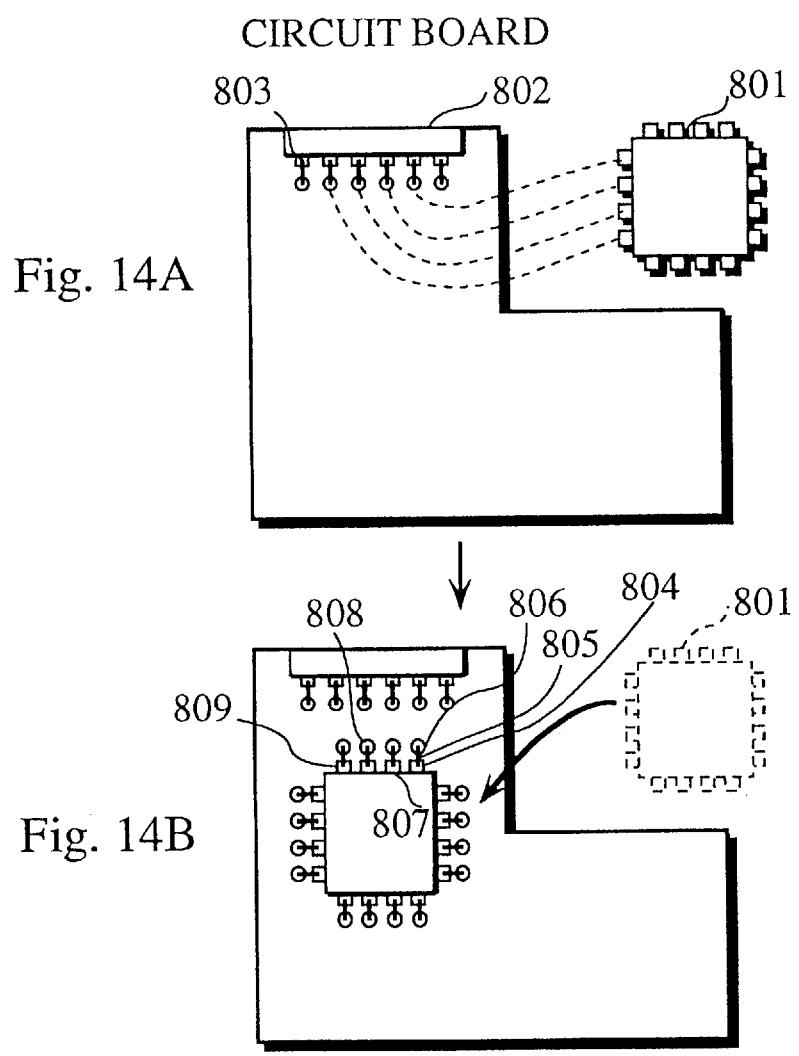

MOVEMENT OF AN OBSTACLE COMPONENT

PACKAGING DESIGN RESULT

PACKAGING RESULT

CIRCUIT BOARD OUTLINE ENLARGED

CIRCUIT BOARD OUTLINE SHRINKED

FINAL DESIGN RESULT

FINAL RESULT

Fig. 24

| NET NAME | TERMINALS BELONGING TO NET | CRITICAL PATH (A LARGE CURRENT, HICH FREQUENCIES,etc.) | DATA OR ADDRESS BUS |
|---|---|---|---|
| A | IC1-1、IC3-5 | × | ○ |
| B | IC5-5、IC6-7 | × | × |
| C | IC7-1、IC10-5 | ○ | × |

SUB-FLOWCHART FOR MOVEMENT TARGET POINT CALCULATION PROCESSING

FLOWCHART FOR THE FIFTH EMBODIMENT

PLACEMENT POSITION DETERMINATION—1

INFORMATION FOR DRAWING ROUTING

| NET NAME | DRAWING DIRECTION | MAXIMUM/MINIMUM DISTANCE |
|---|---|---|
| A | RIGHT (UP,DOWN,LEFT,RIGHT) | 0.3~0.5 |

FLOWCHART FOR THE SEVENTH EMBODIMENT

FLOWCHART FOR ADDING NET DATA

Fig. 38

| ID | TYPE OF PROHIBITION | CAUSE OF PROHIBITION | SURFACE | OUTLINE | NET NAME |
|---|---|---|---|---|---|
| 1 | ROUTING | FOIL | 1 | (5,10),(8,10),(8,15),(5,15) | AD1 |
| 2 | ROUTING | COMPONENT | 1 | ... | NO NET DATA |
| 3 | ROUTING | FOIL | 1 | (5,15),(8,15),(8,20),(5,20) | DD1 |

RE-ROUTING OF OBSTACLE CONNECTORS

RE-ROUTING OF OBSTACLE CONNECTORS

PHASE 1

PHASE 2

PHASE 3

PHASE 4

Fig. 47A
CIRCUIT DIAGRAM
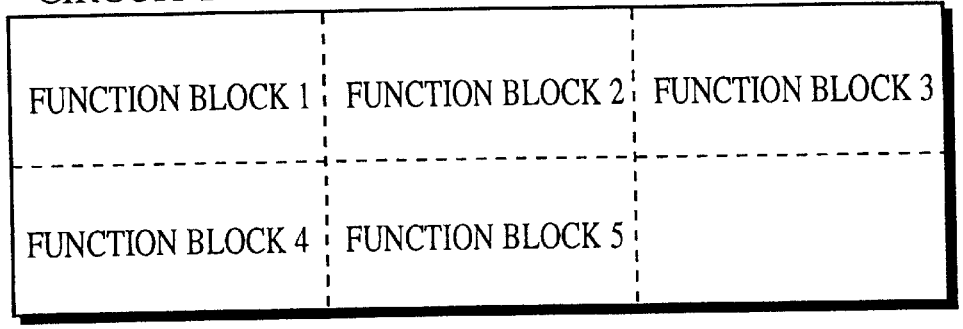
Fig. 47B
| FUNCTION BLOCK NAME | COMPONENT NUMBER | ASSIGNMENT INFORMATION |
|---|---|---|
| FUNCTION BLOCK1 | IC11、IC12、IC13、IC14 | (0,0)(0,40)(70,40)(70,0) |
| FUNCTION BLOCK2 | IC21、IC22、IC23 | (70,0)(140,0)(70,40)(140,40) |
| FUNCTION BLOCK3 | IC31、IC32、IC33、IC34 | (0,40)(0,80)(70,40) |
| FUNCTION BLOCK4 | IC41、IC42 | ⋮ |
| FUNCTION BLOCK5 | IC51、IC52、IC53、IC54 | |
Fig. 47C
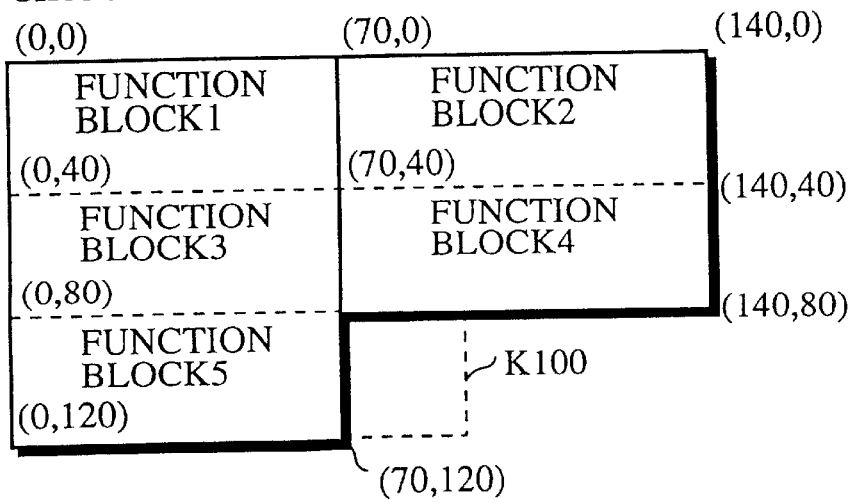

(1) PACKAGING COMPLETED (2) OUTLINE OF THE ENLARGED CIRCUIT BOARD

PRINTED CIRCUIT BOARD CAD DEVICE WHICH ALTERNATES PLACING COMPONENTS AND ROUTING CONNECTORS BETWEEN THEM

BACKGROUND OF THE INVENTION (1) Field of the Invention

The present invention relates to a printed circuit board CAD device which determines a placement position of each component and routing paths of connectors between them in a component group in a schematic circuit diagram.

(2) Description of the Related Art

In recent years, the size of portable information processing devices is rapidly becoming compact. In order to miniaturize a printed circuit board and MCM, how to realize high-density packaging design has been studied frequently. Packaging design is determining a circuit board layout where components in a schematic circuit diagram should be placed and how connectors between them should be routed on the circuit board. High-density packaging design can minimize the size of a printed circuit board as much as possible.

However, it is unpredictable to what extent packaging design which remains is true to the schematic circuit diagram can be implemented. So a designer implements packaging design with a circuit board of a temporary size. If components and connectors cannot be contained or a space area is generated on the circuit board, the designer resets the size of the circuit board and implements packaging (This is called temporary packaging. If components and connectors cannot be contained on the circuit board, the packaging is a failure; if this is not the case, the packaging is a success.). The designer has to repeat such temporary packaging many times, and obtains optimal layout (packaging design true to the schematic circuit diagram on the minimum-size circuit board).

A printed circuit board CAD device is used for repeating temporary packaging mentioned above. It can automatically implement the temporary packaging, so it is becoming popular in the field of packaging design. Automatic packaging design by a printed circuit board CAD device includes: automatic placement processing like a method of elastic center and method using "knowledge"; and automatic routing processing like maze method and line search method.

A printed circuit board CAD device is introduced in "CAD/CAE system corresponding to high-function packaging", featured in Jul. 1993 issue of "Electronics Packaging Technology", a publication by Jouhou-Chousa-Kai (Inc.); and "CAE on a Printed Circuit Board", under the supervision of Teruhiko Yamada, a publication by Ouyou-Gijutsu-Shuppan, Jan. 14, 1990.

Method of elastic center can be explained as follows: It is supposed that tension exists between pin terminals of a component which is placed beforehand and a component about to be placed; the component about to be placed is placed at a certain position in order to make compound vectors of the tension zero.

Component placement method using "knowledge" can be explained as follows: information like "memory has to be placed as a group" and "related discrete components have to be arranged in a row" is stored beforehand, and components are placed based on it. Automatic placement processing using knowledge is introduced in "Knowledge Base Type High-Density Printed Circuit Board Automatic Design System" pages 84 to 89, featured in April 1993 issue of "National Technical Report", vol. 32, No. 2, magazine code 06813.

The following two methods are well-known automatic routing methods.

(1) Maze Method

In order to obtain a routing path between terminal A and terminal B, normal routing area is ruled off into a grid pattern. "1" is given to small squares adjacent to terminal A on its four sides. Serial numbers are given to vacant squares adjacent to the numbered square. Such number labeling continues until the final of the serial number reaches to a square adjacent to terminal B. Then, a shortest path of serial numbers is determined as a routing path. According to maze method, the shortest routing path can be found for sure as long as two terminals exist, but it takes a long processing time and great storage capacity.

An algorithm can be explained in the following manner by means of FIGS. 1A and 1B. In FIG. 1A, coordinate of a Cartesian coordinate system are given to the small squares. A square containing a white circle represents a starting terminal and the one containing a black circle represents the final terminal.

On the circuit board, "1" is given to the small squares adjacent to the starting terminal on its four sides. Serial numbers are given to vacant squares adjacent to the numbered square. Numbers are not given to squares in a prohibition area. Such number labeling continues until the final of the serial numbers reaches to a square adjacent to the final terminal. When the number labeling is completed, the smallest a path of the serial numbers can be found. (In FIG. 1B, the routing path is shaded.)

(2) Line Search Method

In order to obtain a routing path from terminal A to terminal B, horizontal or vertical temporary line is drawn from a starting point until it reaches a prohibited area. If this temporary line (level 0) does not overlap a prohibition area, lines which intersect at right angles to the temporary line are illustrated (level 1). Such processing is repeated until a routing path between terminal A and terminal B is found. According to this method, it is possible to obtain a path having a small number of angles, but processing becomes complicated as the number of levels increases.

Algorithm can be explained in the following manner by means of FIGS. 2A and 2B.

In FIG. 2A, a vertical temporary line which passes a starting point as shown by ① is drawn with a via on the circuit board. Then lines ② intersecting at right angles to the vertical line without reaching a prohibition area are drawn. Then line ③ which intersects ② at right angles to the horizontal lines is drawn.

By repeating such processing, a path can be created on the circuit board.

Packaging design by a printed circuit board CAD device can be explained as follows. FIG. 3 is a flowchart showing design procedure of a conventional printed circuit board CAD device.

A designer sets shape and length of each side of a circuit board (Step 4001). Components in the schematic circuit diagram are placed on the circuit board by method of elastic center (Step 4002). This processing is repeated until all components are placed (a loop of Steps 4002 to 4004). When some components cannot be placed on the circuit board (Step 4004), the designer corrects the circuit board layout by interactive edit (Step 4008). If this correction turns out a success, processing ends (Step 4009). If this is not the case, the designer resets shape of the circuit board and size of each side of it (Step 4001). When all components are placed on the circuit board, their terminals are interconnected by connectors according to maze method or line search method (Step 4005). This processing is implemented for all terminals in the schematic circuit diagram (a loop of Steps 4004 to 4006), but if a connector cannot be routed (Step 4006), the designer corrects the layout by interactive edit (Step 4008). If the layout cannot be corrected (Step 4009), the designer resets the shape of the circuit board and size of each side of it (Step 4001). After that, the printed circuit board CAD device re-implements packaging design from placing components (Steps 4001 to 4006).

However, when connectors are not routed by the printed circuit board CAD device mentioned above, it is necessary to re-implement packaging design: set the size of the circuit board and start placing components, which results in bad efficiency. If components are placed with their sizes being determined bigger beforehand so as to prevent re-implementation of packaging design, some space areas are generated, resulting in low-density on the circuit board.

As connectors are routed after all components are placed, sometimes the optimal area is already occupied with a component, so critical paths have to be detoured. "Critical paths" is a general term for connectors in the schematic circuit diagram which require special attention, such as connectors for image signals, clock signals, great current, and the like. According to the above automatic routing, when connectors for image signals are detoured, image signals receive a lot of noise of components on the circuit board; when connectors for clock signals are detoured, the clock signals give noise to a lot of components on the circuit board; when connectors for a great current are detoured, this great current affects a lot of components on the circuit board.

When connectors are not routed, the designer corrects the layout by interactive edit and the like. However, this is rather troublesome. And when the amount of the correction increases, packaging efficiency decreases significantly.

SUMMARY OF THE INVENTION

It is an object of the present invention to provide a printed circuit board CAD device which can implement high-density packaging design efficiently.

It is another object of the present invention to provide a printed circuit board CAD device which can improve electric characteristics of the circuit board by optimal routing of critical path.

The above objects may be fulfilled by a printed circuit board CAD device which shows the following 21 features.

(1) A printed circuit board CAD device for determining a placement position of each component and routing paths of connectors between them in a component group in a schematic circuit diagram comprising: a placement order storage unit in which placement order of each component included in the component group is stored; a read-out unit for reading out, avoiding components whose placement positions are already determined, a next component waiting to be read out from the placement order storage unit; an occupied area storage unit in which occupied area information describing, when a new component is read out by the read-out unit, an area occupied by a component whose placement position is already determined and connectors whose routing paths are already determined on a circuit board is stored; a placement position determination unit for determining a placement position of a latest component read out by the read-out unit, avoiding the occupied area on the circuit board by referring to the occupied area information already stored in the occupied area storage unit; a routing path determination unit for determining, when the placement position of the component is determined, routing paths of connectors between terminals of the component and terminals of a component whose placement position is already determined, avoiding the occupied area on the circuit board by referring to the occupied area information already stored in the occupied area storage unit; a write-in unit for writing, when the routing paths of the connectors are determined, occupied area information describing an area occupied by the component whose placement position is already determined and by the connectors whose routing paths are already determined in a space area of the occupied area storage unit; and an instruction unit for instructing, when the occupied area information is written in the space area of the occupied area storage unit, the read-out unit to read out a next component waiting to be read out from the placement order storage unit.

As the printed circuit board CAD device alternates placing components and routing connectors, the circuit board layout is gradually formed. Therefore, if components and connectors cannot be contained on the circuit board of a given size, optimal layout can be formed by re-implementing placing and routing only a part of components and connectors on the circuit board.

Therefore, packaging design can be implemented with great efficiency. Only important components are automatically placed, while the rest of them placed and interconnected by interactive edit. So high-density layout can be formed, which improves electrical characteristics of the circuit board.

It is not necessary to predetermine bigger component size, which can save redundant spaces, resulting in high-density packaging. And necessity of correction of layout using interactive edit is small. So design efficiency increases greatly.

(2) The placement position determination unit may include: a calculation unit for calculating, by placement position determination algorithm such as method of elastic center and the like, a placement position of the latest component read out by the read-out unit outside of areas occupied by components whose placement positions are already determined; and an overlap determination unit for determining whether the calculated placement position overlaps with the connectors whose routing paths are already determined; a change unit for changing, when overlap of the calculated placement position and the connectors whose routing paths are determined is recognized, routing paths of obstacle connectors; and an update unit for updating, when the routing paths of the obstacle connectors are changed, occupied area information describing an area occupied by the obstacle connectors, the occupied area information being already stored in the occupied area storage unit.

The printed circuit board CAD device can enhance possibility of success of packaging by evacuating connectors, increasing efficiency of packaging design.

(3) The change unit may include: a space area determination unit for determining whether a space area is adjacent to the area occupied by the obstacle connectors, the space area being equal to or larger than the size of the area occupied by the obstacle connectors; and a change unit for changing the routing paths of the obstacle connectors so that they pass through the space area when adjacency of the space area and the area occupied by the obstacle connectors is recognized.

The printed circuit board CAD device enhances possibility of success of efficient packaging by using space areas in the vicinity of the obstacle connectors.

(4) The change unit may further include: a read-out unit for reading out, when adjacency of the space area and the area occupied by the obstacle connectors is not recognized, occupied area information describing an area occupied by components and connectors in the vicinity of the area occupied by the obstacle connectors, the occupied area information being written in the occupied area storage unit; and a movement unit for moving, based on the occupied area information read out by the read-out unit, the components and connectors away from the obstacle connectors, the change unit may change the routing paths of the obstacle connectors so that they pass through an area generated by the movement of the occupied area information, and the update unit may further updates occupied area information describing an area occupied by components and connectors to be moved when the component and connectors are moved, the occupied area information being written in the occupied area storage unit.

The printed circuit board CAD device reserves a space path until the last one disappears from the circuit board. And high-density layout can be formed.

(5) The printed circuit board CAD device of (1) may further include: a net information storage unit in which net information describing all connectors and terminals of components connected with the connectors in the schematic circuit diagram is stored, and the routing path determination unit may include: a fetch unit for fetching, when a placement position of the latest component is determined by the placement position determination unit, net information describing connection relation between terminals of the latest component and terminals of the component whose placement position is already determined; and a routing path creation unit for creating routing paths between terminals described by the fetched net information outside of areas occupied by connectors whose routing paths are already determined on the circuit board.

The printed circuit board CAD device can create optimal routing paths.

(6) The routing path determination unit may include: an overlap determination unit for determining whether the routing paths created by the routing path creation unit overlap with a component whose placement position is already determined; a change unit for changing, when overlap of the routing paths created by the routing path creation unit and the component whose placement position is already determined is recognized, placement position of the obstacle component and routing paths of its connectors; and an update unit for updating, when the placement position of obstacle component and routing paths of its connectors are changed, occupied area information written in the occupied area storage unit, the occupied area information describing an area occupied by the obstacle component and an area occupied by the obstacle connectors.

The printed circuit board CAD device can enhance possibility of success of packaging even if space areas become small. In other words, possibility of failure of packaging can be reduced as failure of packaging is determined after evacuating the obstacle component.

(7) The change unit may include: a space area determination unit for determining whether a space area is adjacent to the area occupied by the obstacle connectors, the space area being equal to or larger than the size of the area occupied by the obstacle connectors; and a change unit for changing, when adjacency of the space area and the area occupied by the obstacle connectors is recognized, the placement positions of the obstacle component so that it exists in the space area and routing paths of connectors of the obstacle component so that they pass through the space area.

The printed circuit board CAD device enhances possibility of success of efficient packaging by using space areas in the vicinity of the obstacle connectors.

(8) The change unit may include: a read-out unit for reading out, when adjacency of the space area and the area occupied by the obstacle connectors is not recognized, occupied area information describing an area occupied by components and connectors in the vicinity of the area occupied by the obstacle components, the occupied area information being written in the occupied area storage unit; and a movement unit for moving, based on the occupied area information read out by the read-out unit, the components and connectors away from the obstacle connectors, the change unit may change placement position of the obstacle component so that it exists in the space area, and routing paths of connectors of the obstacle component so that they pass through the space area, the update unit may further update the occupied area information describing an area occupied by components and connectors to be moved when the occupied area information is moved, the occupied area information being written in the occupied area storage unit.

The printed circuit board CAD device can reserved a space path until the last one disappears from the circuit board. And high-density layout can be formed.

(9) Information describing whether a connector is a critical path may be added to the net information stored in the net information storage unit, and the printed circuit board CAD device may further include: a determination unit for determining whether the net information fetched by the fetch unit is about a critical path by referring to the net information storage unit when routing paths are created by the routing path creation unit for the component read out by the read-out unit; a position moving unit for moving, when a critical path is recognized, the component whose placement position is determined to a component which is connected to the component through the critical path, shortening length of the critical path; and an update unit for updating, when the placement position is moved, a placement position of the component read out by the read-out unit from the occupied area storage unit with a placement position after the movement, and routing paths of its connectors with routing paths after the movement.

According to the printed circuit board CAD device, phase deterrence generated from increase of inductance components can be reduced, the increase being proportional to frequency of signals and length of paths.

As length of connectors of image signals which are critical paths are shortened, image signals are less likely to receive noise of components on the circuit board.

As length of connectors of clock signals which are critical paths are shortened, noise to components on the circuit board can be minimized.

(10) The position moving unit may move the component whose placement position is determined to a component which is connected to the component through a critical path in a broken line, reducing the critical path using a given scale.

By reusing the routing pattern information, executing time for routing algorithm such as maze method and line search method can be shortened.

(11) The information describing whether a connector is included in a bus group may be added to the net information stored in the net information storage unit; and the printed circuit board CAD device may further include: a determination unit for determining whether the net information fetched by the fetch unit is about a bus group by referring to the net information storage unit when routing paths are created by the routing path creation unit for a component read out by the read-out unit; a position moving unit for moving, when a bus group is recognized, the component whose placement position is determined to a component which is connected to the component through the bus group, shortening length of the bus group; and an update unit for updating, when the placement position is moved, a placement position of the component read out by the read-out unit from the occupied area storage unit with a placement position after the movement, and routing paths of its connectors with routing paths after the movement.

According to the printed circuit board CAD device, length of foil needed for routing connectors can be shortened and phase deterrence generated from increase of inductance components can be reduced, the increase being proportional to frequency of signals and length of paths.

(12) The position moving unit may move the component whose placement position is determined to a component connected to the component through the bus group in broken lines, reducing the entire bus group using a given scale.

By reusing the routing pattern information, executing time for routing algorithm such as maze method and line search method can be shortened.

(13) The printed circuit board CAD device of (1) may further include: a length and width measurement storage unit for storing length and width measurements of each component in the component group; a component area calculation unit for calculating, when the placement position determination unit cannot determine a placement position of a component, area to be occupied by the component and subsequent components on the circuit board by referring to the length and width measurement storage unit; a connector area estimation unit for estimating area to be occupied by connectors between terminals of the component whose placement position cannot be determined and its subsequent components and terminals of a component whose placement position is already determined; and an enlargement unit for enlarging circuit board area by total of area to be occupied by the component whose placement position cannot be determined and subsequent components and area to be occupied by connectors between terminals of the component whose placement positions cannot be determined and its subsequent components and terminals of the component whose placement position is already determined.

According to the printed circuit board CAD device, even if a component cannot be placed on the circuit board, re-implementation of entire packaging design is not needed, which is more efficient rather than repetition of temporary packaging.

(14) The length and width measurement storage unit may store length and width measurements of each component in the component group, the component area calculation unit may calculate, when the placement position determination unit cannot determine a placement position of a component, area to be occupied by the component and subsequent components on the circuit board by referring to the length and width measurement storage unit, the connector area estimation unit may estimate area to be occupied by connectors between terminals of the component whose placement position cannot be determined and its subsequent components and terminals of a component whose placement position is already determined, and the enlargement unit may enlarge circuit board area by total of area to be occupied by the component whose placement position cannot be determined and subsequent components and area to be occupied by connectors between terminals of the component whose placement positions cannot be determined and its subsequent components and terminals of the component whose placement position is already determined.

According to the printed circuit board CAD device, even if connectors cannot be routed on the circuit board, re-implementation of entire packaging design is not needed, which is more efficient rather than repetition of temporary packaging.

(15) The printed circuit board CAD device of (1) may further include: a function block storage unit for storing all function blocks and components included in each of them in the schematic circuit diagram; an area storage unit for storing all function blocks in the schematic circuit diagram and a circuit board area assigned to each of them; and the placement position determination unit may determine placement positions of components included in a function block in a circuit board area assigned to the function block, referring to the area storage unit, and the routing path determination unit determines, when a placement position of a component is determined, routing paths of connectors between terminals of the component and terminals of a component whose placement position is already determined in a function block which includes the component.

The printed circuit board CAD device forms circuit board layout by function block unit, which increases work efficiency.

(16) The printed circuit board CAD device of (15) may further include: a function block determination unit for determining, when the placement position determination unit cannot determine a placement position of a component, which function block includes the component; and an area enlargement unit for enlarging a circuit board area assigned to the function block which includes the component.

According to the printed circuit board CAD device, packaging is re-implemented by the function block unit, which increases efficiency of packaging design.

(17) The printed circuit board CAD device of (1) may further include: an outline generation unit for generating, when placement positions of components in the schematic circuit diagram are determined and all routing paths between terminals of the components are determined, an outline of an area occupied by the components; and a circuit board area creation unit for creating a circuit board area enclosed by the outline.

According to the printed circuit board CAD device, high-density circuit board layout can be realized.

(18) The printed circuit board CAD device of (1) may further include an extending unit for extending, when routing paths of connectors of one component are determined by the routing path determination unit, a given length of connector from terminals of a component which is to be connected with terminals of the next component.

According to the printed circuit board CAD device, an obstacle component does not occupy an area between a just placed component and the next component to be placed.

(19) The printed circuit board CAD device of (18) may further include: an occupied terminal storage unit for storing a prohibition area around terminals of a chip component in an area occupied by components whose placement positions are determined, the prohibition information corresponding to net information on the terminals; and a terminal presence determination unit for determining whether net information is stored in the occupied terminal storage unit, the net information including terminals of the latest component read out by the read-out unit and terminals of a component which is already placed, the placement position determination unit may determine a placement position of the component read out by the read-out unit, allowing overlap of a pair of terminals included in the net information stored in the occupied terminal storage unit.

According to the printed circuit board CAD device, chip components such as a power circuit, resistance, and condenser are packaged with high density, and connectors between them can be shortened.

(20) The placement position determination unit may include: a first calculation unit for calculating, by placement position determination algorithm such as method of elastic center and the like, a placement position of the latest component read out by the read-out unit outside of areas occupied by components whose placement positions are already determined; a first determination unit for determining whether the calculated placement position overlaps with connectors whose routing paths are already determined; a first change unit for changing, when overlap of the calculated placement position and the connectors whose routing paths are already determined is recognized, routing paths of the obstacle connectors; a first update unit for updating, when the routing paths of the obstacle connectors are changed, occupied area information describing an area occupied by the obstacle connectors, the occupied area information being written in the occupied area storage unit; a second determination unit for determining whether the routing paths created by the routing paths creation unit overlap with a component whose placement position is already determined; a second change unit for changing, when overlap of the routing paths created by the routing paths creation unit and the component whose placement position is determined is recognized, a placement position of the obstacle component and routing paths of its connectors; and a second update unit for updating, when the placement position of the obstacle component and the routing paths of its connectors are changed, occupied area information written in the occupied area storage unit, the occupied area information describing an area occupied by the obstacle component and an area occupied by the obstacle connectors.

According to the printed circuit board CAD device, the circuit board layout can be formed flexibly, which realizes high-density packaging design.

(21) A printed circuit board CAD device for determining layout of components and connectors in a schematic circuit diagram on a circuit board comprising: a side storage unit for storing all sides of the circuit board and extensible sides among them; a placement position determination unit for determining placement positions of the components on the circuit board; a routing path determination unit for determining, when the placement positions of the components are determined, routing paths of connectors between terminals of each component; and a side extension unit for extending, when components and connectors cannot be contained on the circuit board of a determined layout, the extensible sides so as to supplement insufficient area.

According to the printed circuit board CAD device, optimal printed circuit board layout can be formed by one-time re-implementation of packaging design. The effect can be obtained especially when sides of the circuit board are categorized into two: fixed sides; and extensible sides for enlarging the circuit board area.

DESCRIPTION OF THE DRAWINGS

These and other objects, advantages and features of the invention will become apparent from the following description thereof taken in conjunction with the accompanying drawings which illustrate a specific embodiment of the present invention. In the drawings:

FIG. 5A is an example of component information;

FIG. 5B is an example of component shape information;

FIG. 5C is an example of net information;

FIG. 5D is an example of routing pattern information;

FIG. 6A is an example of design candidate component information;

FIG. 6B is an example of design method information;

FIG. 6C is an example of prohibition area information;

FIG. 6D is an example of design standard information;

FIG. 11A shows how packaging is implemented when normal routing is set as a design method;

Fig. 11B shows how packaging is implemented when normal routing is set as a design method;

Fig. 11C shows how packaging is implemented when normal routing is set as a design method;

FIG. 14A shows how packaging is implemented when extended routing is set as a design method;

FIG. 14B shows how packaging is realized when extended routing is set as a design method;

FIG. 24 is an example of design information used in the fourth embodiment;

FIG. 38 is an example of prohibition area information to which a net name is added in the seventh embodiment;

FIG. 47A shows an example of function block assignment on a circuit board;

FIG. 47B shows an example of function block information;

FIG. 47C is and example showing how a function block is enlarged;

DESCRIPTION OF THE PREFERRED EMBODIMENT

First Embodiment

As the first embodiment of a printed circuit board CAD device, a design system can explained as follows. The design system is for implementing schematic circuit diagram design and packaging design based on its result. Design information is shared by schematic circuit diagram design and packaging design.

Figure 1A:
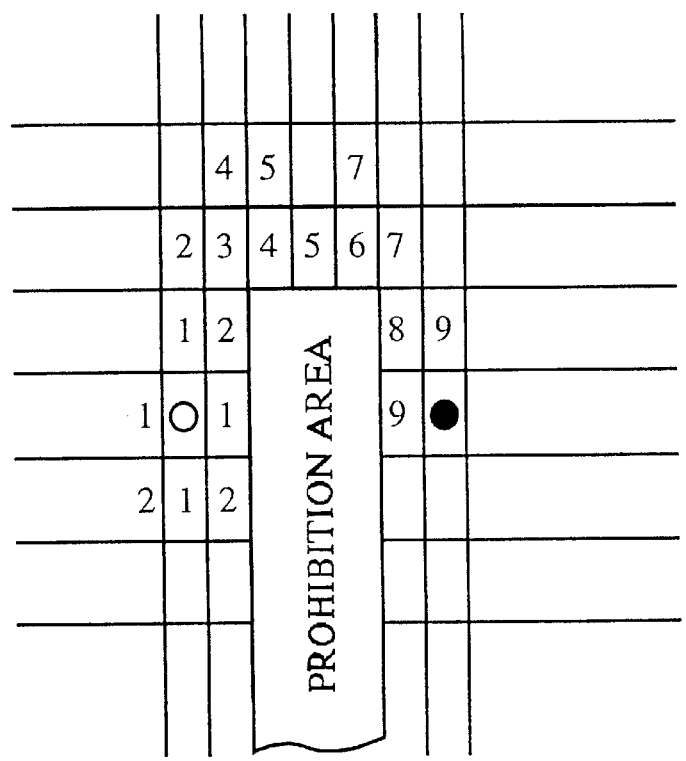
FIG. 1A shows processing of maze method.
Figure 1B:
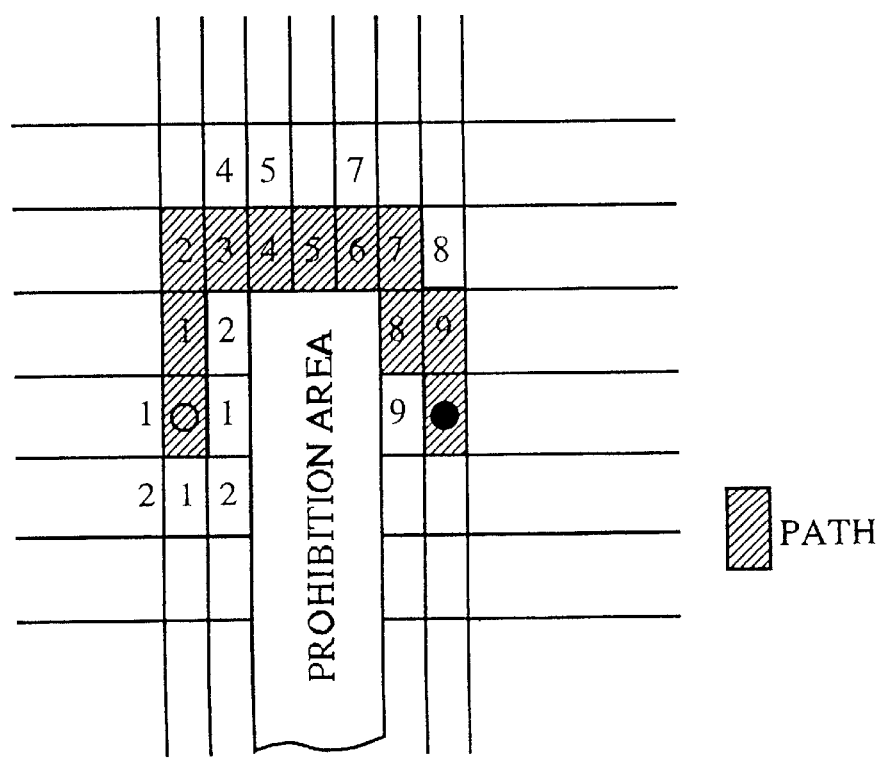
FIG. 1B shows processing of maze method.
Figure 2A:
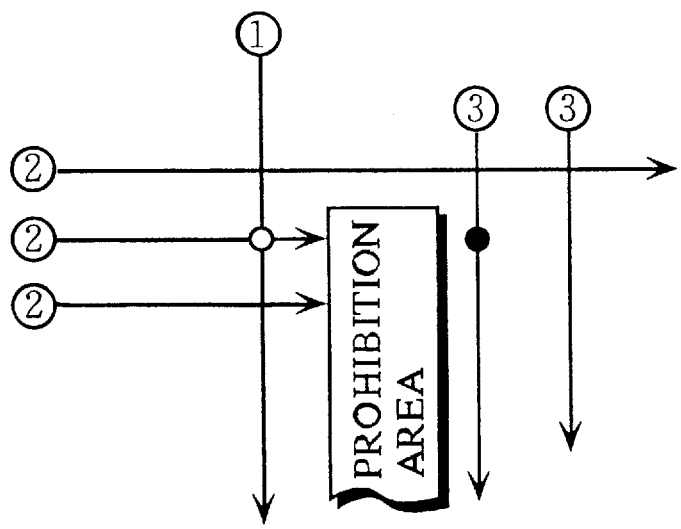
FIG. 2A shows algorithm of line search method.
Figure 2B:
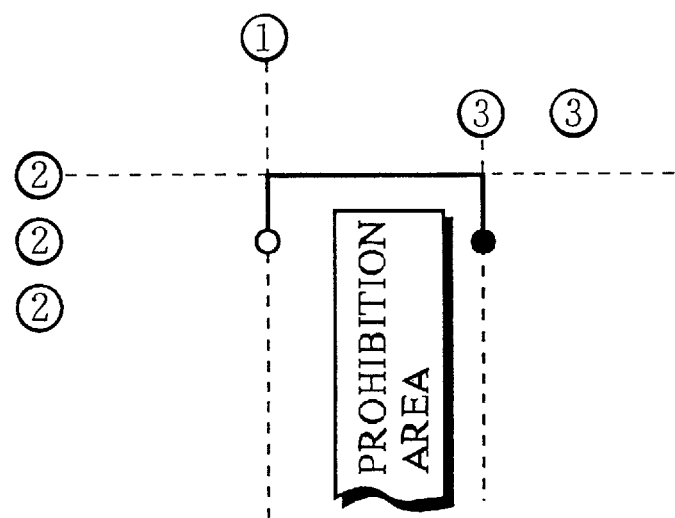
FIG. 2B shows algorithm of line search method.
Figure 3:
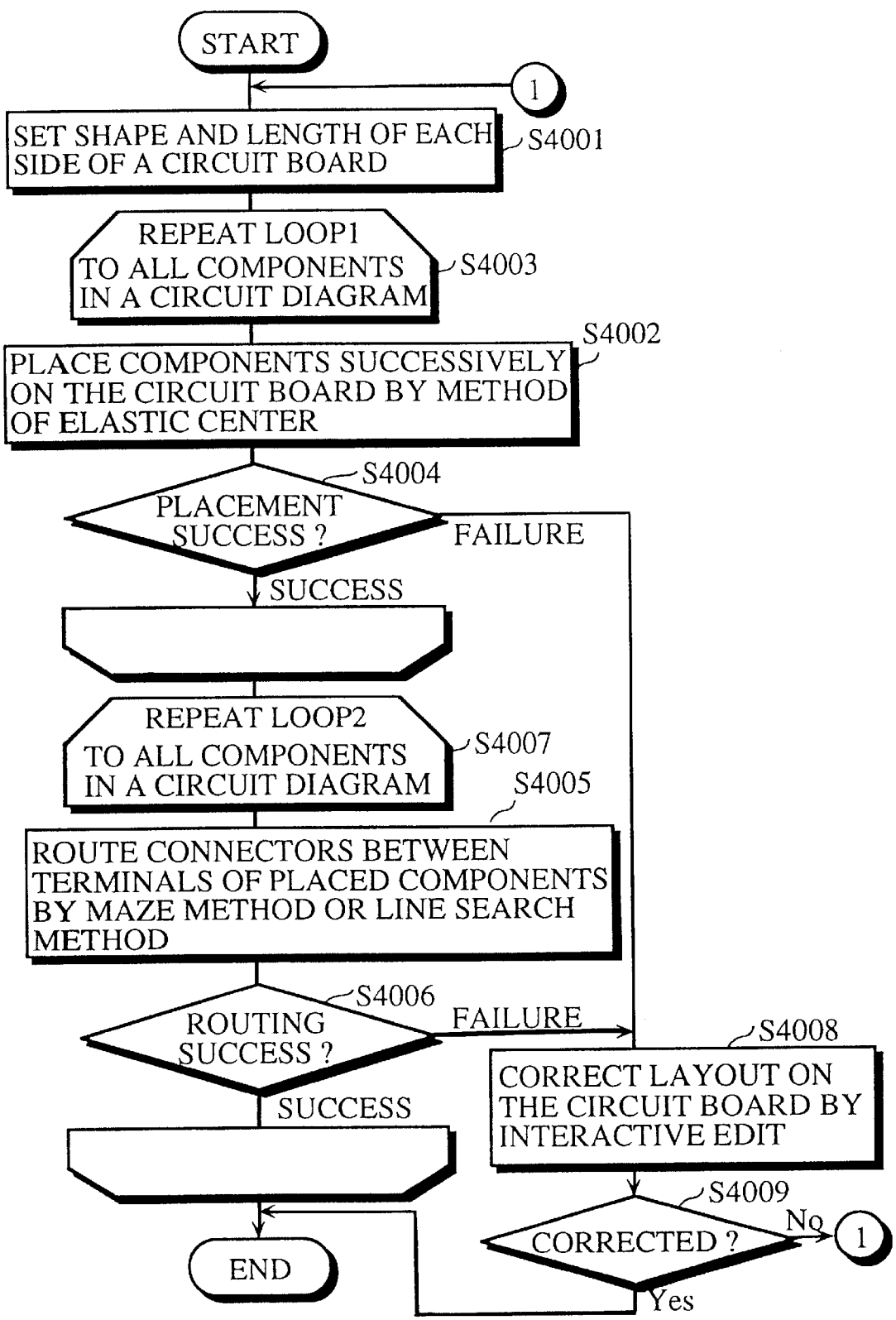
FIG. 3 shows processing of a conventional printed circuit board CAD device.
Figure 4:
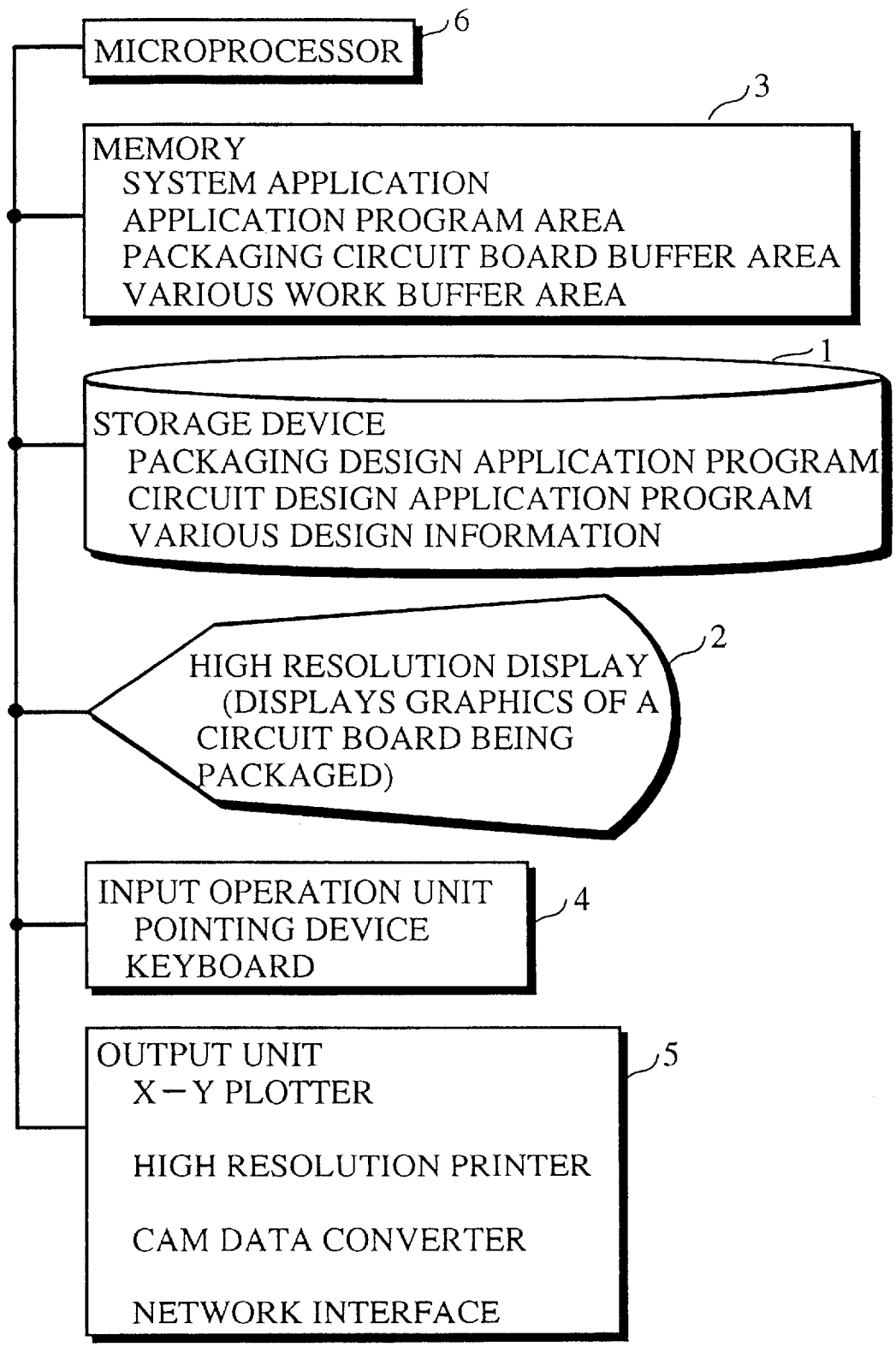
FIG. 4 shows hardware construction of a design system of the first embodiment.

FIG. 4 is hardware configuration of the present design system. The present design system comprises storage device 1, high resolution display 2, memory 3, input operation unit 4, output unit 5, and microprocessor 6.

Storage device 1 is a Hard Disk Drive and a Magnetic Optical Disc which have a huge storage capacity. Storage device 1 stores a circuit design application program for implementing schematic circuit diagram design, various design information inputted by a designer during the circuit design application program is executed, and a packaging design application program for implementing packaging design.

The circuit design application program will not be explained in the present embodiment as it is not the main point of the present invention. Packaging design will be explained later. Design information, which includes nine pieces of information, can be explained as follows.

1. Component Information

Component information describes names of components in a schematic circuit diagram and where they should be placed on a circuit board. An example is shown in FIG. 5A. Component information is composed of: a component number given by a designer; a component name which shows a product suitable for the component; coordinates of the component on the circuit board; a surface number which shows packaging surface of the component; and an angle between a standard side of the component and a standard side of the circuit board.

The component numbers and the component names are set when interactive edit mode is selected during circuit design or packaging design, and how to set them is left to a designer entirely. The coordinates, the surface numbers, and the angles are calculated precisely during packaging design.

2. Component Shape Information

Component shape information describes shape of a component to be placed on the circuit board. An example is shown in FIG. 5B. Component shape information is composed of: a component name which shows a product suitable for the component to be placed; a product outline expressed by relative coordinates; a terminal outline expressed by relative coordinates; terminal number of the product; and relative coordinates of each terminal. The relative coordinates are given, with terminal 0 of each component being used as standard coordinates. Component shape information is inputted when interactive edit mode is selected during circuit design or packaging design.

3. Net Information

Net information describes theoretical connection between terminals. An example is shown in FIG. 5C. Net information is composed of; a net name given to a connector by a designer; and terminal information which describes terminals to be interconnected by the connector. The terminal information is composed of a set of a component number and a terminal number. During packaging design, components are placed and connectors are routed based on the net information. Net information is inputted when interactive edit mode is selected during circuit design or packaging design. How to set it is left to a designer entirely.

4. Routing Pattern Information

Routing pattern information describes form of foil used as connectors routed on the circuit board. An example is shown in FIG. 5D. Routing pattern information is composed of: an identifier given to a connector; a net name given to the connector; an identifier of a surface on which the connector is routed; a number of constituting points of the connector; and coordinates of the constituting points. Connectors are broken lines as shown in FIG. 5D. Constituting points fall on both ends and knots of the broken lines.

5. Shape Information on a Circuit Board

Shape information on a circuit board describes shape of a circuit board, showing size of each side. The size of each side can be changed by interactive edit by high resolution display 2 and input operation unit 4 before implementing packaging design. A circuit board can be enlarged or reduced by this change.

6. Layer Number Information on a Circuit Board

Layer number information on a circuit board describes how many layers constitute a circuit board and which layer is made of metal for ground. Layer number information is inputted when interactive edit mode is selected during circuit design or packaging design.

7. Design Candidate Information

Design candidate information describes which connector in the schematic circuit diagram is given the highest priority in routing, which is expressed by enumeration of component numbers.

An example is shown in FIG. 6A. Highest priorities are given from connectors between IC1 and IC2 when connectors are routed based on packaging design application program.

8. Design Method Information

Design method information is composed of a net name and a routing method, describing how the net should be routed. An example is shown in FIG. 6B. In the present embodiment, extended routing, normal routing, and on way routing are used as a routing method.

Extended routing is a method of extending a given length of connector from a terminal and make a via at the end of it. This extended routing is used when a space area needed for routing a connector cannot be reserved on a surface on which packaging is being implemented (a space area is an area which is not occupied by a prohibition area, components, and connectors on the circuit board).

On way routing is a method using a jumper wire. Limitation is needed for on way routing; in the present embodiment, a connector is routed until it reaches an obstacle. Other limitation can be possible like limitation on routing length.

Normal routing is a method of routing a connector on a surface on which packaging is being implemented, which is normally used as a routing method information.

9. Prohibition Area Information

Prohibition area information describes areas where placing components and routing connectors are prohibited on a circuit board. An example is shown in FIG. 6C. Prohibition area information is composed of: an identifier given to a prohibition area; a type of prohibition showing prohibition on placing components or routing connectors; cause of prohibition; a surface on which the prohibition area exists; and an outline of the prohibition area. Prohibition area information is imputed when interactive edit mode is selected during circuit design or packaging design.

10. Design Standard Information

Design standard information describes standard for packaging design. An example is shown in FIG. 6D. Design standard information is composed of: width of routing foil (0.2 mm); routing foil minimum interval showing minimum interval of foil for routing (0.15 mm); foil-terminal pad minimum interval showing minimum interval between the foil and a terminal (0.3 mm); and the like. Design standard information is inputted when interactive edit mode is selected during circuit design or packaging design.

Figure 7:
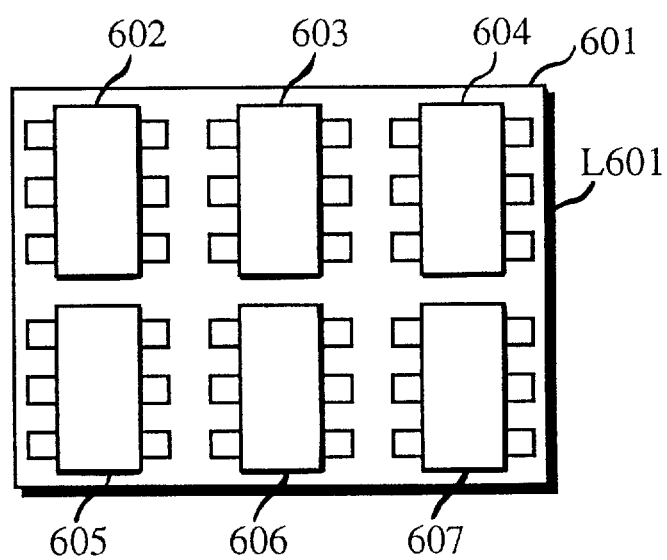
FIG. 7 is an example of grouped components.

Component name and component shape information are set for each component. In the present embodiment, components having the same name like memory module are treated as one group, and design information is set to this group. An example is shown in FIG. 7. Components 602 to 607 are treated as component 601. As information on shape of component 601, that of rectangle L601 is set. As for information about terminals, that of components 602 to 607 is set. For example, as information on terminal outline, that of components 602 to 607 is stored. As for terminal number, total number of terminals of components 602 to 607 are set.

High resolution display 2 is a cathode ray tube display and a liquid crystal display for graphics of true representation of actual size proportion of a circuit board, components, and connectors during packaging design when packaging design application program is executed.

Figure 8:
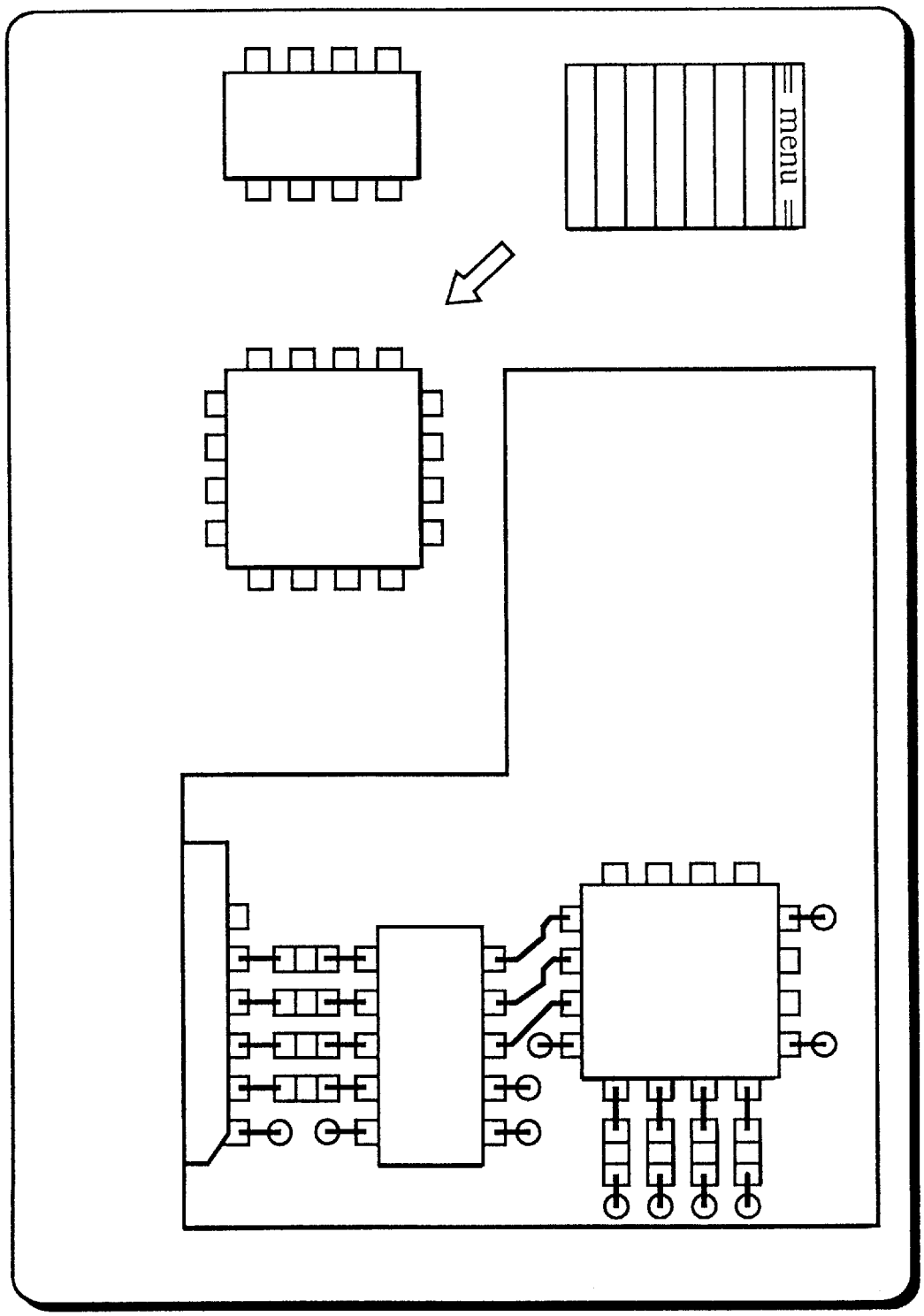
FIG. 8 shows a display example of high resolution display 2.

An example of high resolution display 2 is shown in FIG. 8. The outline a large L-like figure represents a circuit board. A rectangular on whose opposing two sides are attached small squares represents an IC, each of the small squares representing a terminal. A big square having terminals on its four sides represents chip surface packaging component of a flat package. A small rectangle which is divided by two lines in itself represents resistance, and a small circle represents a via. Thick broken lines, horizontal lines and vertical lines represent connectors.

Actual size proportion of them all is represented accurately by the design information in storage device 1. A white arrow in FIG. 8 represents a mouse cursor which is operated by a designer with a pointing device. A designer changes the circuit board layout, using this mouse cursor during interactive edit of the above mentioned application program.

During packaging design, set menu which receives information on shape of a circuit board and a menu which shows success or failure of packaging are also displayed other than the graphics mentioned above.

Storage area of memory 3 is divided into four: system area; application program area; various work buffer area; and packaging design buffer area.

The system area is used by operation system of the present design system.

The application program area is an area where a circuit design application program and a packaging design application program are loaded. Each step of the loaded application program is executed by microprocessor 6 one by one.

The various work buffer area is used as a work area when microprocessor 6 executes each step of the application program.

The packaging design buffer is a buffer where original data on the circuit board is loaded by the application program, so that high resolution display 2 displays the graphics. Each position in the packaging design buffer is designated by (x, y) with a standard point being the left side of the circuit board. The coordinates are expressed by a value like 0.001 mm so that actual size of the circuit board can be expressed accurately.

In the present specification, a circuit board, components, and connectors are expressed by data in the packaging design buffer and the various work buffer. And placing components means writing data on shape of a component into the packaging design buffer and data on coordinates, a surface and angle of the component into the component information.

Routing a connector means writing linear data into the packaging design buffer, a surface on which the connector exists, coordinates of constituting points of the connector and a number of them on that surface into the various work buffer as routing pattern information.

Input operation unit 4 comprises: a pointing device for moving a mouse cursor on high resolution display 2 according to operation of a user; and a key board for providing input environment of interaction edit on receiving input from a user.

Output unit 5 comprises an X-Y plotter for printing out design result on a given paper, a high resolution printer, a CAM data convertor for converting packaging design result into CAM data so as to control an NC machine tool, and a network interface for transmitting the packaging design result to other design system through LAN.

How packaging design is implemented by the design system constituted in the above mentioned way can be explained as follows by means of FIG. 9.

Figure 9:
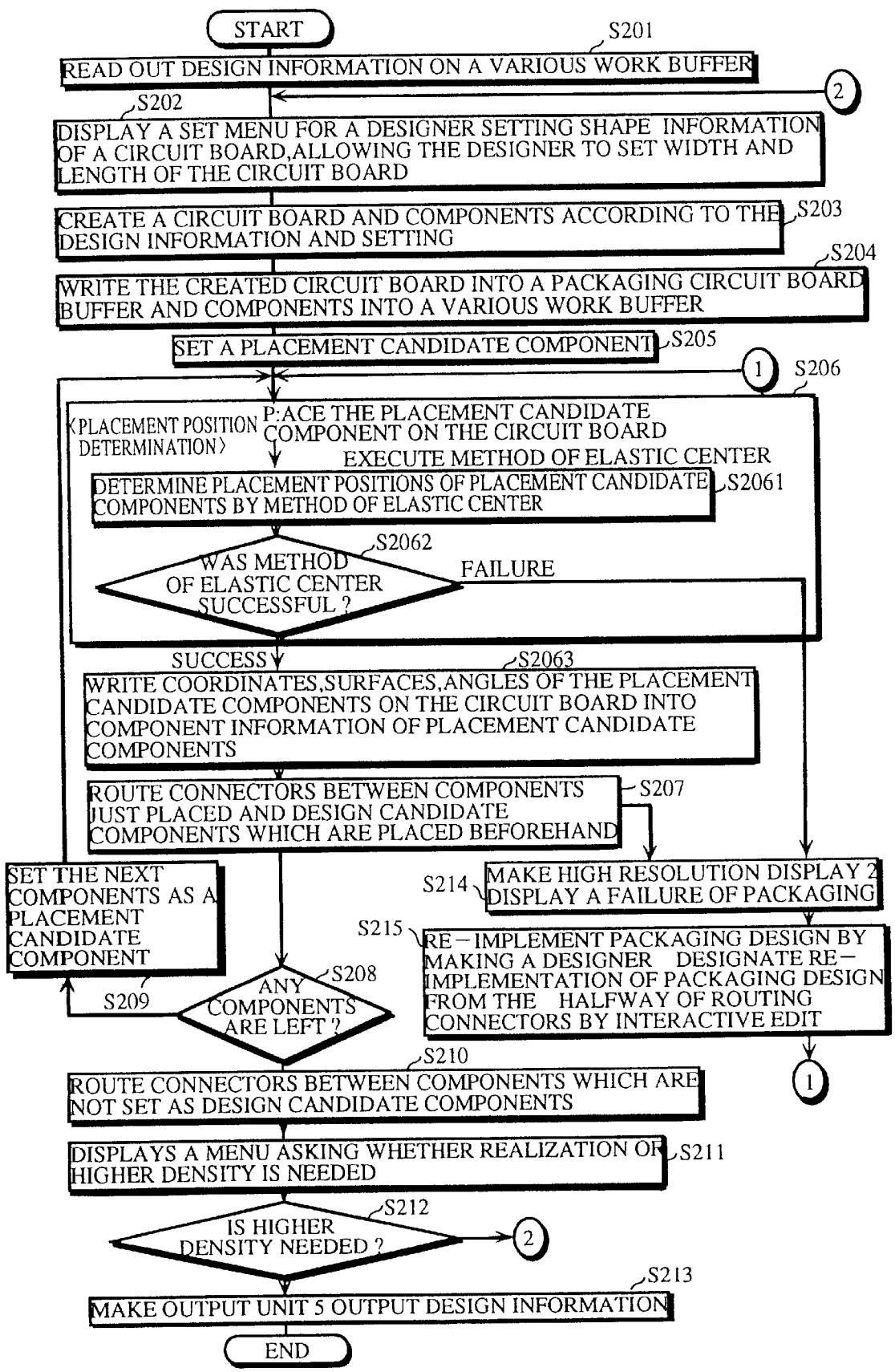
FIG. 9 is a main flowchart for packaging design application program of the first embodiment.

FIG. 9 is a main flowchart for a packaging design application program of the first embodiment. Placement candidate components are components in Steps 206 to 208, which are about to be placed.

In storage device 1, various design information created by the circuit design is divided and stored in a lot of files. Microprocessor 6 reads out design information on a various work buffer (Step 201 in FIG. 9), displays a set menu for a designer setting shape information of a circuit board, allowing the designer to set width and length of the circuit board (Step 202). Then microprocessor 6 implements setting mentioned above and creates a circuit board and components according to the design information (Step 203), and writes the created circuit board into a packaging circuit board buffer and components into a various work buffer (Step 204).

After completing preparation of packaging design in the above mentioned way, microprocessor 6 recognizes one of the created components as a placement candidate component (Step 205), and places it on the circuit board (Step 206). Step 206 is composed of Steps 2061 and 2062: in Step 2061, a placement positions of placement candidate component is determined by method of elastic center; in Step 2062, it is determined whether the method of elastic center was successful or not. By these steps, the placement candidate component is placed on the circuit board. After it is placed, microprocessor 6 writes coordinates, a surface, and an angle of the placement candidate components on the circuit board into component information on the placement candidate component (Step 2063), and routes connectors between the placement candidate component just placed and a design candidate component which is already placed on the circuit board (Step 207). After that, microprocessor 6 sets the next placement candidate component (Step 209), and repeats the above mentioned processing of packaging (Steps 206 to 209).

When the above mentioned procedure is implemented to all the components (Step 208), microprocessor 6 routes connectors between components which are not set as design candidate components (Step 210).

When routing connectors is completed, microprocessor 6 displays a menu asking whether realization of higher density is needed (Step 211), and if a designer wishes so, goes back to Step 202 (Step 212). If the designer does not wish so, microprocessor 6 makes output unit 5 output the design information created by the above mentioned way (Step 213).

If components cannot be placed, microprocessor 6 makes high resolution display 2 display a failure of packaging (Step 214), and makes a designer designate re-implementation of packaging design from the halfway of placing components by interactive edit (Step 215).

<Routing Process>

In Step 207 in FIG. 9, connectors are routed between only design candidate components among placement candidate components. Step 207 can be shown in detail by the sub-flowchart in FIG. 10. How microprocessor 6 executes processing can be explained as follows based on it.

First, microprocessor 6 searches for all net information which includes component number of a placement candidate component (Step 402 in FIG. 10), and finds out all components to be connected with the placement candidate components (Step 403). Then, microprocessor 6 maintains components included in the design candidate information and discards the rest (Step 404). Referring to net information on the remaining components and the placement candidate component, and routing method information paired with the net information (Step 405), microprocessor 6 routes connectors in Step 406. Step 406 is composed of Steps 407 and 408: in Step 407, routing paths are created on the circuit board according to maze method or line search algorithm based on the routing method information added to the net information; in Step 408, it is determined whether connectors were routed on the circuit board in Step 407. If connectors are routed according to the present algorithm, microprocessor 6 writes routing pattern information on the connectors in a various work buffer (Step 409) and completes processing. If that is not the case, microprocessor 6 makes high resolution display 2 display a failure of packaging (Step 214 in FIG. 9).

How packaging on the circuit board is implemented can be explained as follows.

FIGS. 11 to 14 show setting of design information and how components are placed and connectors are routed based on it. In those drawings, circuit boards, components, connectors and vias are represented in the same manner as in FIG. 8.

Fig. 11A to 11C represent how packaging is implemented when normal routing is set as design method. As a layer made of metal is used for routing for power and ground, extended connector 504 is routed from terminal 503 and via 505 is made. Component 501 is set as a placement candidate component, and components 510 to 512 are set as design candidate information. In FIG. 11A, terminals are connected by broken lines, which represent tension generated by an application program for placing components by method of elastic center.

Process of packaging can be explained as follows.

In Fig. 11A, microprocessor 6 refers to net information on component 501 and recognizes that tension exists between terminals designated by the net information. Microprocessor 6 places component 501 so as to make the tension 0 (Step 206 in FIG. 9). After that, microprocessor 6 routes connectors as shown in Fig. 11B (Step 207). Microprocessor 6 places component 502 and routes connectors in a similar way, and completes packaging as shown in Fig. 11C (Steps 210 to 213).

Figures 12A, 12B:
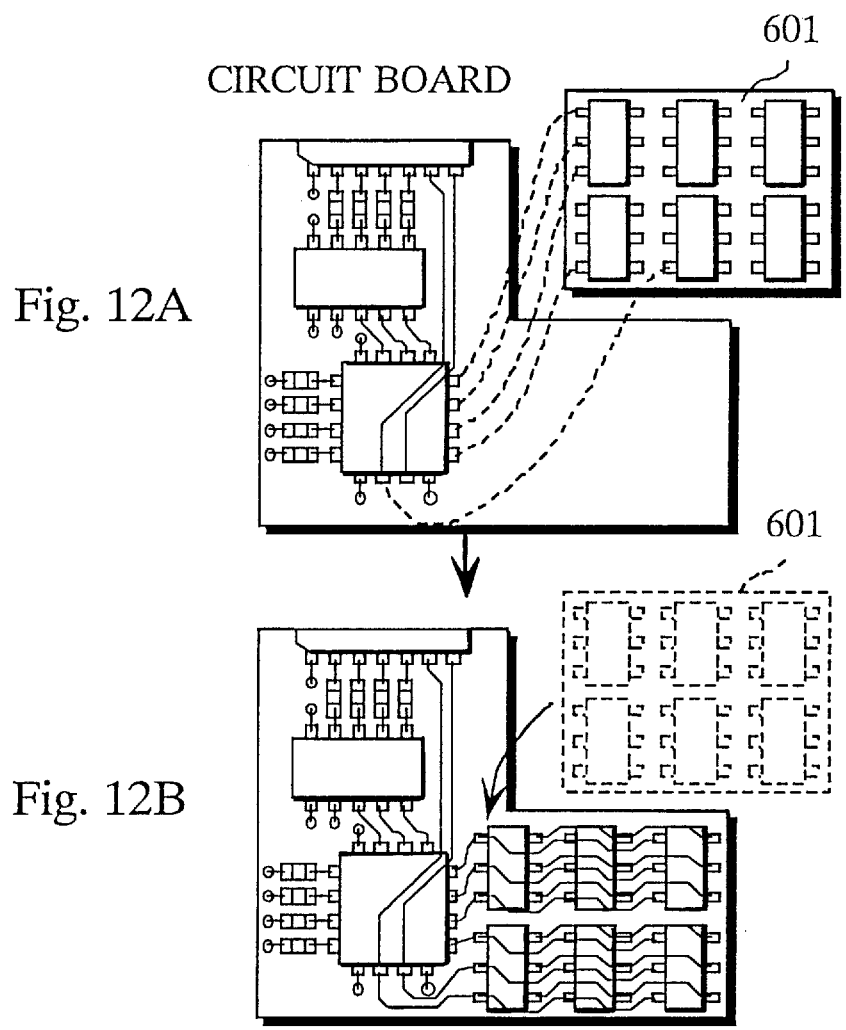
FIG. 12A shows how packaging is implemented when a group of components is set as a placement candidate component.
FIG. 12B shows how packaging is implemented when a group of components is set as a placement candidate component.

In FIGS. 12A and 12B, a group of components are set as a placement candidate component. It is determined how all the terminals group 601 possesses should be interconnected. Tension is represented by broken lines as in Fig. 11A. Circuit boards, components, connectors, and vias are represented in the same manner as in FIG. 8.

How packaging on a circuit board is implemented can be explained as follows.

Microprocessor 6 refers to net information on components included in group 601, recognizes tension between terminals designated by the net information (broken lines), and places group 601 so as to make the tension 0 (Step 206 in FIG. 9). After that, microprocessor 6 routes connectors as shown in FIG. 12B (Step 207).

Figure 13A:
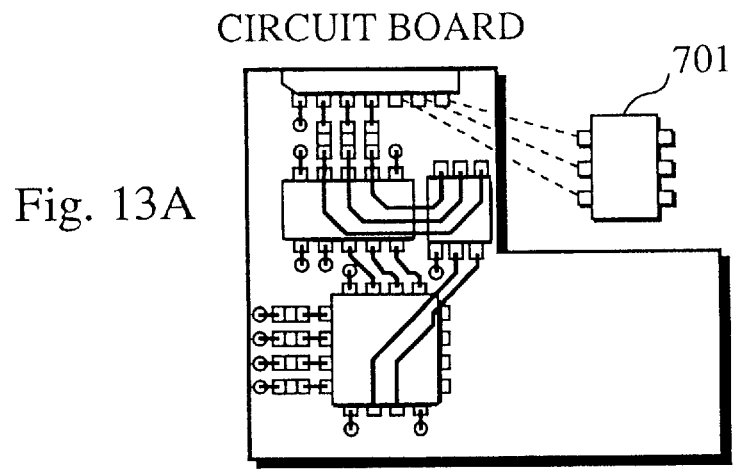
FIG. 13A shows how packaging is implemented when on way routing is set as a design method.
Figure 13B:
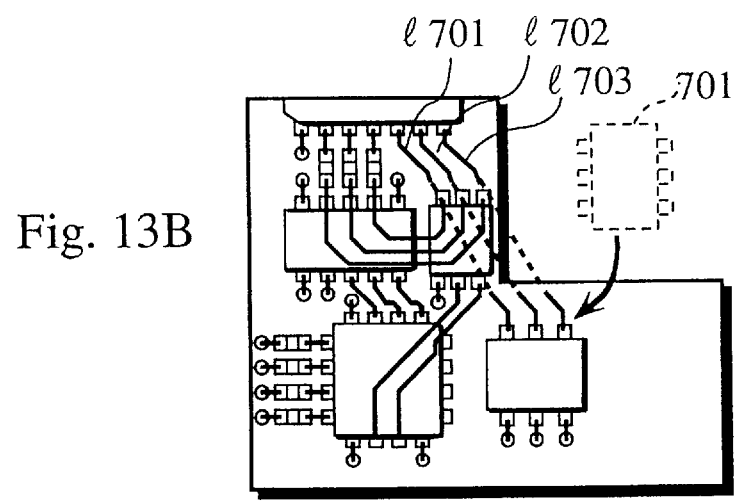
FIG. 13B shows how packaging is implemented when on way routing is set as a design method.

FIGS. 13A and 13B show a case of on way routing. Tension is represented by broken lines as in FIG. 11, and circuit boards, components, connectors and vias are represented by the same manner as in FIG. 8.

How packaging on a circuit board is implemented can be explained as follows.

Microprocessor 6 refers to net information on component 701, recognizes tension between terminals designated by the net information, and places component 701 so as to make the tension 0 (Step 206 in FIG. 9). After that, microprocessor 6 routes connectors 1701, 1702, and 1703 as shown in FIG. 13B (Step 207). Connectors 1701, 1702, and 1703 are jumper wires and their center parts are represented by broken lines. The broken lines are out of the circuit board and cross other connectors, which means that it is possible to route jumper wires outside of space areas.

FIGS. 14A and 14B show a case of extended routing. Tension is represented by broken lines as in FIG. 11, and circuit boards, components connectors and vias are represented by the same manner as in FIG. 8. How packaging on a circuit board is implemented can be explained as follows.

Microprocessor 6 refers to net information on component 801, recognizes tension between terminals designated by the net information, and places component 801 so as to make the tension 0 (Step 206 in FIG. 9). After that, microprocessor 6 extends connectors from terminals 804, 807, 808, 809 . . . as shown in FIG. 14B, and makes vias at the ends (Step 207).

According to the present embodiment, connectors can be routed between components for sure by alternating placing a component and routing connectors on the circuit board. Therefore, even if some components and connectors of a predetermined size are not packaged on the circuit board, optimal layout can be formed by re-implementing packaging, eliminating a part of components and connectors form the circuit board. Therefore, repetition of the whole process of packaging is not needed, which means efficiency of packaging design is greatly increased.

Only important components are automatically placed, and the rest of them are placed and interconnected by interactive edit. So high-density layout can be formed, which improves electrical characteristics of the circuit board.

It is not necessary to predetermine a bigger component size, which can reduce space areas, resulting in high-density packaging. And necessity of correction of the layout using interactive edit becomes small. So design efficiency increases greatly.

Second Embodiment

In the second embodiment, a placement candidate component is placed outside of prohibition areas and areas where components are already placed. When the placement candidate component overlaps with already routed connectors, the connectors are evacuated. Connectors for the placement candidate component are routed outside of the prohibition areas and areas where connectors are already routed. When the connectors overlap with already placed components, the components are evacuated.

Figure 15:
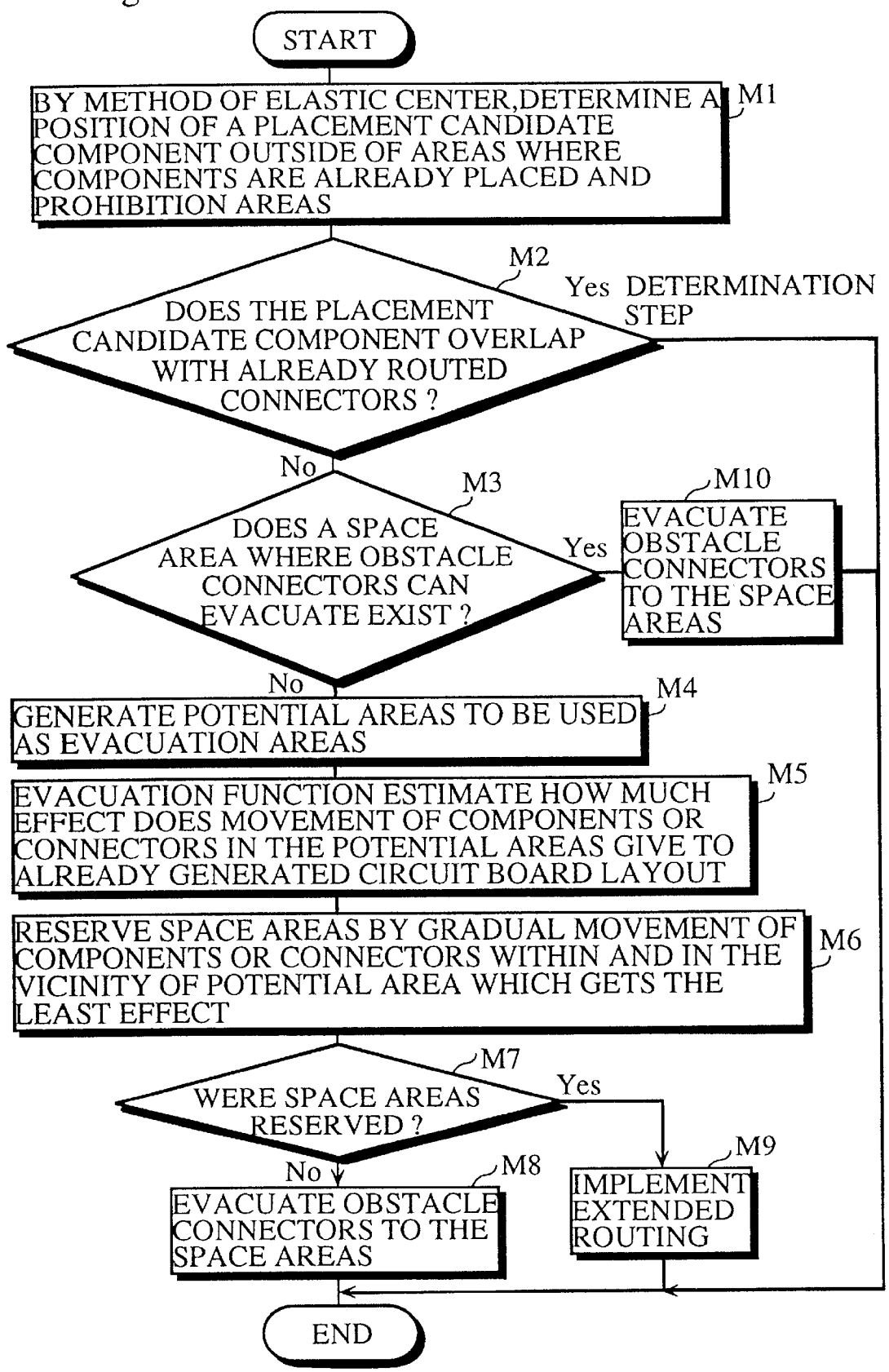
FIG. 15 shows a sub-flowchart for Step 206 in FIG. 9 of the second embodiment.

Step 206 in FIG. 9 can be shown in detail by sub-flowchart in FIG. 15. Step 406 in FIG. 10 can be shown in detail by sub-flowchart in FIG. 16.

The flowchart in FIG. 15 is composed of the following steps: by method of elastic center, a position of a placement candidate component is determined outside of areas where components are already placed and prohibition areas (M1); it is determined whether the placement candidate component overlaps with already routed connectors (M2); when they overlap, it is determined whether space areas where the connectors (obstacle connectors) can evacuate exist on the circuit board (M3); when they do not exist, a plurality of potential areas to be used for evacuation are generated (M4); after that, it is estimated, by evaluation function, how much effect does movement of components or connectors in the potential areas give to already generated circuit board layout (M5); after that, a space area is reserved by gradually moving components or connectors within and in the vicinity of a potential area which gets the least effect (M6); it is determined whether a space area was reserved by the movement in Step M6 when (M7); if a space area was reserved, obstacle connectors are evacuated to the space area (M8); if a space area was not reserved, extended routing is applied to the obstacle connectors (M9); and obstacle connectors are evacuated to the space area (M10).

Figure 16:
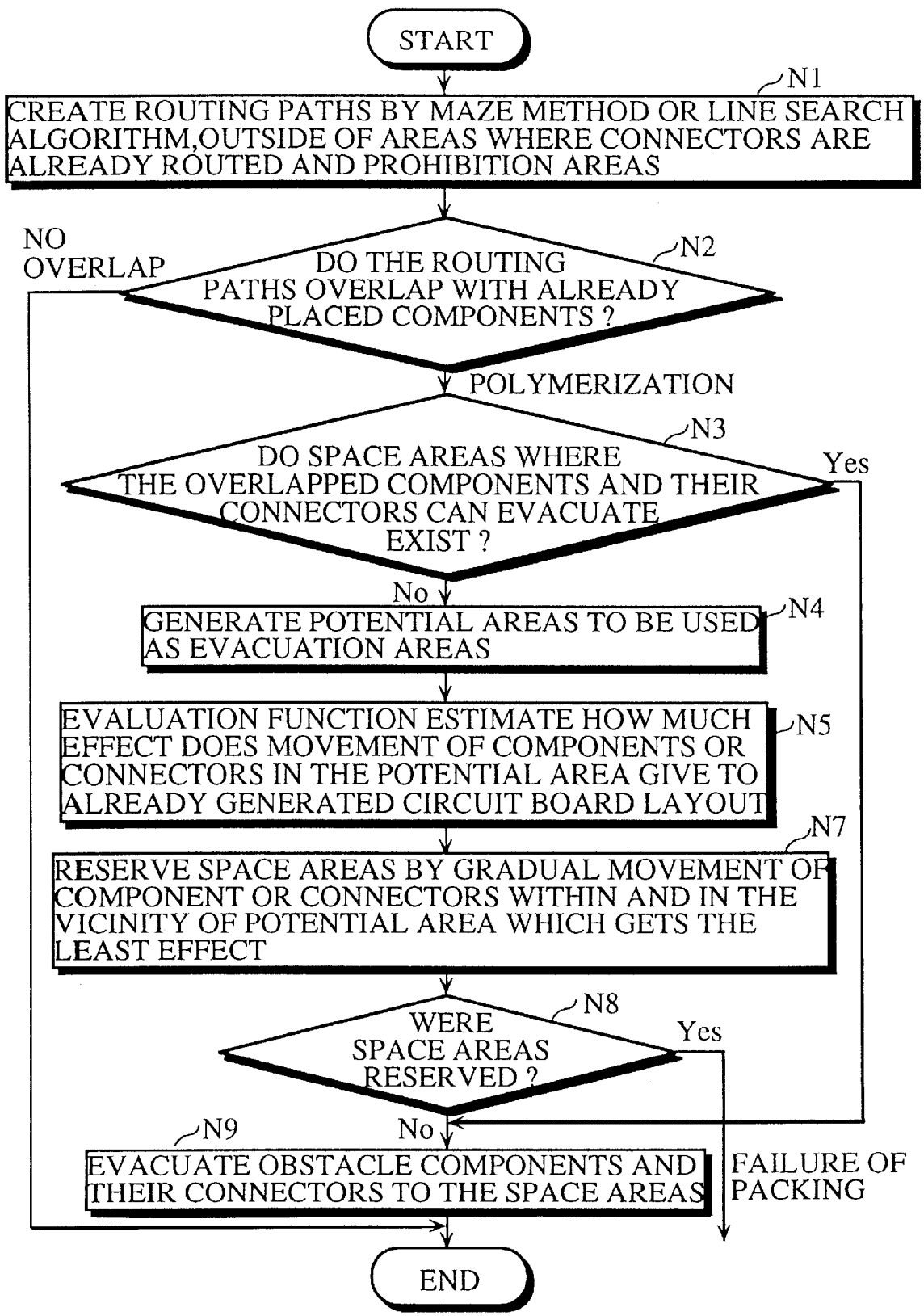
FIG. 16 shows a sub-flowchart for Step 406 in FIG. 10 of the second embodiment.

The flowchart in FIG. 16 is composed of the following steps: routing paths are created, by maze method or line search algorithm, outside of areas where connectors are already routed and prohibition areas (N1); it is determined whether the routing paths overlap with already placed components (N2); when they overlap, it is determined whether space areas where the overlapping components (obstacle components) and their connectors can evacuate exist on the circuit board (N3); when they do not exist, a plurality of potential areas to be used for evacuation are generated (N4); after that, it is determined, by evaluation function, how much effect movement of components or connectors in the potential area gives to already generated circuit board layout (N5); a space area is reserved by gradually moving components or connectors within and in the vicinity of potential area which gets the least effect (N7); it is determined whether a space area was reserved (N8); obstacle components and their connectors are evacuated to the space area (N9).

A potential area can be defined as follows: it is an area of a given size of space; obstacle connectors can be evacuated to the space area by gradually moving components in the vicinity of the space area; or obstacle components and their connectors can be evacuated to the space area if components in the vicinity of the space area are evacuated to some other area. An evaluation function evaluates how much effect does the movement for reserving a space area give to already formed circuit board layout. Increase or decrease of the value of the evaluation function is based on the following three criteria: how many components are already placed in the potential area; how many connectors are already routed in the potential area; how a potential area is close to an outline of a circuit board.

Figure 17A:
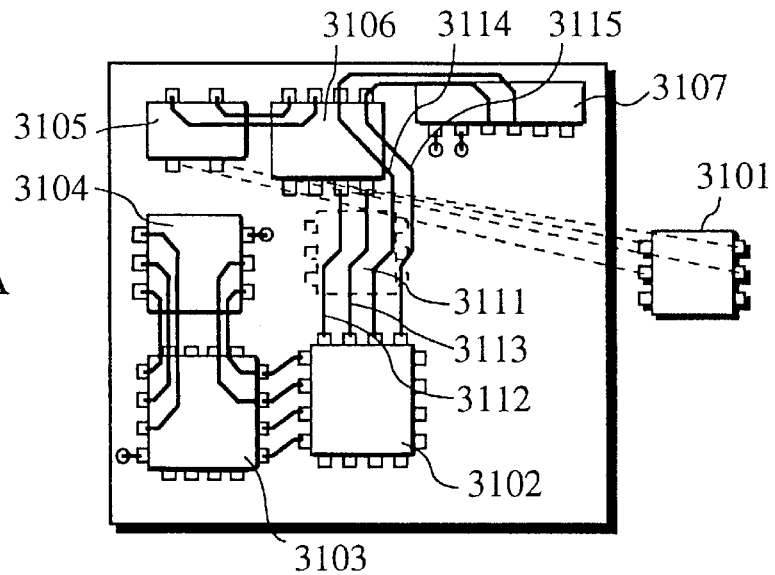
FIG. 17A shows how a placement area is reserved according to the flowchart in FIG. 15.
Figure 17B:
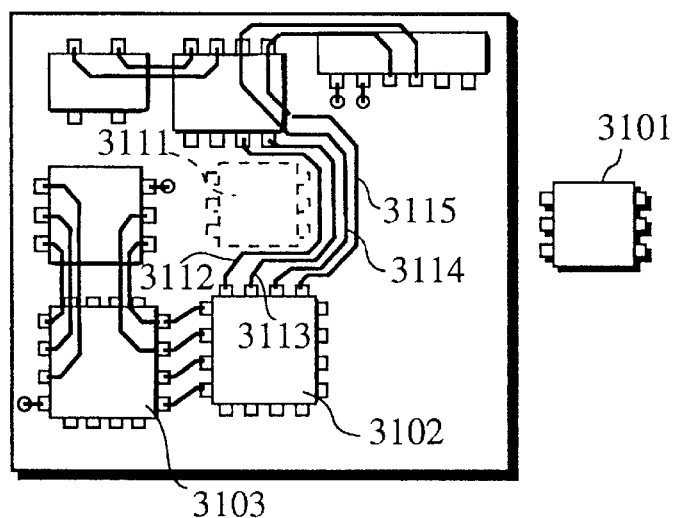
FIG. 17B shows how a placement area is reserved according to the flowchart in FIG. 15.
Figure 17C:
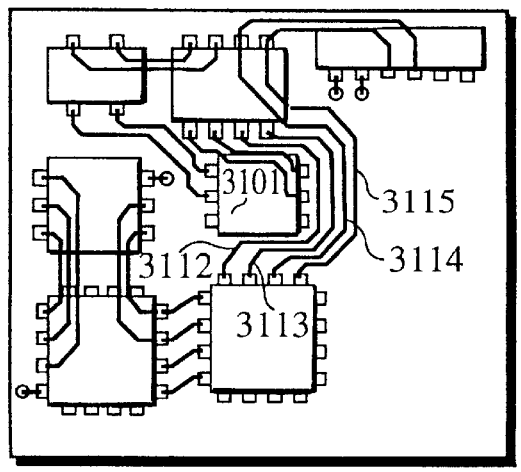
FIG. 17C shows how a placement area is reserved according to the flowchart in FIG. 15.

FIGS. 17A to 17C show how a routing area is reserved by the above movement. Component 3101 is set as a placement candidate component. Placement candidate component is to be placed at area 3111 enclosed in broken lines, which is determined in M1.

How packaging is implemented can be explained as follows.

Components 3102 to 3107 are already placed on a circuit board. Microprocessor 6 has already selected component 3101 as a placement candidate component. Microprocessor 6 determines, by method of elastic center, placement position of component 3101 outside of prohibition areas and areas where components are already placed (M1 in FIG. 15), and determines whether component 3101 overlaps with already routed connectors (M2). At this stage, microprocessor 6 determines an area represented by reference FIG. 3111 in FIG. 17A as a placement position. When they overlap, microprocessor 6 sets connectors 3112 to 3115 as obstacle connectors. After that, microprocessor 6 determines whether a space area to be used for evacuation exists (M3). In FIG. 17A, a space area exists on the right side of the obstacle connectors, so microprocessor 6 evacuates them to this space area (M8).

When the right side area is already occupied by components and connectors, how a space area is reserved can be explained as follows.

Figure 18:
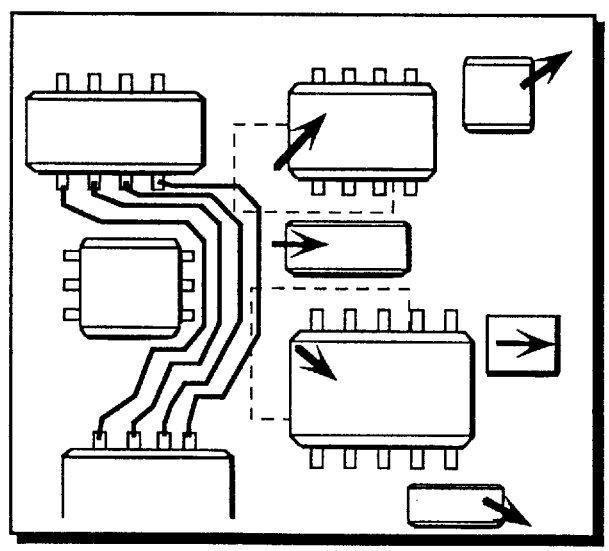
FIG. 18 shows how an evacuation area for obstacle connectors is reserved according to the flowchart in FIG. 15.

FIG. 18 shows how a routing area is reserved in M6.

If a space area does not exist in M3, microprocessor 6 generates a plurality of potential areas to be used for evacuation of obstacle connectors (M4), and evaluates, by evaluation function, how much effect does the movement of components or connectors in a potential area give to the circuit board layout which is already formed (M5). As shown in FIGS. 17A to 17C, components 3102 to 3107 exist in the vicinity of obstacle connector 3111. Right-side area of obstacle connector 3111 and areas occupied by the above mentioned components are generated as potential areas. Evaluation value of positions of components 3102 to 3107 become high naturally, as these positions exist near an outline of a circuit board. By comparison, evaluation value of the right-side area of placement candidate component 3101 becomes the lowest. Therefore, microprocessor 6 reserves a space area by gradually moving components or connectors in the right-side area or in the vicinity of it as shown by arrows in FIG. 18 (M6). When it is determined that a space area is reserved as shown in FIG. 18 (M7), microprocessor 6 evacuates obstacle connectors 3112 to 3115 to this space area (M10) and completes processing. If a space area for the evacuation of obstacle connectors cannot be reserved (M7), microprocessor 6 changes obstacle routing to extended routing in the space area (M9).

Figure 19A:
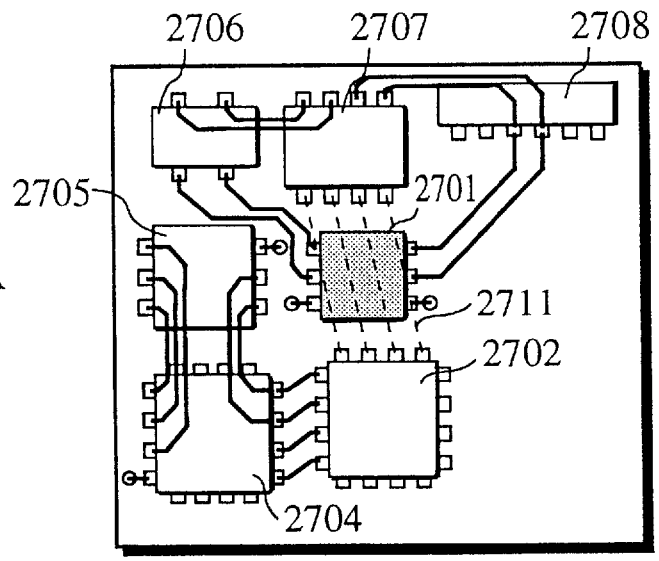
FIG. 19A shows how a routing area is reserved according to the flowchart in FIG. 15.

FIG. 19 shows how a routing area is reserved according to the flowchart in FIG. 16. In FIG. 19, component 2702 is set as a placement candidate component. The broken lines represent the shortest routing paths of connectors. The shaded component in FIG. 19A represents obstacle component 2701. How packaging on a circuit board is implemented can be explained as follows.

Figure 19B:
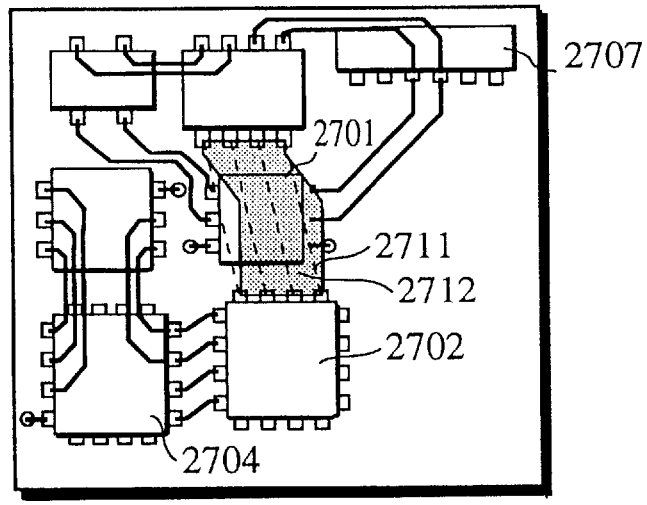
FIG. 19B shows how a routing area is reserved according to the flowchart in FIG. 15.
Figure 19C:
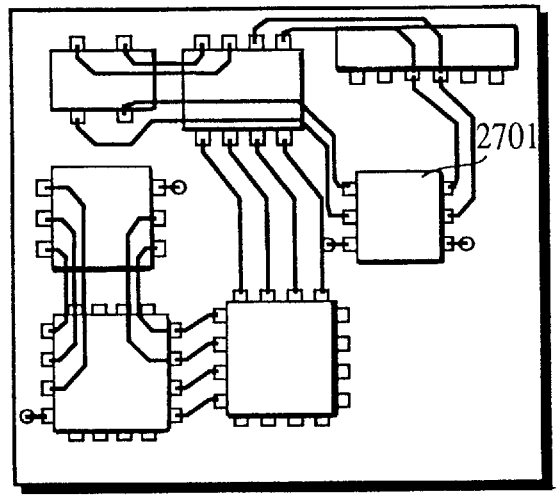
FIG. 19C shows how a routing area is reserved according to the flowchart in FIG. 15.

Microprocessor 6 has already placed components 2701, 2704 to 2708 and placement candidate component 2702 on a circuit board as shown in FIG. 19A. Microprocessor 6 creates, by maze method or line search algorithm, routing path 2711 outside of prohibition areas and areas where connectors are already routed (N1), and determines whether the routing path overlaps with already placed components (N2). When routing path 2711 overlaps with obstacle component 2701 as shown in FIG. 19B, microprocessor 6 determines whether there is a space area for evacuation of obstacle component 2701 and its connectors (N3). There is a space area on the right side of obstacle component 2701 in the drawing, so microprocessor 6 evacuates obstacle component 2701 to this space area as shown in FIG. 19C (N9).

When the right-side area in FIG. 19 is already occupied by components and connectors, how a space area is reserved can be explained as follows.

Figure 20:
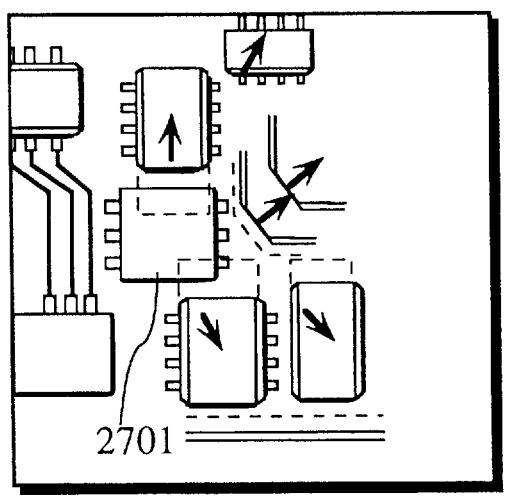
FIG. 20 shows how an evacuation area for an obstacle component is reserved according to the flowchart in FIG. 15.

If a space area does not exist in N3, microprocessor 6 generates a plurality of potential areas to be used for evacuation of an obstacle component and its connectors on the circuit board (N4). As there are components 2704 to 2707 in the vicinity of obstacle component 2701, microprocessor 6 designates areas occupied by them as potential areas. Next, microprocessor 6 evaluates, by evaluation function, how much effect the movement of components or connectors in a potential area give to other components or connectors on the circuit board (N5). As components 2702 to 2707 exist near the outline of the circuit board, their evaluation values become high naturally. By comparison, evaluation value of the right-side area of obstacle component 2701 becomes the lowest. Then, microprocessor 6 reserves a space area by gradually moving components or connectors in the right-side area and in the vicinity of it as shown in FIG. 20 (N7). When it is reserved (N8), microprocessor 6 evacuates the obstacle components and its connectors to the space area (N9), and completes processing. When the evacuation cannot be realized, microprocessor 6 goes back to Step 214 in FIG. 9 and makes display 2 display failure of packaging.

According to the present embodiment, obstacle connectors are evacuated when that is possible, so packaging is more likely to be realized flexibly even if a space area cannot be reserved. In other words, probability of failure of packaging can be reduced as failure of packaging is determined after the obstacle connectors are evacuated.

Also, obstacle components are evacuated when that is possible, so packaging is more likely to be realized flexibly even if a space area cannot be reserved. In other words, probability of failure of packaging can be reduced as it is determined that the packaging has been a failure after the obstacle components are evacuated.

Moreover, space paths can be reserved by gradually moving components in the vicinity of the obstacle connectors and obstacle component, so even if the number of space paths becomes small after a lot of connectors are routed on the circuit board, a space path can be reserved until the last one disappears. Routing path of the obstacle connectors and placement positions of the obstacle component area are changed into the space created by the movement mentioned above. So high-density layout can be formed on the circuit board. If there is no space area, an obstacle component is processed by extended routing, and another surface is used for placing the obstacle component.

When a component becomes an obstacle component, it can be placed on the other side of the circuit board if it is possible. A routing angle can be changed. When layers of circuit boards are used, connectors can be extended to another layer in order to avoid the obstacle component.

The present embodiment can be modified as long as the main points are not changed. For example, it is possible to implement shortening of connectors in the fourth embodiment after placing components in the present embodiment. Also, it is possible to implement enlargement processing of the circuit board of the third embodiment if circuit board area becomes insufficient in the present embodiment.

Third Embodiment

In the third embodiment, size of a circuit board is calculated after the completion of packaging design, and packaging design is re-implemented with that calculated size of the circuit board.

Figure 21:
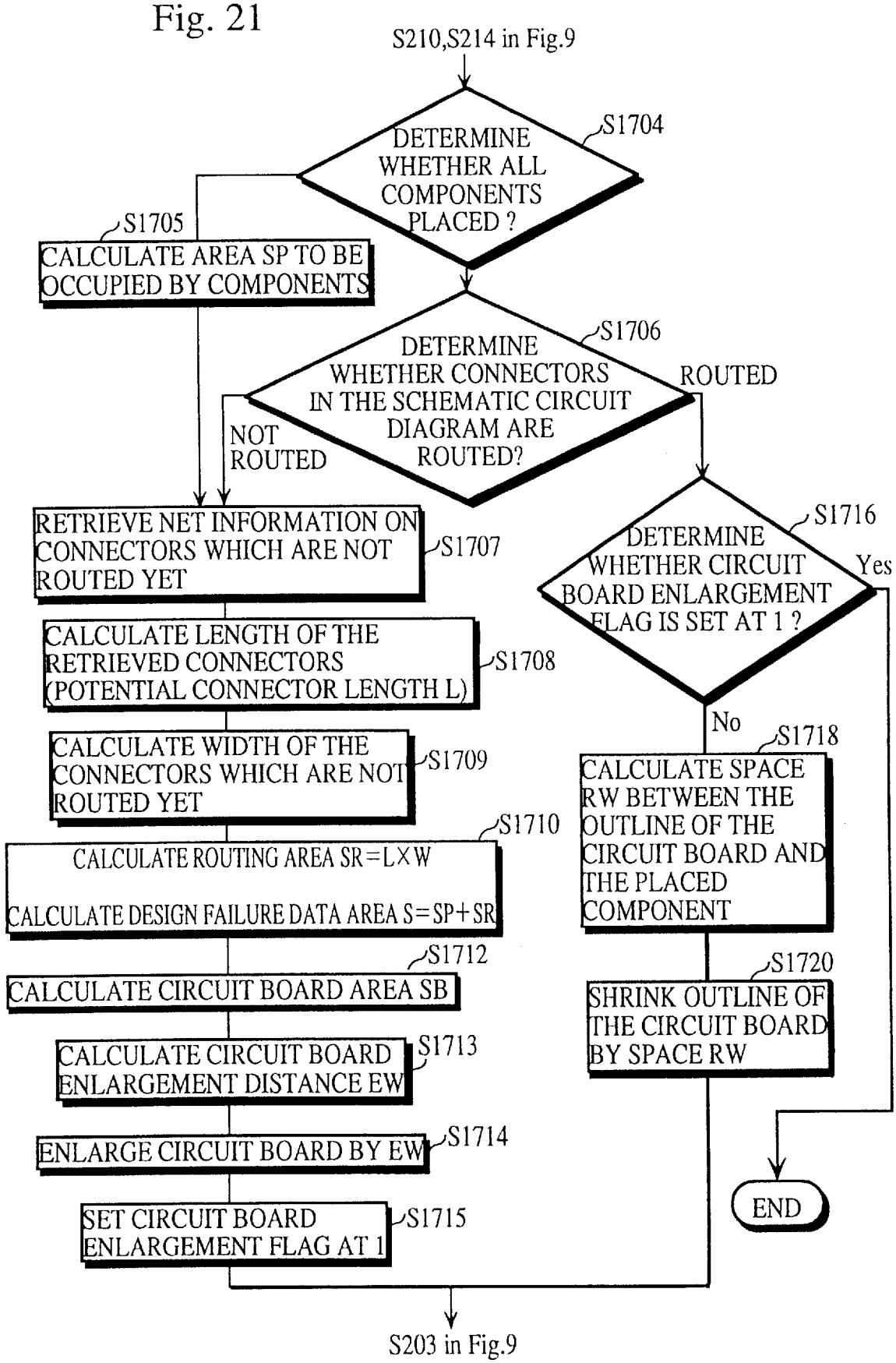
FIG. 21 is a flowchart for calculation of a size of a circuit board when packaging design has to be re-implemented.

Therefore, after Step 210 (success of packaging) and Step 214 (failure of packaging) in FIG. 9, processing in a flowchart in FIG. 21 is implemented. Then Step 203 of FIG. 9 is implemented.

FIG. 21 is a flowchart composed of the following steps: it is determined whether all components in a schematic circuit diagram are placed on a circuit board (Step 1704); if not, area SP to be occupied by a component is calculated (Step 1705); if all the components are placed, it is determined whether connectors are routed between them (Step 1706); if they are not routed, net information on connectors which are not routed yet is retrieved (Step 1707); length of the retrieved connectors are calculated (potential connector length L) (Step 1708); width of the connectors (width W) is calculated (Step 1709); insufficient amount of the circuit board area S is calculated by S=SP+SR(SR=W*L) (Step 1710); area of the current circuit board (area SB) is calculated (Step 1712); enlargement width EW is calculated based on the proportion of insufficient amount S and area SB (Step 1713); outline of the circuit board is enlarged by enlargement amount EW (Step 1714); a circuit board enlargement flag is set at 1 (Step 1715); when packaging design is successful, set value of the circuit board enlargement flag is checked (Step 1716); Space RW which is an area between the outline of the circuit board and the placed component (Step 1718); and the outline of the circuit board is shrunk by space RW (Step 1720).

FIGS. 22A to 22F show how enlargement width EW of the circuit board is calculated. Circuit boards, components, connectors, and vias are represented in the same manner as in FIG. 8. How packaging on the circuit board is implemented can be explained as follows.

Figure 22A:
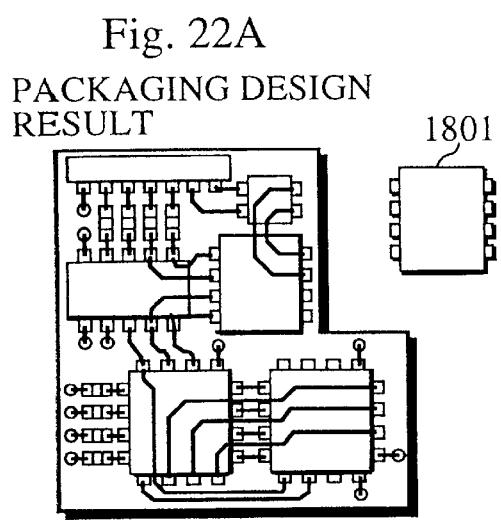
FIGS. 22A to 22F show how enlargement width and reduction width of a circuit board is calculated.
Figure 22D:
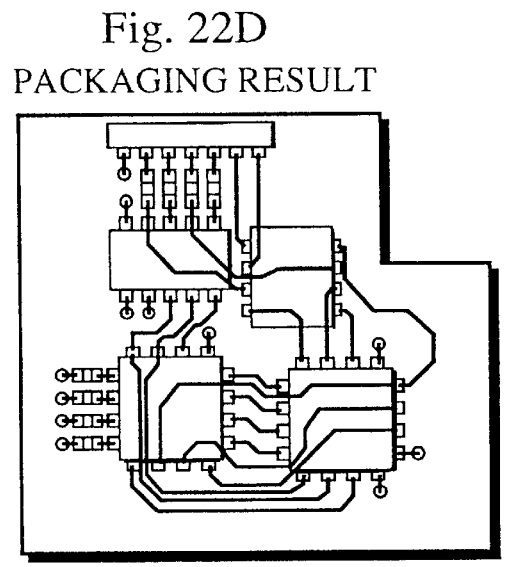
Figure 22B:
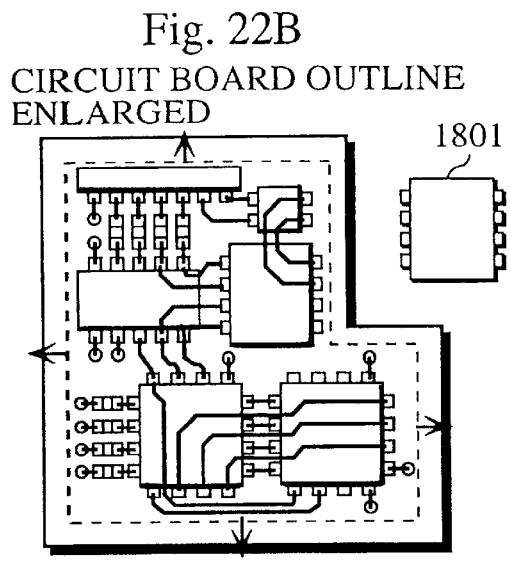
Figure 22E:
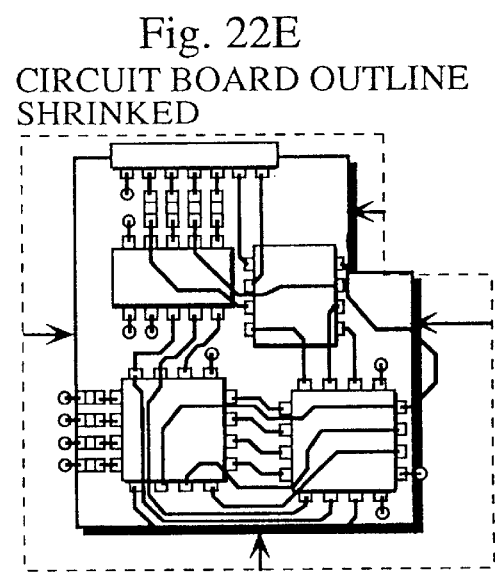
Figure 22C:
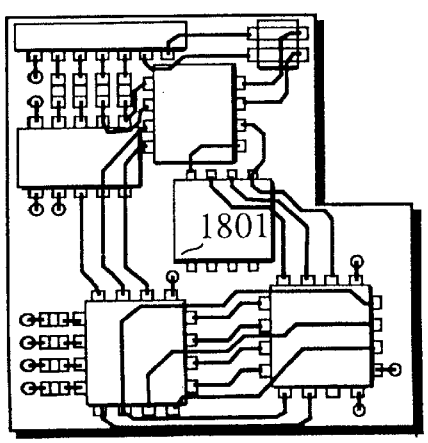

Microprocessor 6 determines whether all components in a schematic circuit diagram are placed on a circuit board (Step 1704 in FIG. 21). In FIG. 22A, as component 1801 is not placed yet, microprocessor 6 calculates area SP for component 1801 (Step 1705). If component 1801 is already placed, microprocessor 6 determines whether connectors are routed between component 1801 and another component(Step 1706). If they are not routed in Step 1706, microprocessor 6 retrieves net information on connectors of component 1801, which are not routed yet (Step 1707), calculates length of the retrieved connectors (Step 1708), and calculates width of the connectors on the circuit board (width W) (Step 1709). After that, microprocessor 6 calculates insufficient amount S by S=SP+SR(SR=W*L) (Step 1710). Then microprocessor 6 calculates size of the current L-shaped circuit board (area SB) (Step 1712), and calculates enlargement width EW based on the proportion of the insufficient amount S and area SB (Step 1713), enlarges outline of the circuit board by enlargement width EW as shown in FIG. 22B (Step 1714), and sets a circuit board enlargement flag at 1 (Step 1715). Packaging design is re-implemented to the circuit board which is enlarged by width EW. (Steps 203 to 210 in FIG. 9). The result is shown in FIG. 22C: the component which is not placed yet is placed on the circuit board, and all components and connectors are packaged with high density.

Figure 22F:
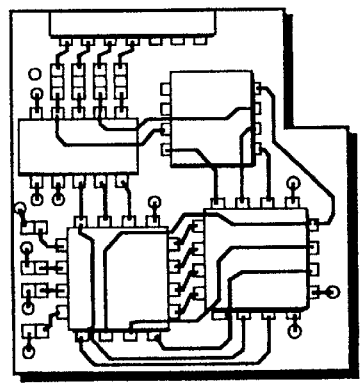

The following explanation is about a case in which packaging design is successful. FIGS. 22D to 22F show how shrinkage width of the circuit board is calculated. Here, it is supposed that packaging design is completed at the state of FIG. 22D. Microprocessor 6 determines set value of the circuit board enlargement flag (Step 1716), and determines whether this success depends on the enlargement by the above enlargement width EW. If the circuit board enlargement flag is 1, microprocessor 6 completes processing as it is impossible to shrink it further. If that is not the case, microprocessor 6 retrieves space areas between the outline of the circuit board and placed components, and calculates space RW (Step 1718). Spaces RW1 to RW4, which are designated by arrows in FIG. 22E, are calculated in this way and the outline is shrieked by space RW (Step 1720). After that, packaging design is re-implemented to the circuit board (Steps 203 to 210 in FIG. 9). The result is shown in FIG. 22F, in which all components and connectors are packaged with high density.

Moreover, instead of obtaining enlargement width from areas for components and connectors which are not placed and routed yet, it is possible to set an arbitrary off set value and enlarge the outline of the circuit board by that value. The same can be said for processing of circuit board shrinkage. It is possible to calculate how much should circuit board outline shrink in order to make the circuit board area and area occupied by components and connectors equal. The present embodiment was based on procedure of the first embodiment, but it is possible to obtain enlargement width and shrinkage width after the conventional automatic placement of components and automatic routing of connectors.

The present embodiment can be modified as long as the main points are not changed. For example, it is possible to implement processing of the present embodiment after evacuation of obstacle connectors and obstacle components in the second embodiment. Or after routing connectors in the present embodiment, it is possible to shorten length of connectors in the fourth embodiment.

Fourth Embodiment

In the fourth embodiment, length of critical path and data path are shortened by moving placement position of placement candidate components which are determined by method of elastic center to already placed components.

Figure 10:
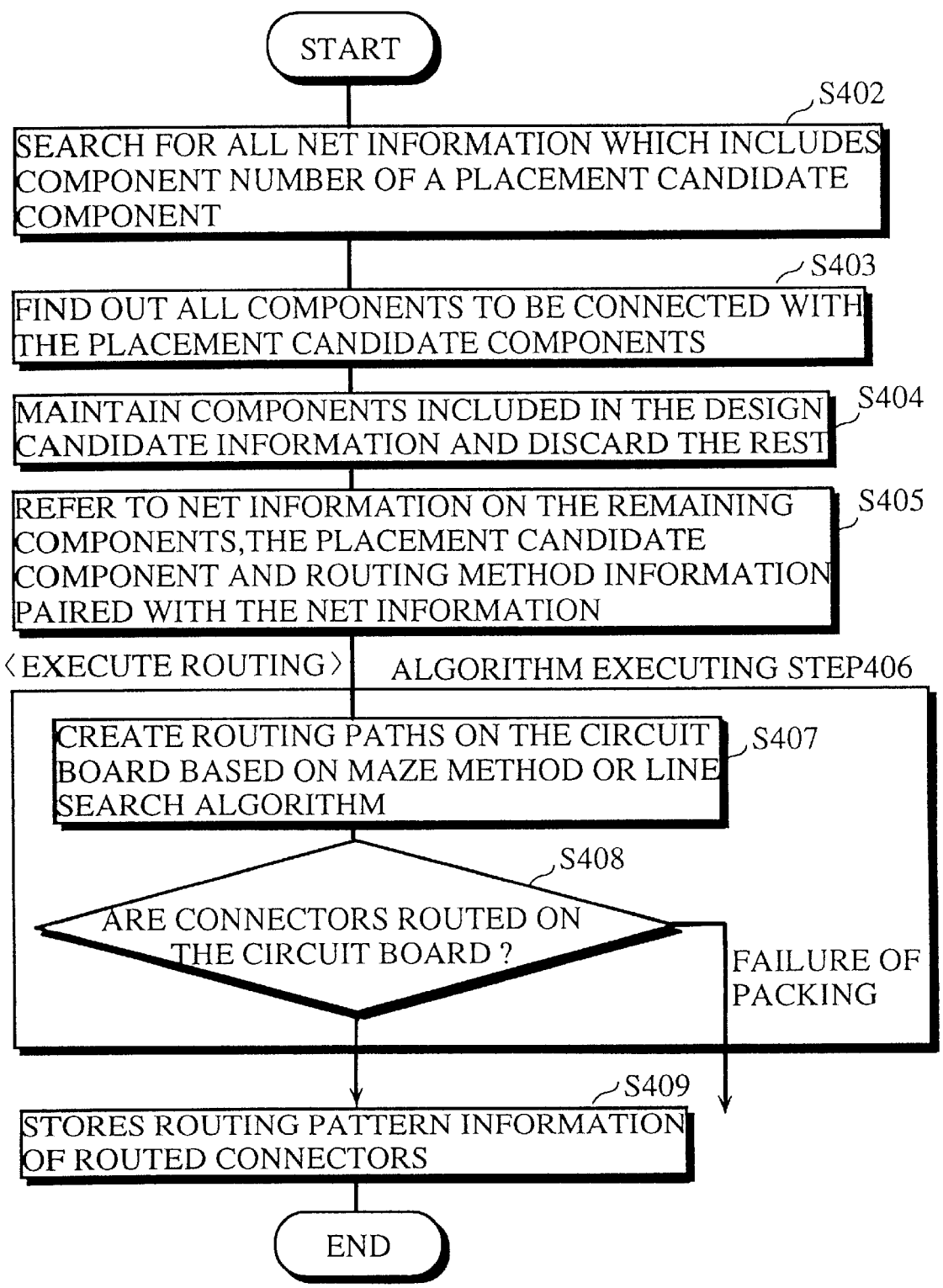
FIG. 10 is a sub-flowchart for Step 207 in FIG. 9.
Figure 23:
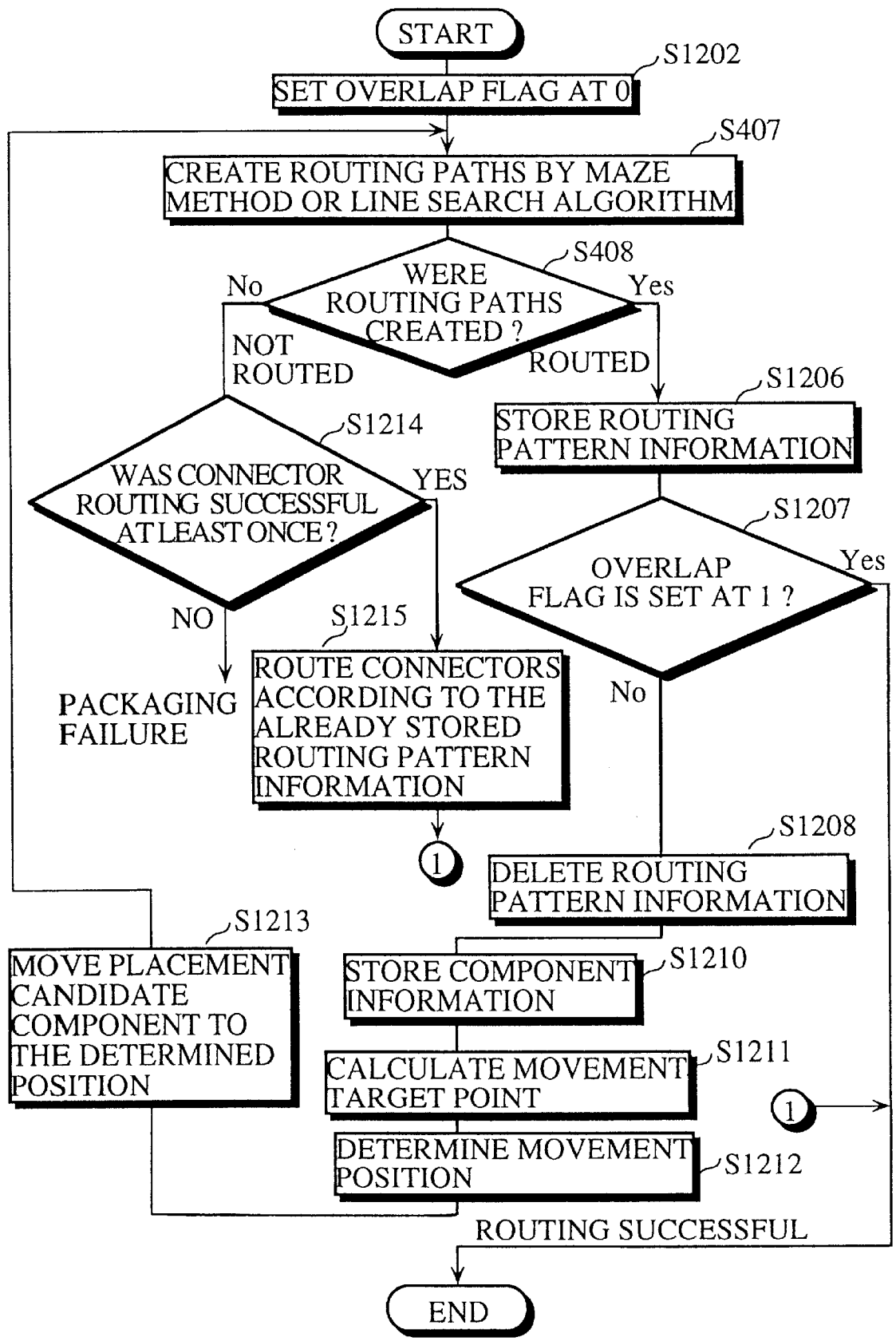
FIG. 23 is a sub-flowchart for Step 406 in FIG. 10 of a fourth embodiment.

Therefore, in the fourth embodiment, Step 406 in FIG. 10 is constructed according to a sub-flowchart in FIG. 23.

Explanation on the fourth embodiment is carried out by means of the above sub-flowchart. The flowchart in FIG. 23 is composed of the following steps: overlap flag is initialized (Step 1202); routing paths are created (Step 407); it is determined whether routing paths are created (Step 408); routing pattern information is backed up when routing paths are created (Step 1206); after that, routing pattern information on connectors of a placement candidate component is deleted from the circuit board (Step 1208); after that, placement position, surface and angle of the placement candidate component are backed up (Step 1210); destination of the placement candidate component (a movement target point) is calculated (Step 1211); movement amount to the destination is calculated (Step 1212); the placement candidate component is moved by the calculated movement amount (Step 1213); when connectors are not routed in Step 407, it is determined whether connector routing was successful at least once (Step 1214); if connector routing was successful at least once, connectors are routed according to the already stored routing pattern information (Step 1215); and when overlap flag is set at 1, movement of the placement candidate component is stopped (Step 1207).

Overlap flag is set when the placement candidate component and an already placed component overlap. Therefore, this overlap flag is set at 1 only when a placement candidate component and an already placed component overlap. Other times, it is set at 0.

<Calculation of Movement Target Point>

In Step 1211 in FIG. 23, a movement target point is determined so as to shorten length of critical path, address bus, and data bus. Step 1211 in FIG. 23 is constructed according to a sub-flowchart in FIG. 25.

Figure 25:
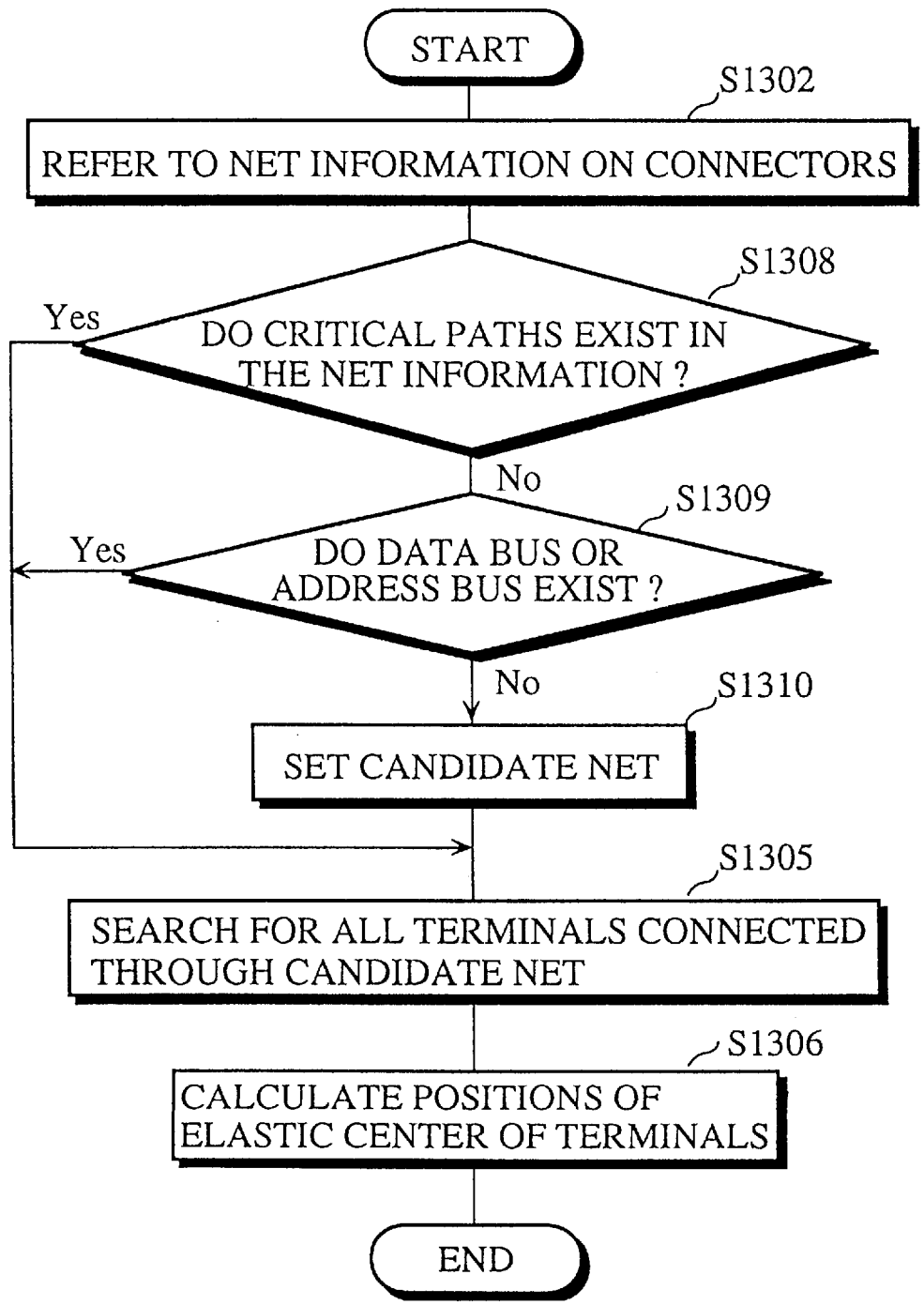
FIG. 25 is a sub-flowchart for a movement target point calculation processing.

FIG. 25 is composed of the following steps: net information on connectors of a placement candidate component is referred to (Step 1302); it is determined whether a critical path exist in the net information (Step 1308); it is determined whether a data bus and address bus exist (Step 1309); if a critical path or address bus exist, either of the existing critical path or address bus is set as candidate net (candidate net is a variable for storing net information on connectors to be shortened), and if neither of them do not exist, already routed connectors are set in the candidate net (Step 1310); all terminals connected with terminals of the placement candidate component through the candidate net are searched for (Step 1305); and position of elastic center of terminals is calculated from shape of the terminals which were searched for (Step 1306). Determination of whether net information is on a critical path, data bus, address bus, or neither of them is carried out, referring to columns showing presence of critical path and data/address bus, which are added to net information. An example is shown in FIG. 24. The net information is inputted when interactive edit mode is activated during circuit design or packaging design as a file, and stored in storage device 1. The net information is read out to various work buffer area, if necessary, and used.

<Movement Amount Calculation>

Step 1212 in FIG. 23 is constructed in a way that position of placement candidate component is gradually moved to a target point, processing of Steps 1206 to 1213 being repeated many times. Step 1212 in FIG. 23 is constructed according to a sub-flowchart in FIG. 26.

Figure 26:
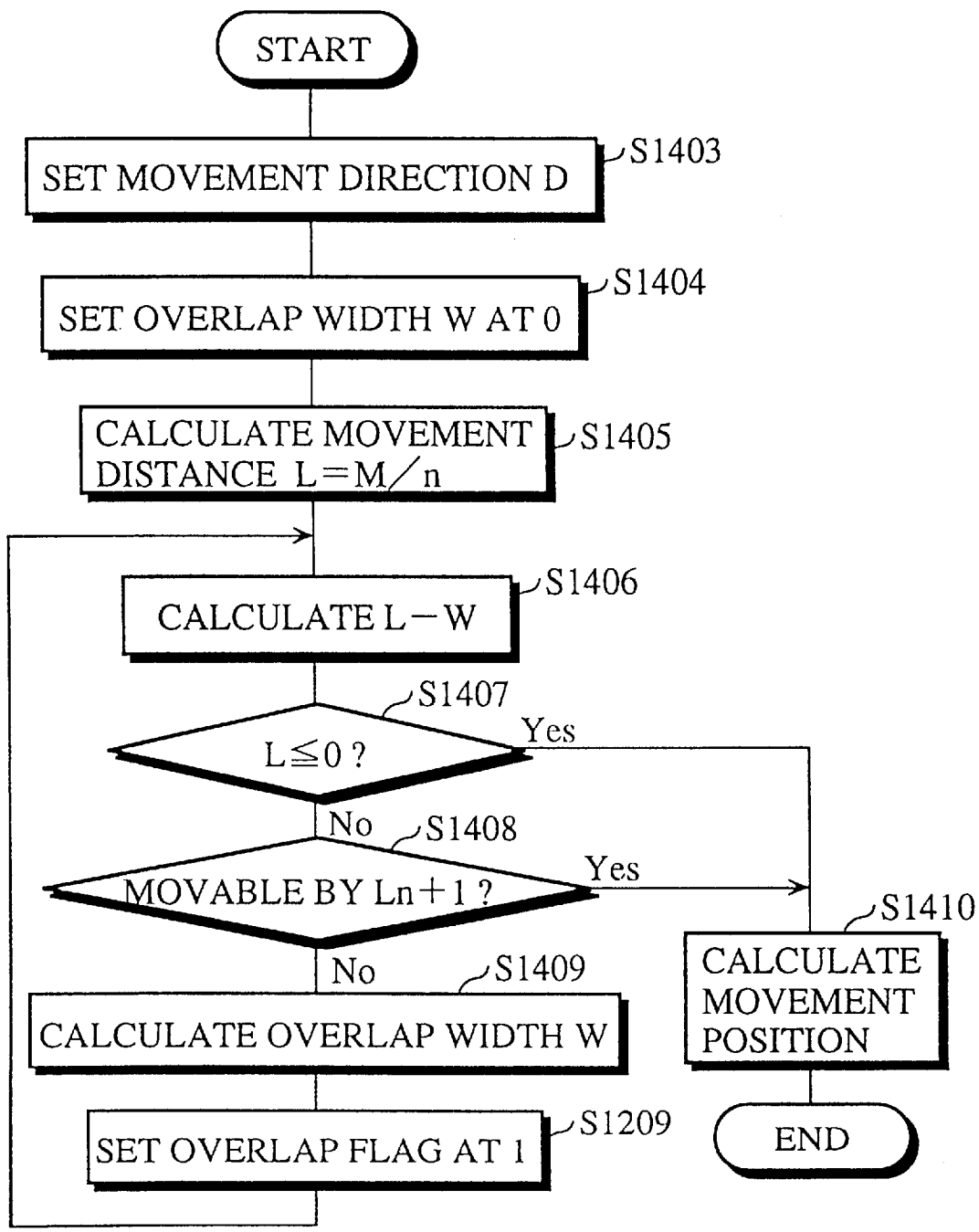
FIG. 26 is a sub-flowchart for movement amount calculation processing.

The sub-flowchart in FIG. 26 is composed of the following steps: movement direction D is calculated in order to avoid a prohibition area, placed components, and routed connectors (Step 1403); overlap width W is set at 0 (Step 1404); movement amount L is calculated (Step 1405); it is determined whether movement amount L is equal to or below 0 (Step 1407); when it is not equal to or below 0, it is determined whether a placement candidate component can be moved by movement amount L (Step 1408); if it is not possible, overlap width W is calculated (Step 1409); after that, overlap flag is set at 1 (Step 1209); overlap width W is reduced from movement distance L (Step 1406); and when movement amount L is equal to or below 0 or the movement is possible, movement position is calculated (Step 1410).

Movement direction D is a variable showing direction from a placement candidate component to a target point. Overlap width W is a variable showing how much the placement candidate component and a target point overlap. While the placement candidate component is being moved to the target point, overlap width W is 0. When they overlap, it is set. M in FIG. 26 is distance between the placement candidate component and the target point, which shrinks as the placement candidate component is moved to the target point. Movement amount L is distance generated by gradually moving a placement candidate component to a target point. Movement amount L is set at a value which is obtained by dividing M by n (n is a given number, which is set at 10 in the present embodiment). The reason movement amount M is set at a small value is to reserve a minimum routing area between the placement candidate component and the target point and to eradicate obstacles in the area. Movement amount L can be determined in view of width of the placement target component.

If connectors can be routed by one-time movement of the placement candidate component in the above mentioned way, processing in FIG. 26 goes back to that in FIG. 23. When processing in FIG. 23 goes back to that in FIG. 26, the distance between the target point and placement candidate component is shorter then before, so smaller movement distance L is calculated. Therefore, if the number of the movement increases, smaller movement amount is calculated.

Figure 27:
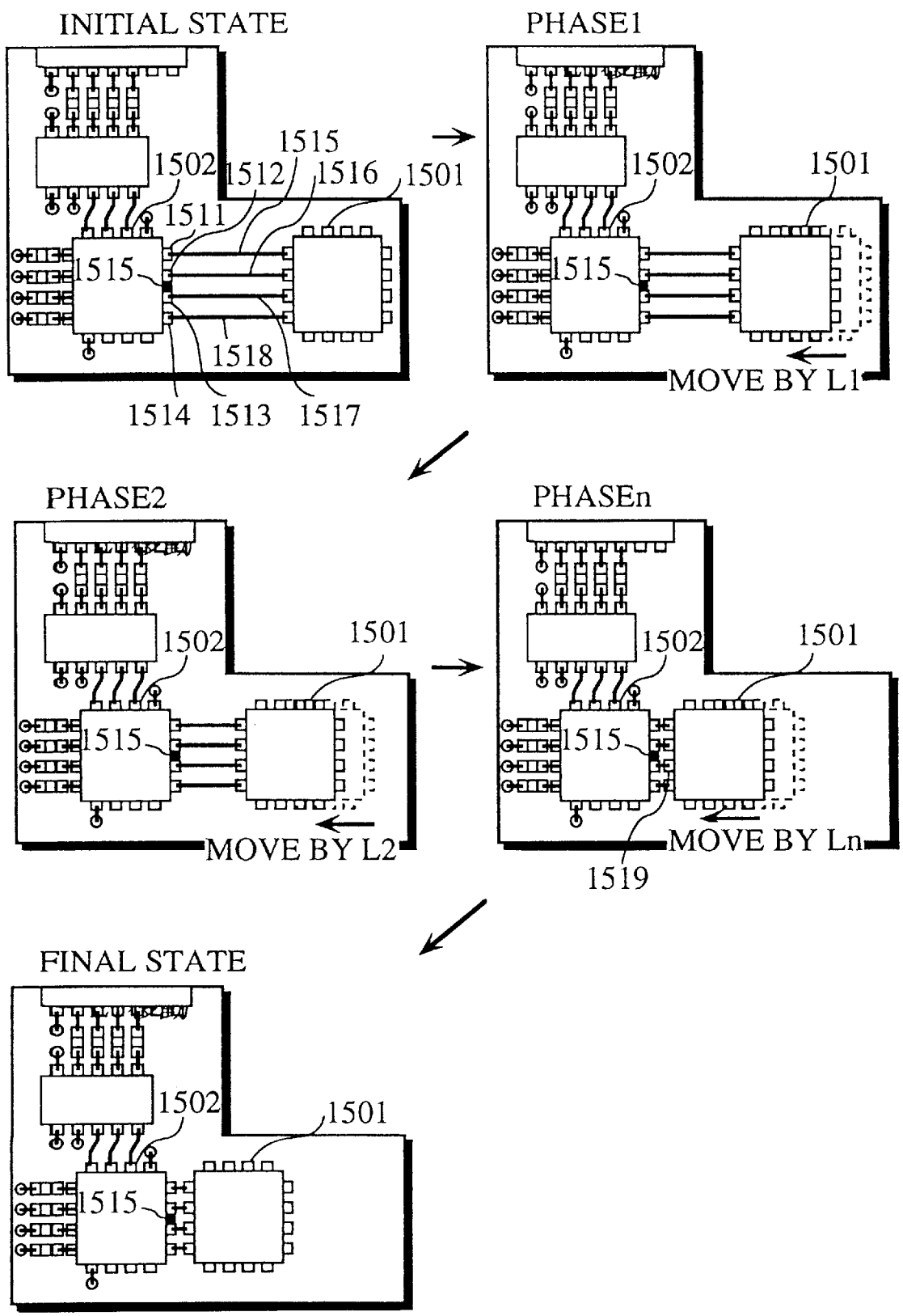
FIG. 27 shows how a placement candidate component is moved to a target point gradually.

FIG. 27 shows how a placement candidate component is moved to a target point. In phase 1, placement candidate component 1501 is moved by movement distance L1. In phase 2, placement candidate component 1501 is moved by movement distance L2. Phase n means that processing of placing components and routing connectors was repeated n times. Distance between the placement candidate component and the target point becomes shorter gradually. The final layout is determined when the above mentioned processing is about to be impossible. In the final layout, length of connectors are shorter than the connector in the initial state. The black circle 1515 is set as a target point. Arrows L1, L2, Ln represent movement amount. The dotted line represents position of component 1501 in the preceding phase.

How a component is moved can be explained as follows.

An overlap flag is initialized (Step 1202 in FIG. 23), routing paths are created as shown in "initial state" in FIG. 27 (Step 407 in FIG. 23), and it is determined whether routing paths are already created (Step 408). Microprocessor 6 backs up routing pattern information at the initial state (Step 1206), deletes routing pattern information on connectors of a placement candidate component from the circuit board (Step 1208), determines whether an overlap flag is 1 (Step 1207), backs up placement position, surface, and angle of the placement candidate component (Step 1210) and, calculates movement target point of the placement candidate component. (Step 1211 in FIG. 23).

At this stage, transition from FIG. 23 to FIG. 25 takes place.

Microprocessor 6 refers to net information on connectors of the placement candidate component (Step 1302), determines whether a critical path or data bus or address bus exists in the net information (Steps 1308, and 1309). As buses 1515 to 1518 exist for component 1501, microprocessor 6 sets net information on these buses at value of candidate net (Step 1310). After that, microprocessor 6 searches for terminals connected with the terminals of placement candidate component through the candidate net (Step 1305). As terminals of the placement candidate component are connected to terminals 1511 to 1514 by buses 1515 to 1518, elastic center position 1515 is calculated from shape of terminals 1511 to 1514 (Step 1306), and microprocessor 6 recognizes this elastic center point 1515 as a movement target point. Then, transition from FIG. 25 to FIG. 23 takes place.

After processing in FIG. 23 starts, movement position is determined (Step 1212 in FIG. 23). Then transition from FIG. 23 to FIG. 26 takes place.

First, microprocessor 6 calculates movement direction D to avoid prohibition area between the placement candidate component and the target point (Step 1403). Movement direction D is set as "from right to left ". After that, microprocessor 6 sets an overlap width at 0 (Step 1404), and calculates movement distance L1 (Step 1405). In the present example, it is 1/10 of distance M between standard coordinates of component 1501 and a movement target point. After that, microprocessor 6 determines whether movement amount L is equal to or below 0 (Steps 1406 and 1407). If it is not equal to or below 0, microprocessor 6 determines whether the placement candidate component can be moved by movement amount L1 (Step 1408). In the present example, it is possible. So microprocessor 6 calculates movement position (Step 1410). After that, transition from FIG. 26 to FIG. 23 takes place.

If connectors are already routed, movement direction D is the direction towards the movement target point calculated in Step 1211 in FIG. 23. If connectors are not routed yet, movement direction D is the opposite.

Microprocessor 6 moves the placement candidate component to the target point by movement amount L1 (Step 1213). After that, microprocessor 6 routes connectors. Then the circuit board layout becomes like phase 1.

Likewise, microprocessor 6 calculates movement amount L2 and moves the placement candidate component to the target point by movement amount L2. The same thing can be said for movement amount L3. By repeating such processing, terminal 1519 is moved closest to target point 1515 as shown in "the final state" in FIG. 27.

At this state, microprocessor 6 calculates movement amount D to avoid a prohibition area and calculates movement amount Ln+1 (Step 1405 in FIG. 26). Distance between the target point and placement target component is short. Naturally, Ln+1, which is 1/10 of the short distance between the target point and placement target component, is even shorter. After that, microprocessor 6 determines whether movement amount Ln+1 is equal to or below 0 (Step 1407). If it is not equal to or below 0, microprocessor 6 determines whether the placement candidate component can be moved by movement amount Ln+1 (Step 1408). If it becomes impossible to move placement candidate component 1501 as it overlaps the target point, microprocessor 6 calculates overlap width W (Step 1409). After that, microprocessor 6 reduces overlap width W from Ln+1, and recognizes the result of Ln+2 as movement amount. Naturally, placement candidate component 1501 is moved closest to the target point. After the movement by Ln+2, the final layout is determined. After calculation of the overlap width, microprocessor 6 sets an overlap flag at 1 and calculates a movement position (Step 1410). After that, transition from FIG. 26 to FIG. 23 takes place.

Microprocessor 6 moves the placement candidate component to target point 1515 by movement amount Ln+2 (Step 1213 in FIG. 23). After that, microprocessor 6 routes connectors, executes Step 1206, and determines value of the overlap flag in Step 1206. After the calculation of the overlap width W, the overlap flag is set at 1 (Step 1207), so microprocessor 6 completes processing.

In the above explanation, the placement candidate component moves horizontally, but it can move diagonally across the circuit board. In such a case, each time the placement candidate component moves, different movement direction is set. If this happens in each phase, circular movement is possible.

Moreover, if connector routing failed in Step 408, it is determined whether connector routing was successful at least once (Step 1215). If it was successful at least once, connectors are routed with the routing pattern stored at that time (Step 1215), and if it is not the case, failure of the packaging is determined.

In the first to third embodiments, placement positions can be determined by method of elastic center so as to extend a critical path and data bus in order to balance tension between terminals. However, according to the present embodiment, the placement candidate component is moved to the placement target point as close as possible, probability of routing being confirmed. If connectors cannot be routed, the placement candidate component is moved in the opposite direction. So length of a critical path and data bus can be shortened.

Therefore, high-density packaging design can be realized. So, phase deterrence generated from increase of inductance components can be reduced, the increase being proportional to frequency of signals and length of paths. And areas for components and connectors which will be placed and routed later can be reserved.

As length of connectors of image signals which are critical paths are shortened, image signals are less likely to receive noise of components on the circuit board.

As length of connectors of clock signals which are critical paths are shortened, noise to components on the circuit board can be minimized.

The above mentioned movement distance can be determined in view of shape width of the placement candidate component.

The present embodiment can be modified as long as main points are not changed. For example, after obstacle connectors and components are evacuated in the second embodiment, it is possible to implement processing of the fourth embodiment. Or, if circuit board area is insufficient in the fourth embodiment, it is possible to implement enlargement processing of the circuit board in the third embodiment.

Fifth Embodiment

In the fifth embodiment, routing pattern information on already routed connectors are reused.

Figure 28:
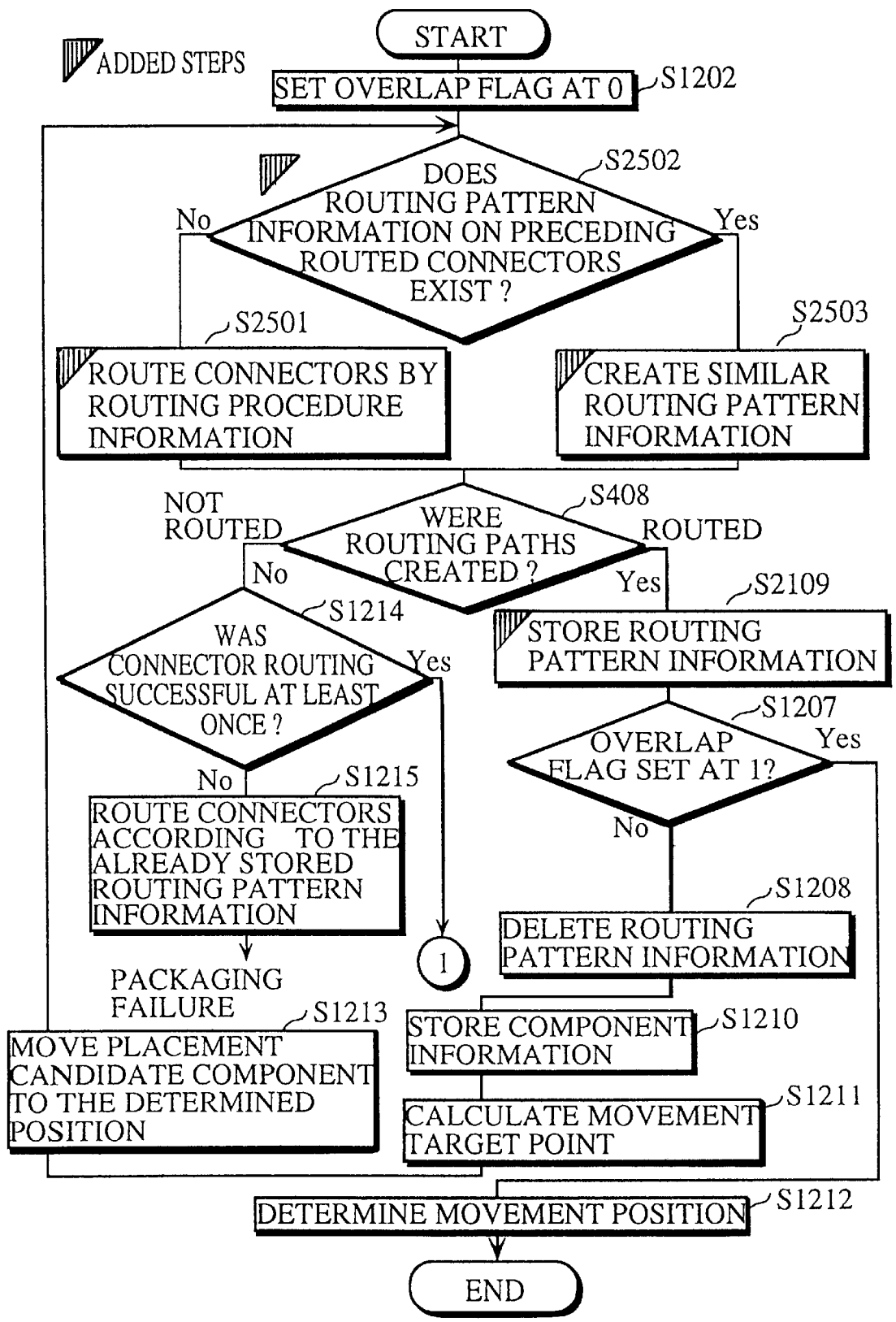
FIG. 28 is a sub-flowchart for Step 406 in FIG. 10 of a fifth embodiment.

Therefore, the following steps are added to FIG. 23, which is shown in FIG. 28: connectors are routed between placement candidate component and other component by means of routing procedure information (Step 2501); right after the placement candidate component is moved to the movement target point, it is determined whether routing pattern information on preceding routed connectors exists (Step 2502), if it exists, similar routing pattern information is created (Step 2503); and routing pattern information is stored (Step 2109).

Figure 30:
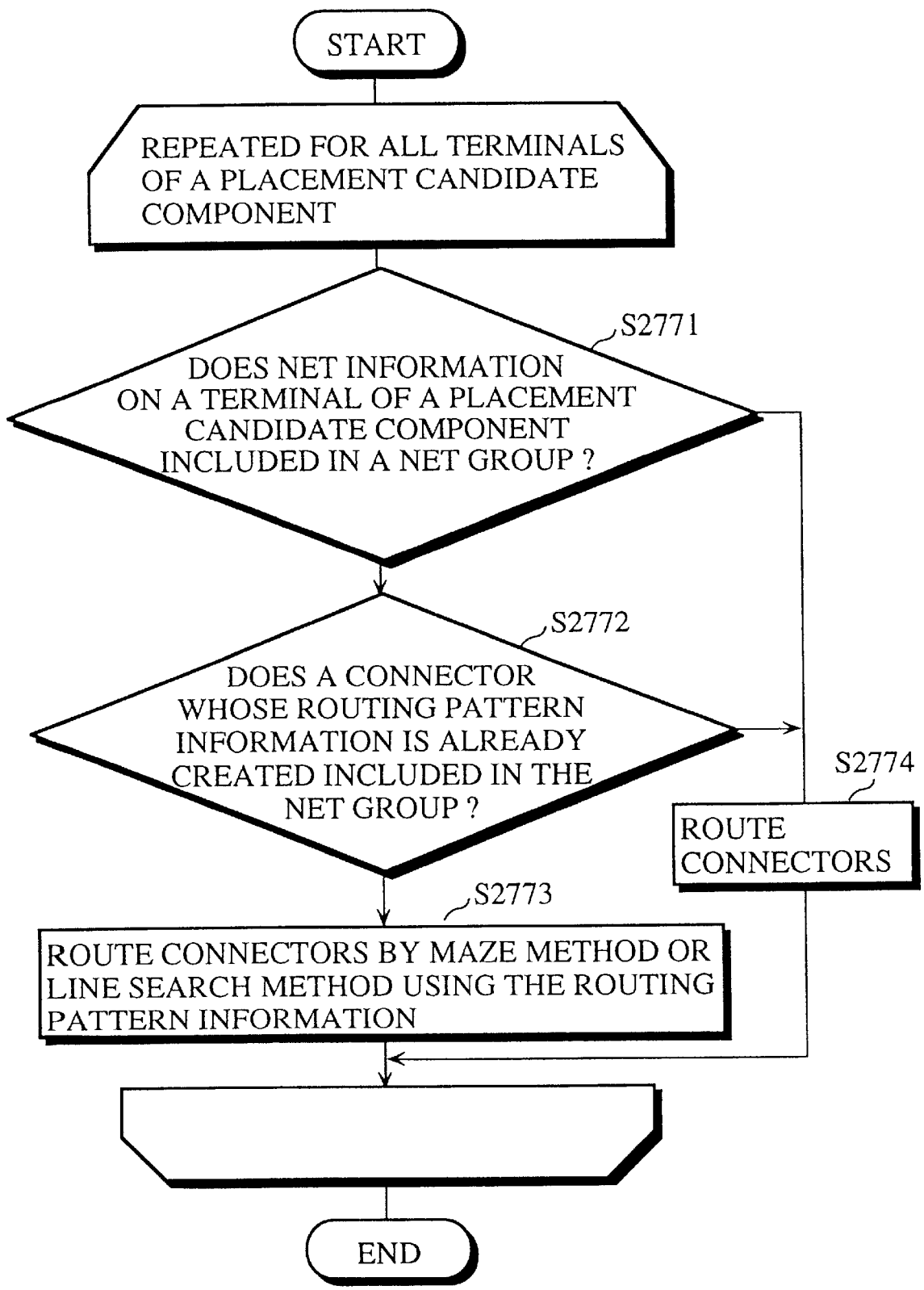
FIG. 30 is a sub-flowchart for Step 2501 in FIG. 28.

Step 2501 is composed of the following steps which are shown in FIG. 30: it is determined whether net information on one of the terminals of a placement candidate component is included in a net group (a group of connectors which mutually use routing pattern information)(Step 2771): if included, it is determined whether the net group includes connectors whose routing pattern information is already created (Step 2772); if so, connectors are routed according to the routing pattern information (Step 2773); and if not, connectors are routed by maze method or line search method (Step 2774). A loop of above mentioned steps is repeated for all terminals of the placement candidate component.

Which connectors are categorized into a net group is designated by routing procedure information in a various work buffer. Routing procedure information is for using routing pattern information on connectors which are already routed. An example is shown in FIG. 30.

Figure 31:
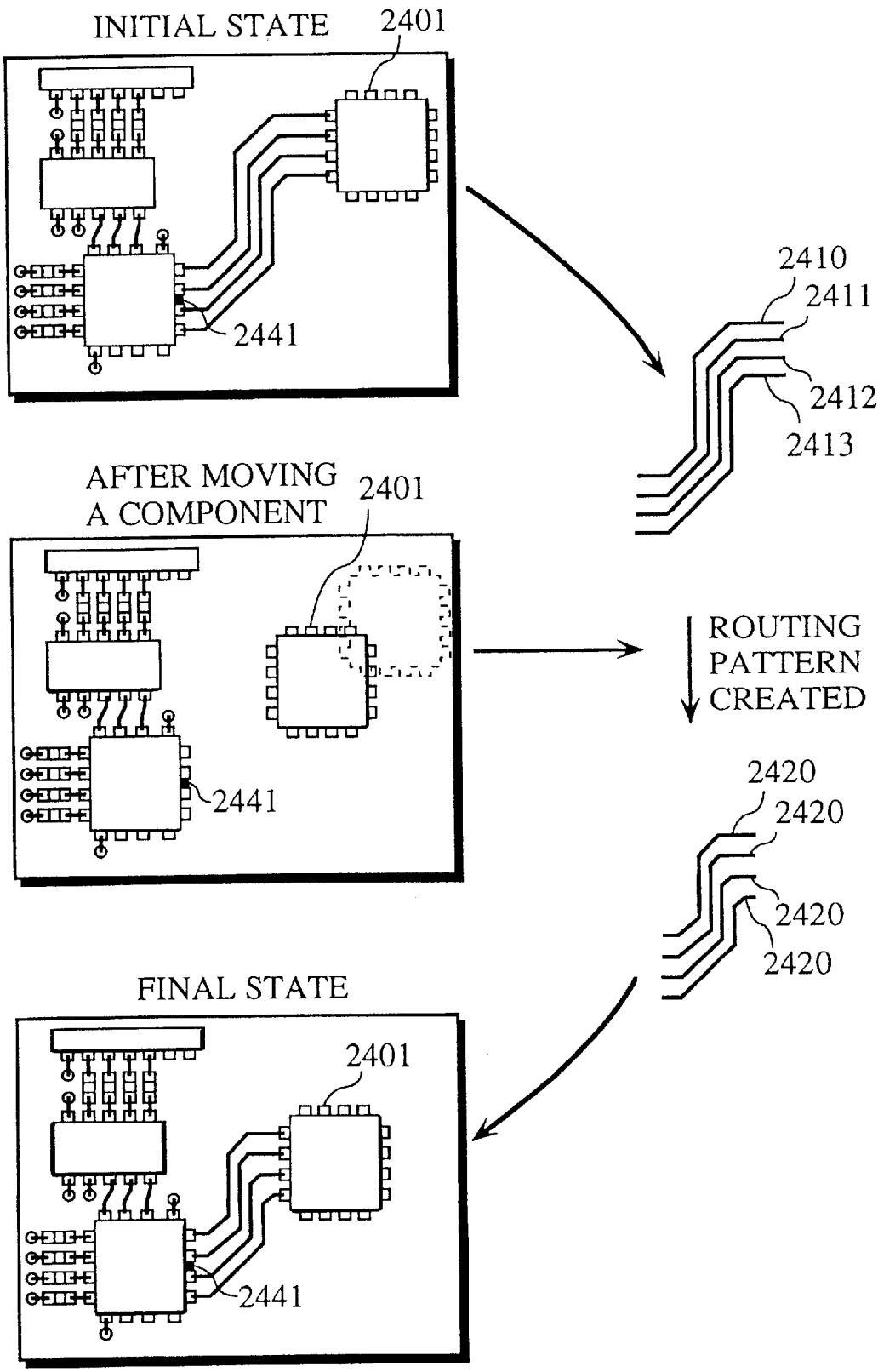
FIG. 31 shows reuse of the above routing pattern information.

FIG. 31 shows how the routing pattern information is reused. Circuit boards, components, connectors and vias are represented in the same manner as in FIG. 8. Connectors 2410 to 2413 are routed by the reuse of routing pattern information, and their net information belongs to the same net group. Under components 2410 to 2413, scaled down similarity of them exists. This is the similar routing pattern information created in Step 2503. In FIG. 31, component 2401 is set as a placement candidate component, and component 2411 is set as a movement target point.

How packaging on a circuit board is implemented can be explained as follows.

Figure 29:
FIG. 29 is an example of routing procedure information.

Placement candidate component 2401 is already set by method of elastic center. Microprocessor 6 determines which net group includes net information on one of the terminals of the placement candidate component (Step 2771). As net group Gr1 includes net A1 of connector 2410, microprocessor 6 determines whether routing pattern information is already created for net group Gr1 (Step 2772). If the routing pattern information exists as shown in FIG. 29, microprocessor 6 routes connectors 2410 to 2413, using this routing pattern information (Step 2773). In FIG. 29, as L-shaped is stored, microprocessor 6 routs connectors 2410 to 2413 like a capital letter L as shown in FIG. 31. After that, microprocessor 6 sets a movement target point 2441 and moves placement candidate component 2401 to it, which is shown in FIG. 31 "after movement of a component" (Steps 1210 to 1213). Before this movement, routing pattern information is already stored.

Microprocessor 6 determines whether routing pattern information is stored in order to move the placement candidate component to the movement target point (Step 2502). If it is stored, microprocessor 6 creates similarity of the routing pattern information (Step 2503). Here, connectors 2420 to 2423 are created as similarity of connectors 2410 to 2413. Then, microprocessor 6 routes connectors 2420 to 2423 between movement target point 2441 and placement candidate component 2401 after the movement of placement candidate component 2401 (Step 407 in FIG. 10). The above mentioned processing is repeated until placement candidate component 2401 is moved to movement target point 2441 as close as possible.

According to the present embodiment, by reusing routing pattern information, uniformity of forms of connectors can be attained as much as possible. By routing an address bus and data bus in the above mentioned way, shape of connectors can be unified. So, timing gap between buses can be minimized, and routing design which is excellent in electronic characteristics can be realized. Moreover, processing time of maze method and line search algorithm can be shortened.

The present embodiment can be modified as long as the main points are not changed. For example, after evacuating obstacle connectors and obstacle components in the second embodiment, or when circuit board area becomes insufficient, enlargement processing of circuit board area in the third embodiment can be implemented.

Sixth Embodiment

In the sixth embodiment, a placement area is reserved for components which will be placed later. A placement area is reserved by implementing extended routing between a terminal of the placement candidate component which is to be connected with the next component. When the next component is placed, the extended routing is deleted, and an area created by the deletion is also used for placing the next component.

Figure 32:
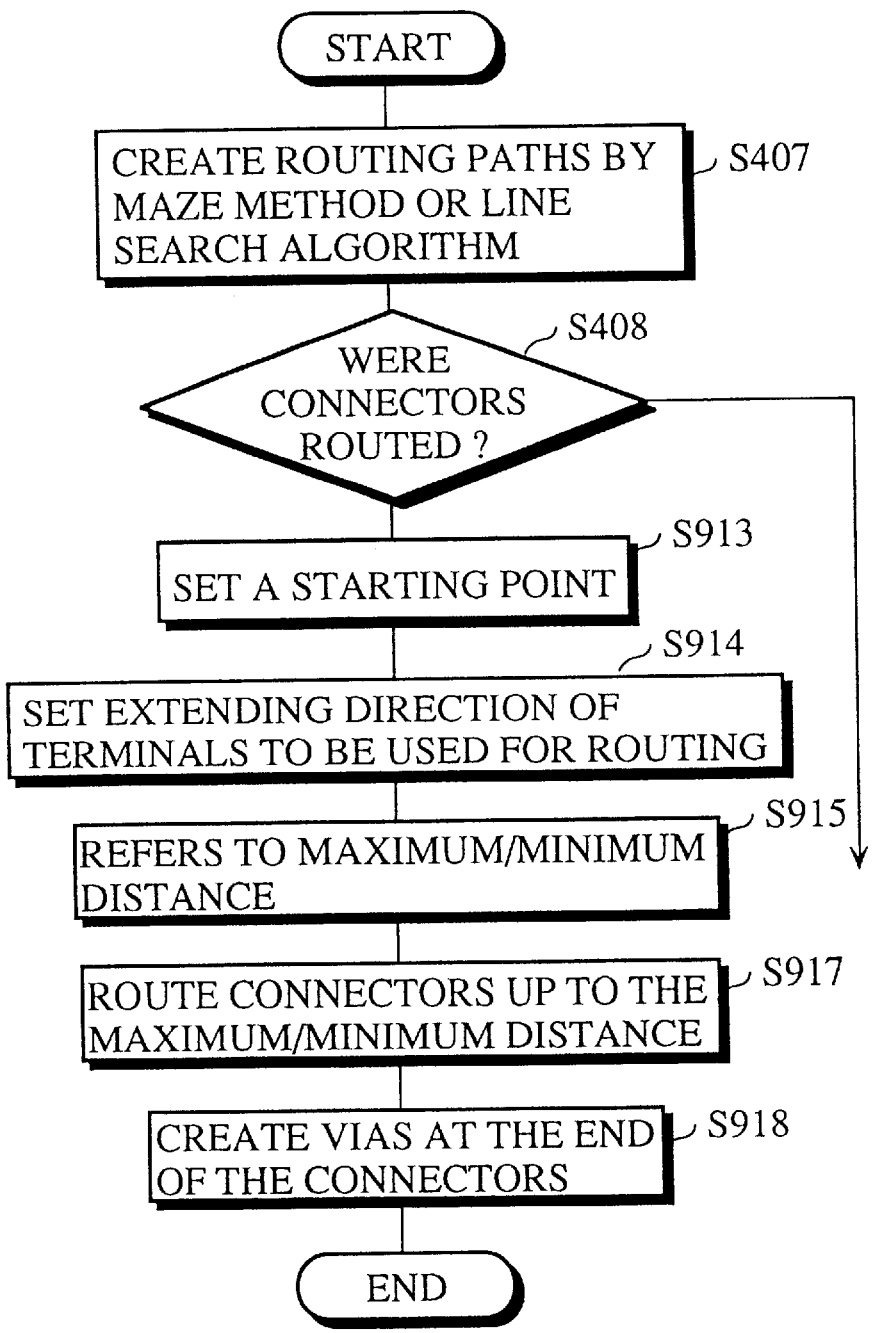
FIG. 32 is a sub-flowchart for Step 406 in FIG. 10 of a sixth embodiment.

In order to reserve placement areas, Step 406 if FIG. 10 is composed of the following steps, which are shown in FIG. 32: a terminal of a placement candidate component, which is not used for routing a connector yet, is set as a starting point (Step 913); by referring extension information from the starting point, direction of extended routing is set (Step 914); by referring to the extension information, an area for extended routing for the terminal is determined (such an area is called maximum/minimum distance)(Step 915); connectors are routed in that area (Step 917); and vias are created at the end of the connectors (Step 918).

Figures 33, 34:
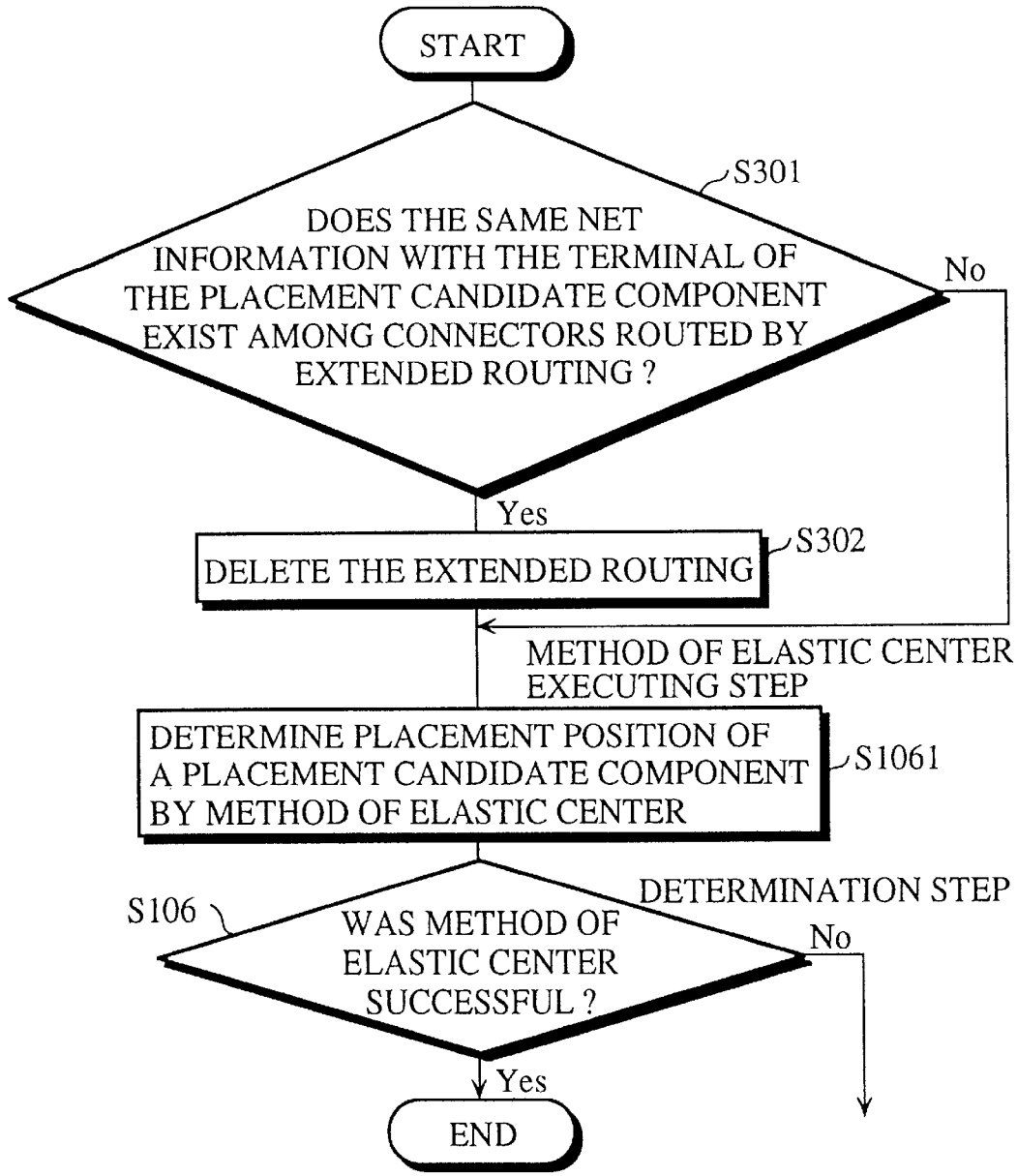
FIG. 33 is a sub-flowchart for Step 206 in FIG. 9 of the sixth embodiment.
FIG. 34 is an example of extension information.

Extension information shows how extended routing of each connector should be implemented. An example is shown in FIG. 34. Extension information is inputted when interactive edit mode is selected during circuit design or packaging design.

Step 206 in FIG. 9 is composed of the following steps, which are shown in FIG. 33: microprocessor 6 examines connectors routed by extended routing and determined whether the same net information with the net information including the terminal of the placement candidate component exists (Step 301); and if so, the extended routing is deleted (step 302).

FIG. 35 shows how a placement area is reserved. Circuit boards, components, connectors, and vias are represented in the same manner as shown in FIG. 8. How packaging is implemented on the circuit board can be explained as follows.

Microprocessor 6 sets terminals 1010 to 1017 of component 1000, which are not used for routing connectors yet, as starting points (Step 913 in FIG. 32). After that, microprocessor 6 sets direction of extended routing by referring to the extension information from these starting points (Step 914), and determines an area in which extended routing is implemented (Step 915). Here, supposing extension information about terminals 1010 to 1013 is set as shown in FIG. 34, microprocessor 6 routes 0.03 mm connectors from terminals 1010–1013 to the right (Step 917), and creates vias at the end of the connectors (Step 918). Microprocessor 6 repeats the same processing to terminals 1014 to 1017, the result being shown in FIG. 35A.

Figures 35A, 35B:
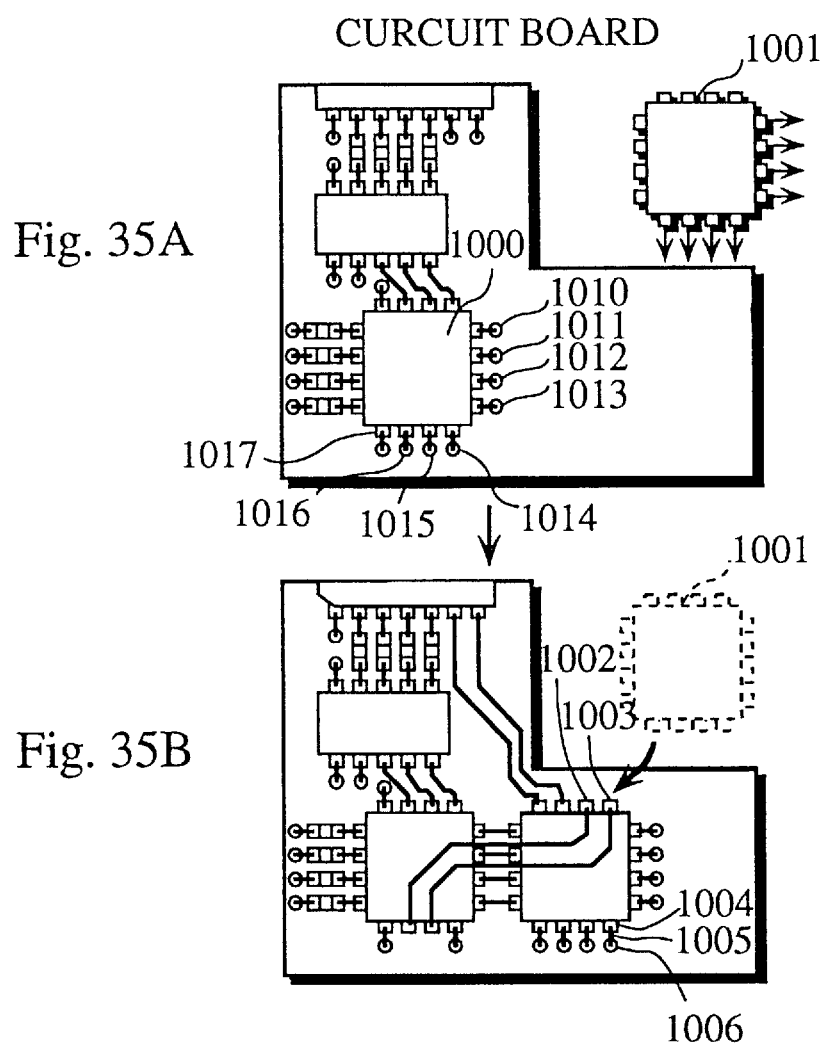
FIG. 35A shows how a placement area of the sixth embodiment is reserved.
FIG. 35B shows how a placement area of the sixth embodiment is reserved.

Next, placement candidate component 1001 is selected. Microprocessor 6 examines connectors routed by extended routing and determines whether the same net information with the net information including the terminals of placement candidate component 1001 (Step 301). As terminals 1010 to 1013, 1015, and 1016 in FIG. 35A are included in the same net information, microprocessor 6 deletes their connectors from the circuit board (Step 302).

After increasing space areas by such deletion, microprocessor 6 places placement candidate component 1001.

According to the present embodiment, a placement position is reserved by extended routing for the next component, so the placement position will never be occupied by other components.

The present embodiment can be modified as long as main points are not changed. For example, after evacuating obstacle connectors and obstacle components in the second embodiment, processing of the present embodiment can be implemented. Or, after connectors are routed in the present embodiment, connector shortening in the fourth embodiment can be implemented. If circuit board area becomes insufficient, enlargement processing of the third embodiment can be implemented.

Seventh Embodiment

Figure 36:
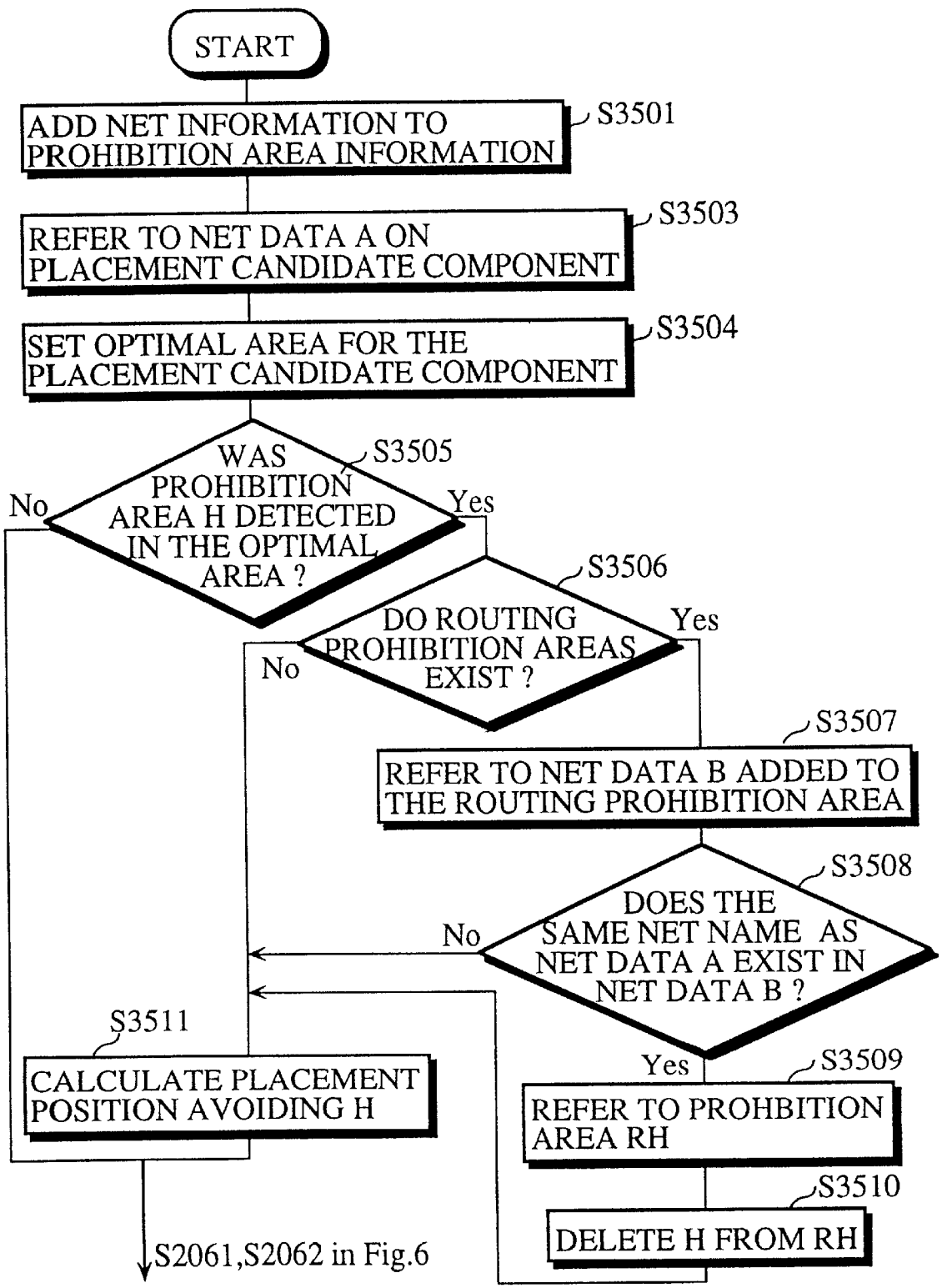
FIG. 36 is a sub-flowchart for Step 206 in Fig.9 of a seventh embodiment.

In a seventh embodiment, a power circuit and the like are to be packaged. When a lot of chip components like resistance, condenser are packaged, areas occupied by connectors in a prohibition area is cut down. Step 206 in FIG. 9 is composed of the following steps, which are shown in FIG. 36: net name is added to prohibition area information on areas occupied by connectors in a prohibition area on a circuit board (Step 3501); net information (net data A) on a placement candidate component is referred to (Step 3503); an optimal area (placement potential position) for the placement candidate component which overlaps with the prohibition area is set (Step 3504); it is determined whether prohibition area H which overlaps with the placement potential position exists (Step 3505); if prohibition area H exists, it is determined whether routing prohibition area, which is occupied by connectors in prohibition area H exists (Step 3506); if the routing prohibition area exists, net data (net data B in FIG. 36) added to the routing prohibition area is referred to (Step 3507); it is determined whether the same net name as net data A exists in the referred net data B (Step 3508); if it exists, prohibition area RH which is occupied by connectors of network B is referred to (Step 3509); only prohibition area RH is deleted from prohibition area H (Step 3510); and a placement position of the placement candidate component which avoids only prohibition area H is calculated (Step 3511). Steps 2061 and 2062 in FIG. 9 are implemented after Steps 3501 to 3511.

<Addition of Net Name>

Figure 37:
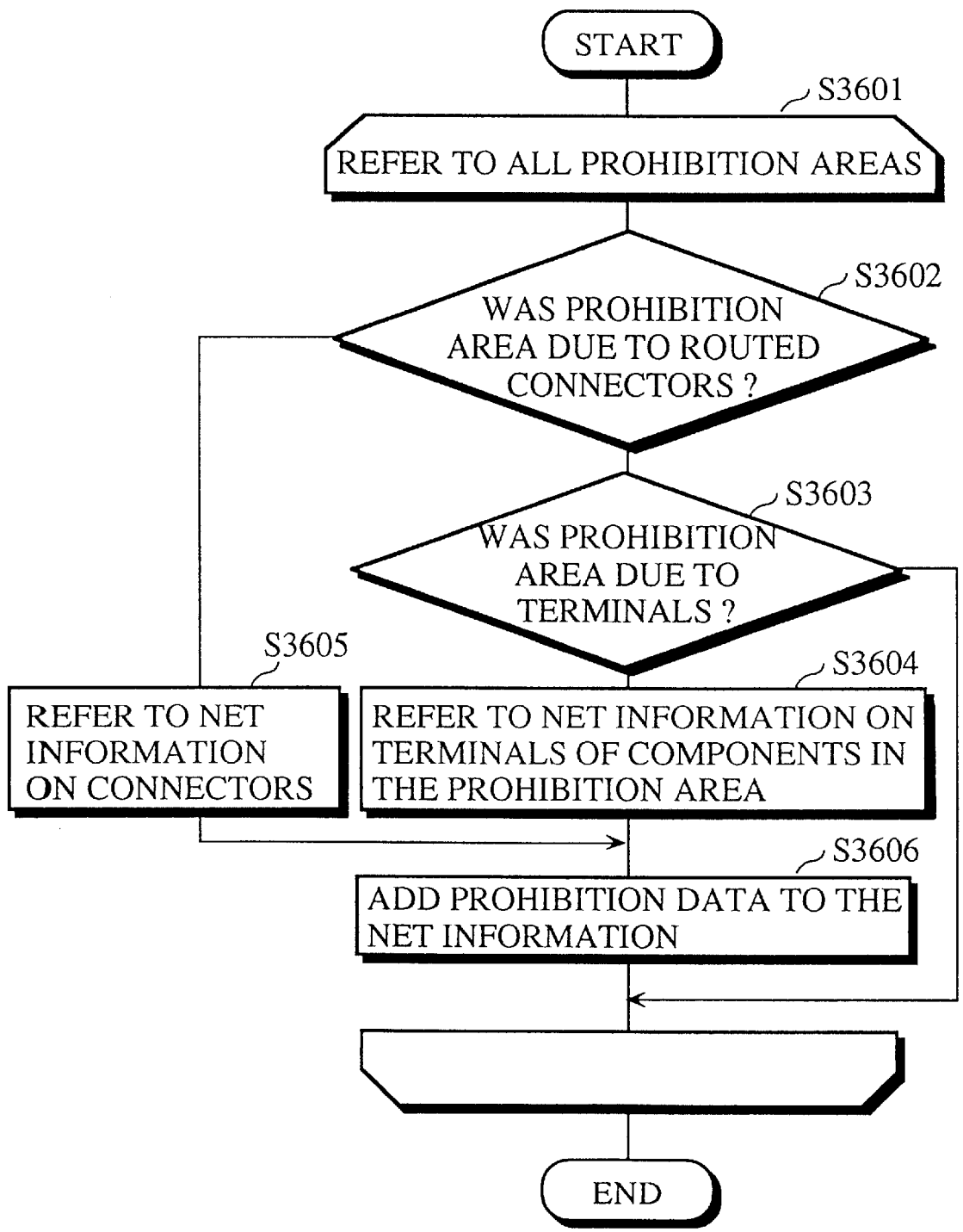
FIG. 37 is a sub-flowchart for Step 3501 in FIG. 36 of the seventh embodiment.

Step 3501 in FIG. 36 is composed of the following steps, which are shown in FIG. 37: one prohibition area on a circuit board is fetched and determined whether it is created by the already routed connectors (Step 3602); if so, net information on the already routed connectors is referred to (Step 3604); it is determined whether the fetched prohibition area is created by the terminals of already placed components (Step 3603); if so, net name on their connectors are referred to (Step 3605); and it is added to the prohibition area information on the prohibition area (Step 3606). A loop of the above steps is repeated for all prohibition areas on a circuit board.

FIG. 38 is an example of the prohibition area information to which a net name is added by the above processing. The present information is inputted when interactive edit mode is selected during circuit design or packaging design. The present information is stored in storage device 1 as a file, read out to a various work buffer area and used.

Figure 39A:
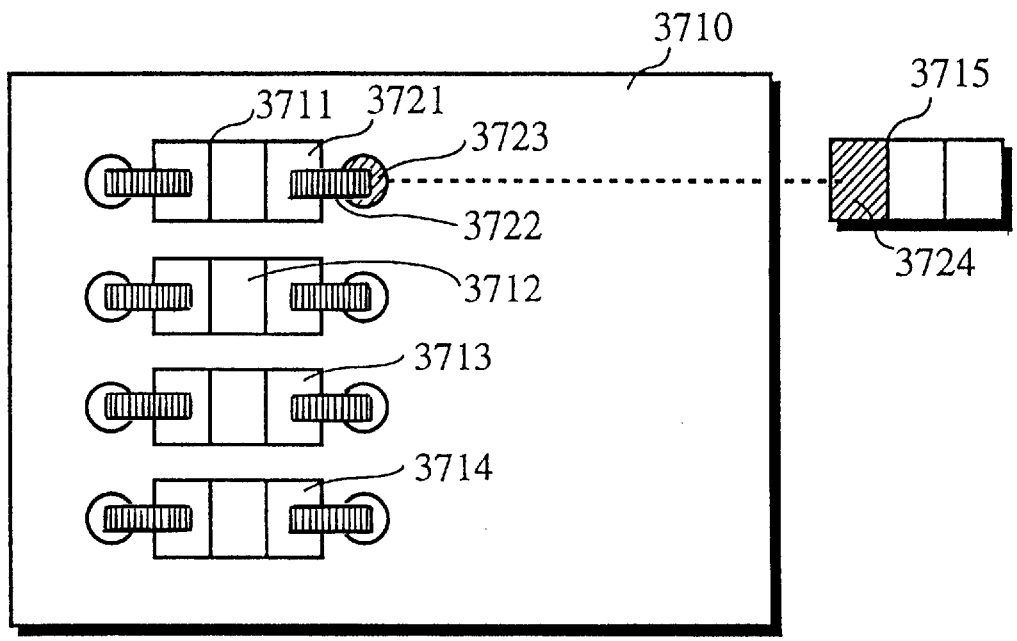
FIG. 39A shows how a prohibition area is cut down when placement candidate component is placed.
Figure 39B:
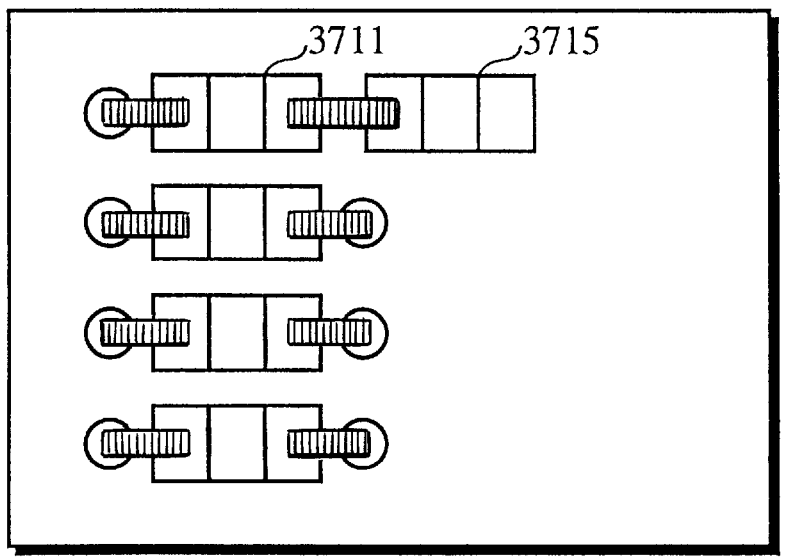
FIG. 39B shows how a prohibition area is cut down when placement candidate component is placed.

FIG. 39 shows how a prohibition area is cut down when a placement candidate component is placed.

Circuit boards, components, connectors, and vias are represented in the same manner as shown in FIG. 8. In FIG. 39A, reference figure 3710 represents a part of a circuit board. Components 3711 to 3714 are already placed on the circuit board, and extended routing is implemented for each. The thick black lines represent connectors and circles represent vias. Component 3715 is not placed yet, and it is connected with component 3711, their connector being represented by a broken line. Prohibition area 3722 created by foil and prohibition area 3723 created by a vias exist. Prohibition area 3723 has the same net as terminal 3724, which is shaded in FIG. 39A.

How packaging on a circuit board is implemented can be explained as follows.

Microprocessor 6 adds a net name to prohibition area information on a place occupied by connectors in a prohibition area on a circuit board (Step 3501).

Here, transition from FIG. 36 to FIG. 37 takes place. When a prohibition area does not exist, microprocessor 6 places a placement candidate component.

Microprocessor 6 fetches one prohibition area Ki (i=0,1, 2,3,4,5 . . . ) on the circuit board and determines whether prohibition area Ki is created by the already routed connectors (Step 3602). If so, microprocessor 6 refers to net information on the connector (Step 3605). Microprocessor 6 determines whether the fetched prohibition area Ki is created by terminals of the components, which are already used for routing (Step 3603). If so, microprocessor 6 refers to net name on connecters of the terminals (Step 3604), and adds the referred net name to the prohibition area information on the prohibition area. Microprocessor 6 repeats above processing to all prohibition areas on the circuit board, and completes adding net names (Step 3601).

Then, transition from FIG. 37 to FIG. 36 takes place.

Microprocessor 6 refers to net information on placement candidate component 3715 (Step 3503), and sets an optimal area for placing placement candidate component 3715 (placement potential position) (Step 3504). Microprocessor 6 determines whether routing prohibition area occupied by connectors in prohibition area H which overlaps with a placement potential position exists (Steps 3505 and 3506). Here, microprocessor 6 determines prohibition area 3722 created by an already routed connector and prohibited area 3723 created by a via as a placement prohibition areas. After that, microprocessor 6 refers to net data added to the routing prohibition area (Step 3507). As reference FIG. 3711 represents resistance, net data B37, which shows its own connection, is referred to. Next, microprocessor 6 examines net data on a placement candidate component and determines whether net data which has the same net name with net data B37 exists (Step 3508). As terminal 3724 is designated as a terminal which should be connected with net data B37, microprocessor 6 refers to prohibition areas 3722 and 3723 which are occupied by net data B37 (Step 3609) and deletes only prohibition areas 3722 and 3723 from prohibition area H (Step 3510). Microprocessor 6 calculates a placement position of the placement candidate component, avoiding prohibition area H (Step 3511), and places placement candidate component at the placement position (Steps 2061 and 2062 in FIG. 9).

According to the present embodiment, components are placed with high density by cutting back a prohibited area, and length of connectors between components can be shortened.

The present embodiment can be modified unless main points are not changed. It is possible to implement processing of the present embodiment after evacuating obstacle connectors and obstacle components in the second embodiment. Or it is possible to implement shortening of connectors in the fourth embodiment after the connector routing of the present embodiment. Or it is also possible to implement enlargement processing of a circuit board area in the third embodiment if the circuit board area becomes insufficient in the present embodiment.

Eighth Embodiment

In the eighth embodiment, if a placement position of a placement candidate component is already occupied by connectors, the placement position can be reserved by detouring or re-routing the obstacle connectors. Step 206 in FIG. 9 is constituted by a sub-flowchart in FIG. 40 or FIG. 41.

Figure 40:
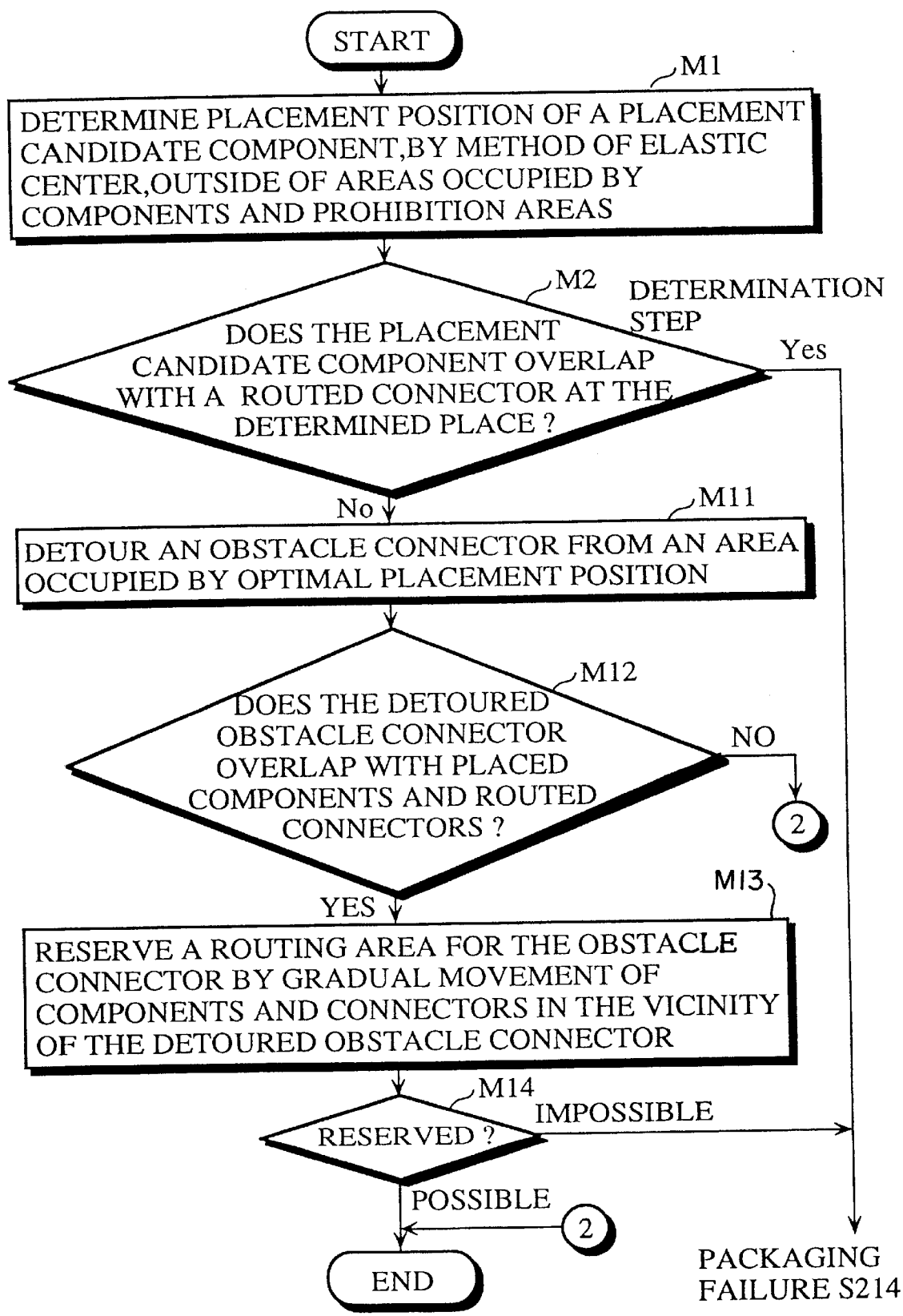
FIG. 40 is a sub-flowchart for Step 206 in FIG. 9 of an eighth embodiment.

According to FIG. 40, a space area for placing a component can be reserved by detouring routing paths onto routed connectors. FIG. 40 is composed of the following steps: an optimal placement position of a placement candidate component is determined, by method of elastic center, outside of areas occupied by components and prohibition areas (M1); it is determined whether the placement candidate component overlaps with routed connectors at the determined place (M2); obstacle connectors are detoured from an area occupied by optimal placement position (M11); it is determined whether the detoured obstacle connectors overlap with components and connectors (M12); a routing area for the obstacle connectors is reserved by gradually moving components and connectors in the vicinity of the detoured obstacle connectors (M13); and it is determined whether the routing area can be reserved (M14).

FIGS. 17A to 17C show how a placement area is reserved by detouring routing paths. Component 3101 is set as a placement candidate component. Broken likes represent tension, based on which method of elastic center is implemented. In FIG. 17A, connectors 3112 to 3115 are obstacle connectors, and in FIG. 17B, areas represented by broken lines is an optimal placement position for component 3101.

How packaging on a circuit board is implemented can be explained as follows.

Components 3102 to 3107 are already placed on a circuit board, and microprocessor 6 has selected component 3101 as a placement candidate component. Microprocessor 6 determines placement position of placement candidate component 3101, by method of elastic center, outside of areas occupied by components and prohibition areas (M1), and determines whether placement candidate component 3101 overlaps with routed connectors at the determined place (M2). Here, a part which is represented by reference figure 3111 in FIG. 17A is determined as a placement position. If it is determined that the placement position overlaps with connectors 3112 to 3115, these connectors are determined as obstacle connectors.

Then, microprocessor 6 creates "]" shaped detouring path at a part which overlaps with optimal placement position of the obstacle connector in order to avoid areas occupied by the optimal placement position (M11). When a placement area of a placement candidate component is reserved in the above way, which is shown in FIG. 17C, microprocessor 6 completes processing.

After that, microprocessor 6 determines whether the detoured obstacle connectors overlap with components and connectors (M12). If so, microprocessor 6 reserves a routing area for obstacle connectors by gradually moving components and connectors in the vicinity of the detoured connectors (M13). Then, microprocessor 6 places placement candidate component 3101 at optimal placement position 3111 and completes processing (M14).

If a placement area cannot be reserved (M14), microprocessor 6 makes high resolution display 2 display failure of packaging (Step 214 in FIG. 9).

Figure 41:
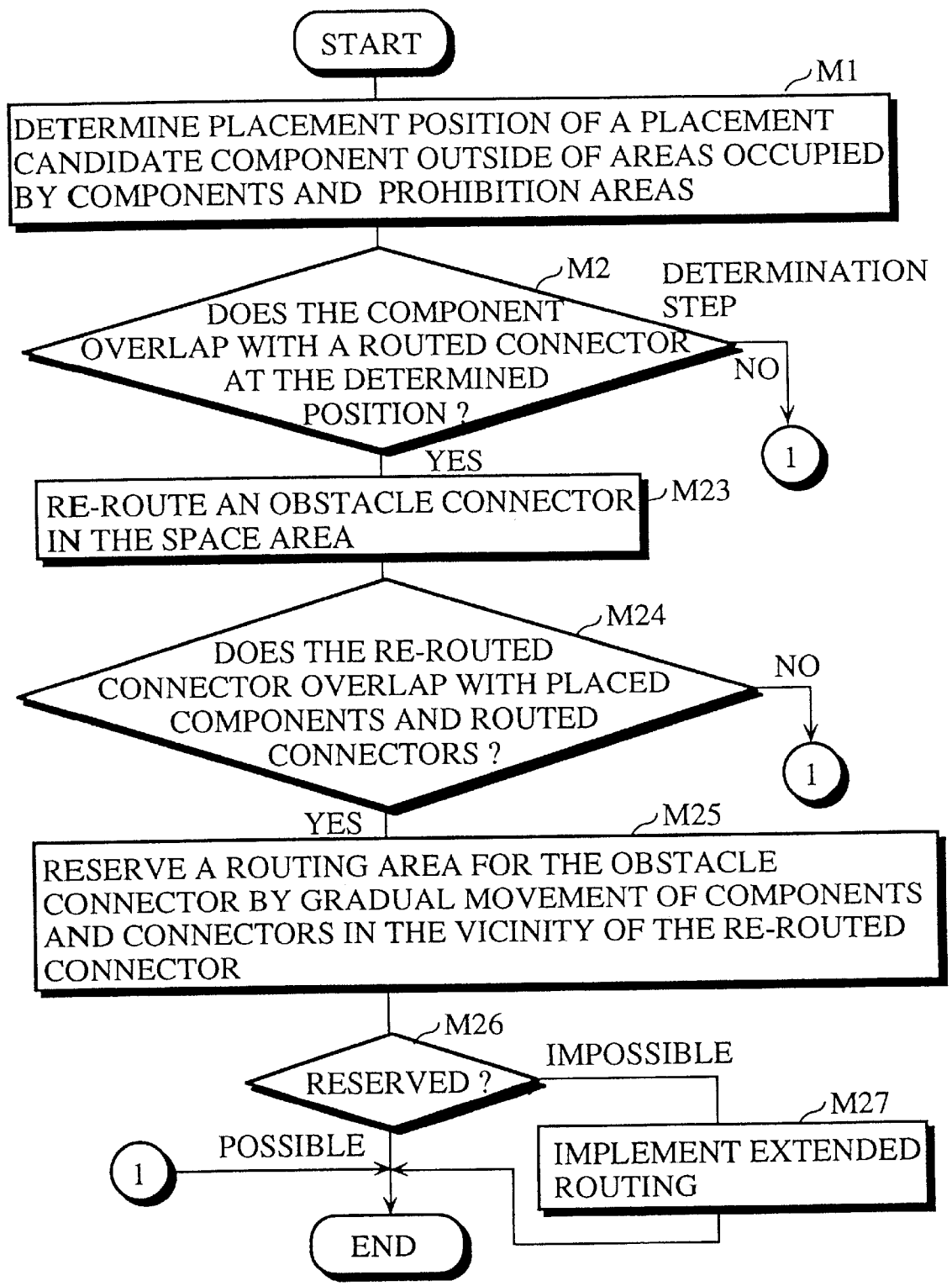
FIG. 41 is a sub-flowchart for Step 206 in FIG. 9 of the eighth embodiment.

<Sub-Flowchart in FIG. 41>

In FIG. 41, obstacle connectors are re-routed and a placement candidate component is placed in an optimal placement area. The sub-flowchart in FIG. 41 is composed of the following steps: by method of elastic center, optimal placement position of a placement candidate component is determined outside of areas occupied by component and prohibition areas (M1); it is determined whether the component overlaps with a connectors at the determined position (M2); space areas are searched for and the obstacle connectors are re-routed in the space area (M23); it is determined whether the re-routed connectors overlap with components and connectors (M24); if they overlap, a routing area for the obstacle connectors is reserved by gradually moving components and connectors in the vicinity of the re-routed connectors (M25); it is determined whether a routing area was reserved by processing of M25 (M 26); when re-routing of connectors is impossible on the current packaging surface, extended routing is implemented (Step 27).

Figure 42A:
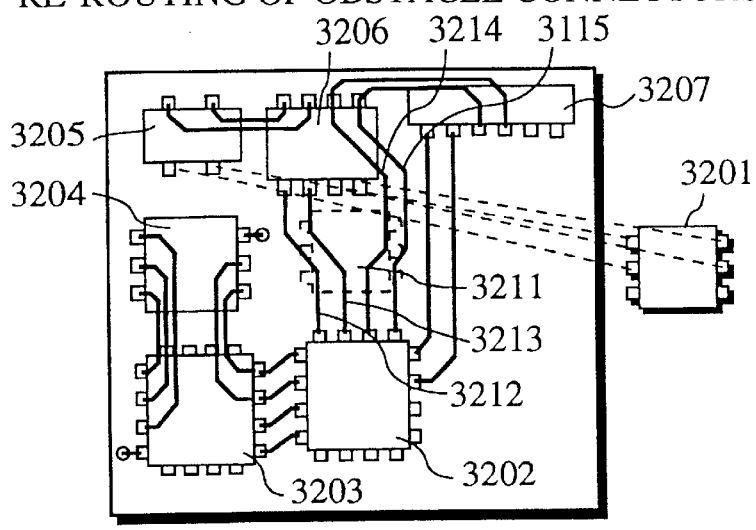
FIGS. 42A to 42D show how an optimal placement area is reserved by re-routing connectors.
Figure 42B:
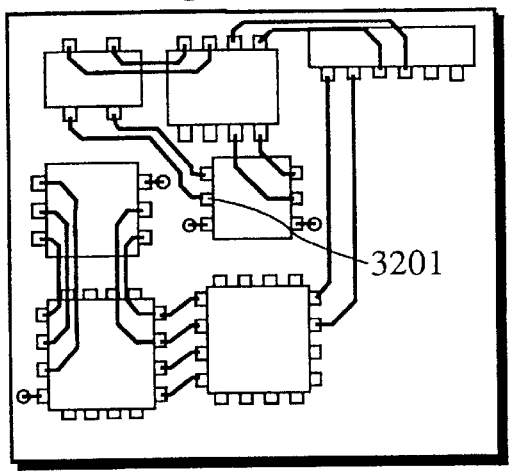

FIGS. 42A to 42D show how an optimal placement area is reserved. Component 3101 is set as a placement candidate component. Broken lines represent tension, based on which method of elastic center is implemented. In FIG. 42A, connectors 3214 and 3215 are obstacle connectors. In FIG. 42B, an area represented by broken lines is an optimal placement position.

How packaging on a circuit board is implemented can be explained as follows.

Components 3202 to 3207 are already placed on a circuit board. Microprocessor 6 has selected component 3201 as a placement candidate component. Microprocessor 6 determines a placement position of placement candidate component 3201 outside of the areas occupied by components and prohibition areas (M1), and determines whether the placement candidate component overlaps with connectors at the determined position (M2). Here, a part which is represented by reference figure 3211 in FIG. 42 is determined as a placement position, and if the placement candidate component overlaps with connectors 3212 to 3215, microprocessor 6 sets connectors 3212 to 3215 as obstacle connectors (M2), and places placement candidate component 3201 as shown in FIG. 42B. After that, microprocessor 6 searches for a space area on the circuit board and re-routes connectors 3212 to 3215 (M23).

Then microprocessor 6 determines whether the re-routed connectors overlap with components and connectors (M24). If they overlap, microprocessor 6 reserves a routing area for obstacle connectors by gradually moving components and connectors in the vicinity of the re-routed connectors as shown in FIG. 42D (M25). Microprocessor 6 determines whether a routing area was reserved (M26), and if it was reserved, completes processing.

Figure 42C:
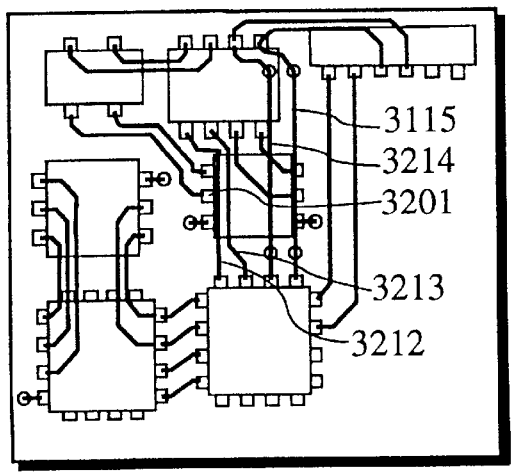
Figure 42D:
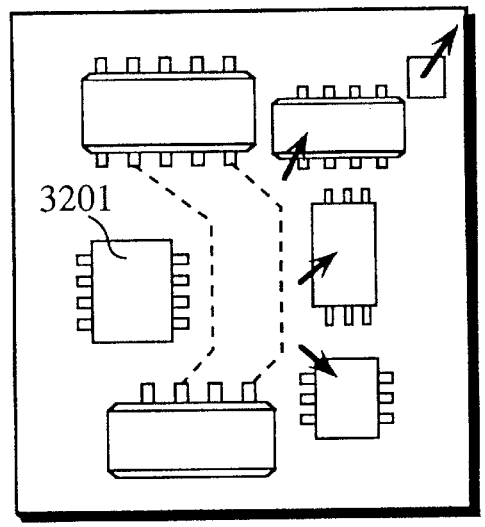

If a placement area cannot be reserved, microprocessor 6 creates vias as shown in FIG. 42C and implements extended routing (M27).

According to the present embodiment, obstacle connectors are detoured so even if a space area cannot be reserved, components can be placed, which enhances probability of success of packaging. In other words, as failure of packaging is determined after detouring obstacle connectors, probability of failure of packaging can be reduced.

Also, connectors are re-routed in a space area which was searched for, so even if a space area cannot be reserved, components can be placed, which enhances probability of success of packaging. In other words, as failure of packaging is determined after detouring obstacle connectors, probability of failure can be reduced.

The present embodiment can be modified as long as main points are not changed. For example, it is possible to implement shortening of connectors in the fourth embodiment after routing connectors in the present embodiment. Or if circuit board area becomes insufficient in the present embodiment, it is possible to implement enlargement processing of the circuit board area in the third embodiment.

Ninth Embodiment

In the ninth embodiment, if connectors cannot be routed, obstacle components are moved so that an area for routing connectors can be reserved. Step 207 in FIG. 9 is constructed by sub-flowchart in FIGS. 43 and 44.

Figure 43:
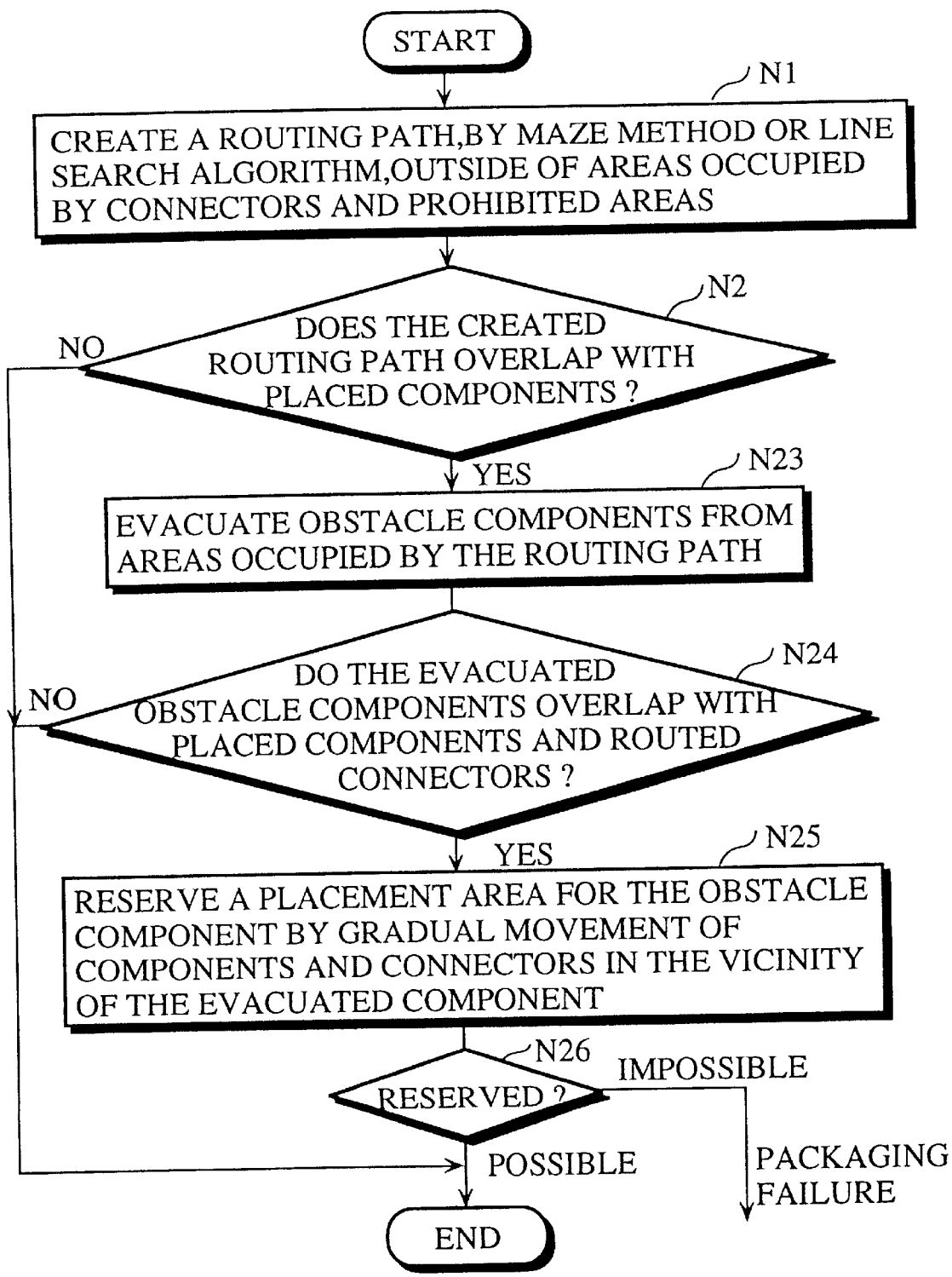
FIG. 43 is a sub-flowchart for Step 406 in FIG. 10 of a ninth embodiment.

<Sub-Flowchart in FIG. 43>

According to a sub-flowchart in FIG. 43, an area for routing connectors can be reserved by moving placed components. The sub-flowchart in FIG. 43 is composed of the following steps: a routing path is created, by maze method or line search algorithm, outside of areas occupied by connectors and prohibited areas (N1); it is determined whether the created routing path overlaps with a placed component (obstacle component) (N2); the obstacle component is evacuated from the area occupied by the routing path (N23); it is determined whether the evacuated obstacle component overlaps with a placed component and routed connectors (N24); if so, a placement area for the obstacle component is reserved by gradually moving components and connectors in the vicinity of the evacuated component (N25); and it is determined whether a placement area can be reserved (N26).

FIGS. 19A to 19C show how a routing area can be reserved by moving a placed component. Component 2702 is set as a placement candidate component. Broken lines represent routing paths created in N1. A shaded component in FIG. 19A is obstacle component 2701 determined in N2.

Shaded area 2712 in FIG. 19B is an area occupied by routing paths determined in N1.

How packaging is implemented can be explained as follows.

Microprocessor 6 has already placed components 2701, 2704 to 2708, and placement candidate component 2702 on a circuit board as shown in FIG. 19A. Microprocessor 6 creates, by means of maze method or line search algorithm, routing path 2711 outside of areas occupied by routed connectors and prohibition areas (N1), and determines whether the created routing paths overlap with a placed component (N2).

It is determined that obstacle component 2701 overlaps with the created routing path (N2). Microprocessor 6 evacuates obstacle component 2701 from an area occupied by an optimal routing path (N23). After that, microprocessor 6 determines whether the evacuated obstacle component 2701 overlaps with a placed component and routed connectors (N24). If they don't overlap, microprocessor 6 completes processing.

If they overlap, microprocessor 6 reserves a placement area for the obstacle component by gradually moving components and connectors in the vicinity of the evacuated component, which is shown in FIG. 20 (N25). When a placement area is reserved by such processing (N26), microprocessor 6 completes processing.

If a placement area cannot be reserved, microprocessor 6 makes high resolution display 2 display failure of packaging (Step 214 in FIG. 9).

Figure 44:
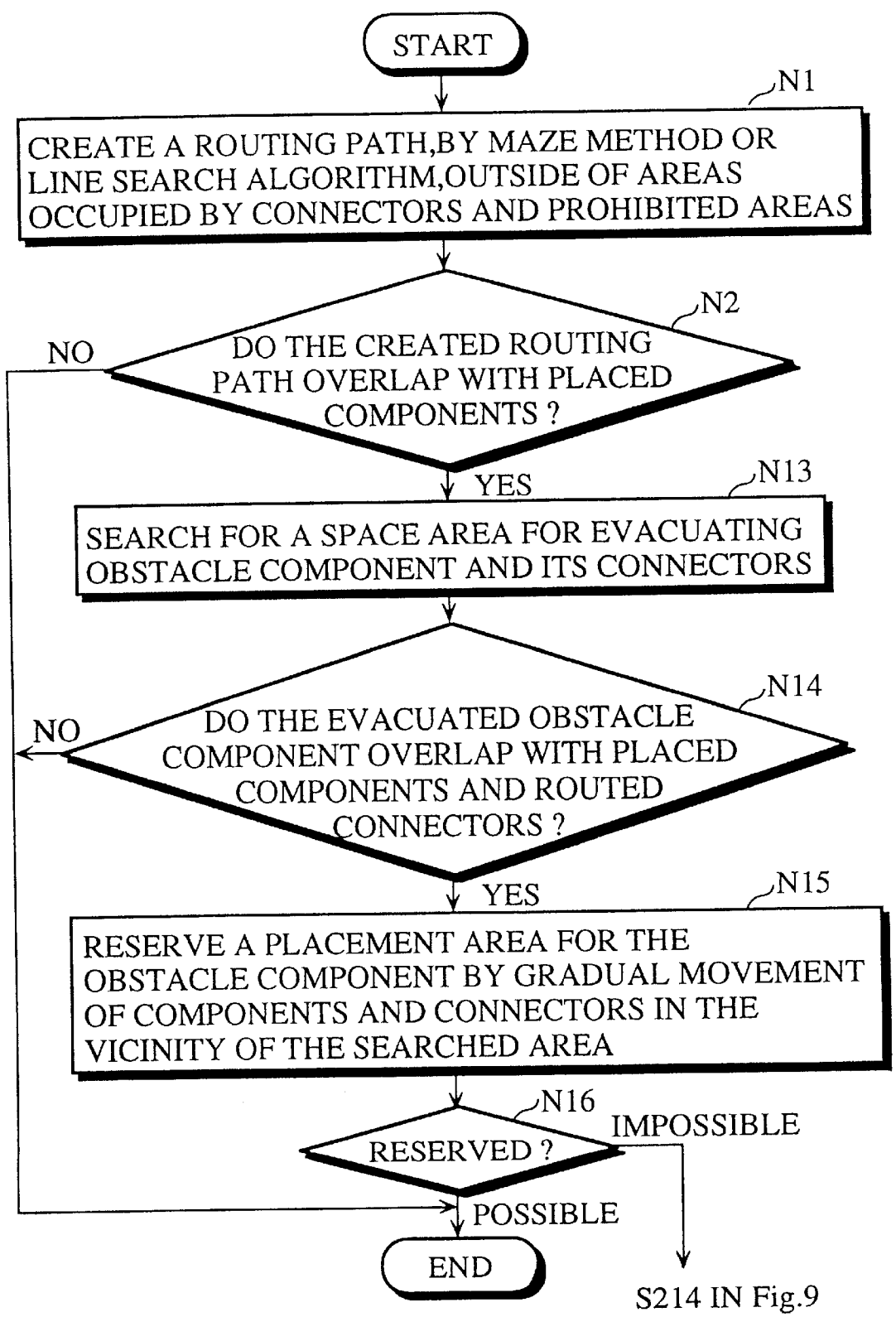
FIG. 44 is a sub-flowchart for Step 406 in FIG. 10 of the ninth embodiment.

<Sub-flowchart in FIG. 44>

According to a sub-flowchart in FIG. 44, an obstacle component is re-placed so that an area for routing connectors can be reserved. The sub-flowchart in FIG. 44 is composed of the following steps: a routing path is created, by maze method or line search algorithm, outside of areas occupied by connectors and prohibited areas (N1); it is determined whether the routing path overlaps with placed components (obstacle components) (N2); a space area for evacuating the obstacle component and its connectors is searched for (N13); it is determined whether the evacuated obstacle component overlaps with a placed component and routed connectors (N14); if so, a placement area for the obstacle component is reserved by gradually moving components and connectors in the vicinity of the searched areas (N15); and it is determined whether a placement area can be reserved (N16).

Figure 45:
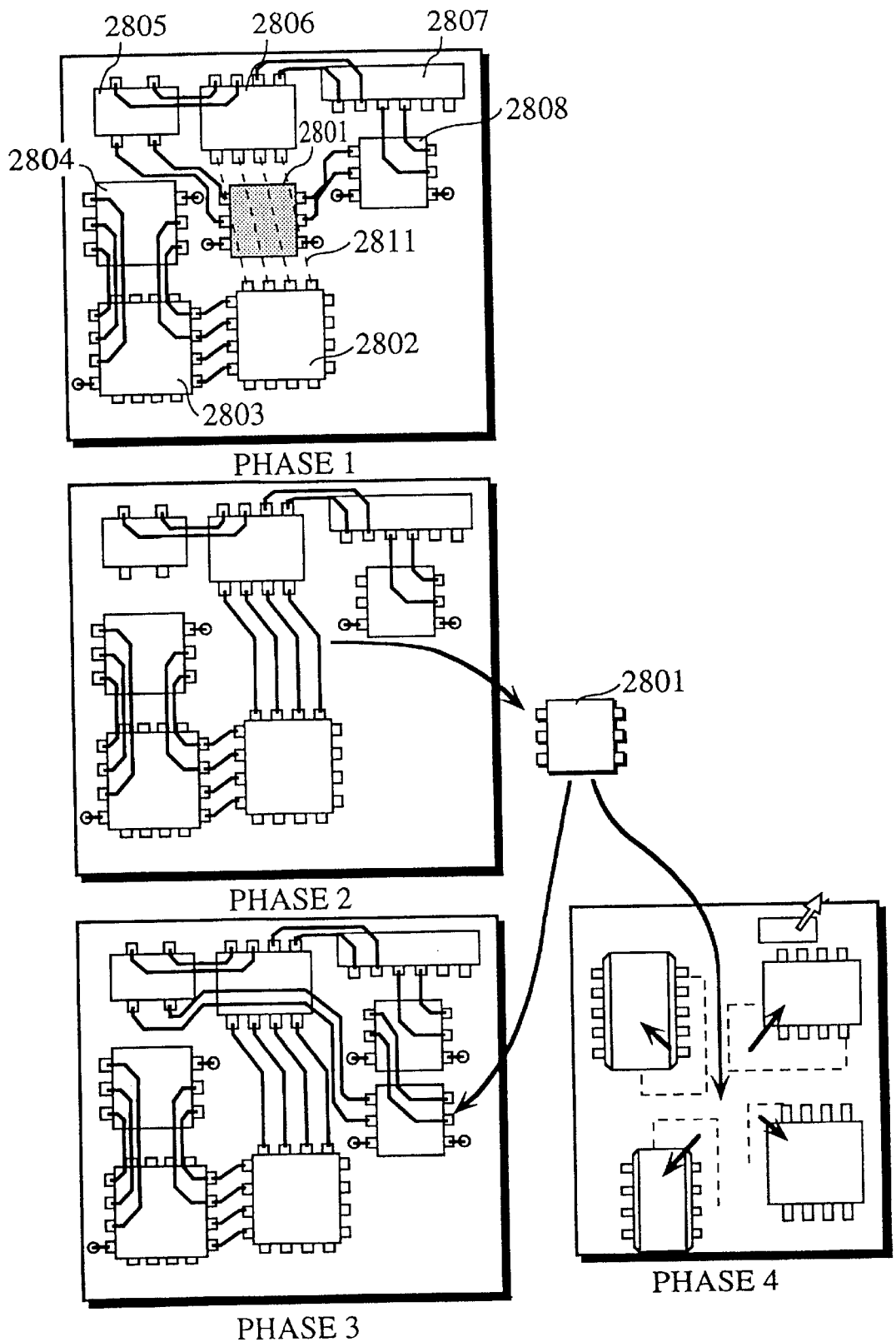
FIG. 45 shows how a placement area can be reserved by re-searching for a placement position.

FIG. 45 shows how a routing area is reserved by re-placing components and re-routing connectors according to the flowchart in FIG. 44. Component 2802 is set as a placement candidate component. Broken lines represent optimal routing paths 2811 created in N1. A shaded component in phase 1 represents obstacle component 2801 determined in N2. Obstacle component 2801 is on a circuit board in phase 1, out of the circuit board in phase 2, and back again on the circuit board in phase 3. This means that obstacle component 2801 is stripped from the circuit board, its placement position is searched for in N13, and its re-placement position is determined.

How packaging is implemented can be explained as follows.

Microprocessor 6 has already placed components 2801, 2803 to 2708, and placement candidate component 2802 on a circuit board, as shown in phase 1 in FIG. 45. Microprocessor 6 creates, by means of maze method or line search algorithm, routing paths 2811 outside of areas occupied by routed connectors and prohibition areas (N1 in FIG. 44), and determines whether the routing path 2811 overlap with placed components (N2).

As they overlap, microprocessor 6 searches for a space area for evacuating of obstacle component 2801 and its connectors (N13).

After that, microprocessor 6 determines whether obstacle component 2801 and its connectors overlap with a placed component and routed connectors in the area which was searched for (N14). If so, microprocessor 6 reserves a placement area for an obstacle component by gradually moving components and connectors in the vicinity of the area which was searched for (N15). When a placement area is reserved by such processing (N16), microprocessor 6 completes processing.

If a placement area cannot be reserved (N16), microprocessor 6 makes high resolution display 2 display failure of packaging (Step 214 in FIG. 9).

According to the present embodiment, an obstacle component is evacuated after that is determined possible or not, so even if a space area cannot be reserved, connectors can be routed on a circuit board, which enhances probability of success of packaging. In other words, as failure of packaging is determined after evacuating obstacle components, probability of failure of packaging can be reduced.

The present embodiment can be modified as long as main points are not changed. It is possible to implement shortening of routed connectors, which is in the fourth embodiment. If a circuit board area becomes insufficient, it is possible to implement enlargement processing of the circuit board area, which is in the third embodiment.

Tenth Embodiment

In the tenth embodiment, it is determined which function block in a schematic circuit diagram includes a component selected as a placement candidate component. If the placement candidate component and its connectors cannot be contained in the function block, a circuit board area assigned to that function block is enlarged.

After that, packaging is implemented in the enlarged function block. Therefore, Steps 206 to 208 in FIG. 9 can be replaced with T1 to T6 in FIG. 46.

Figure 46:
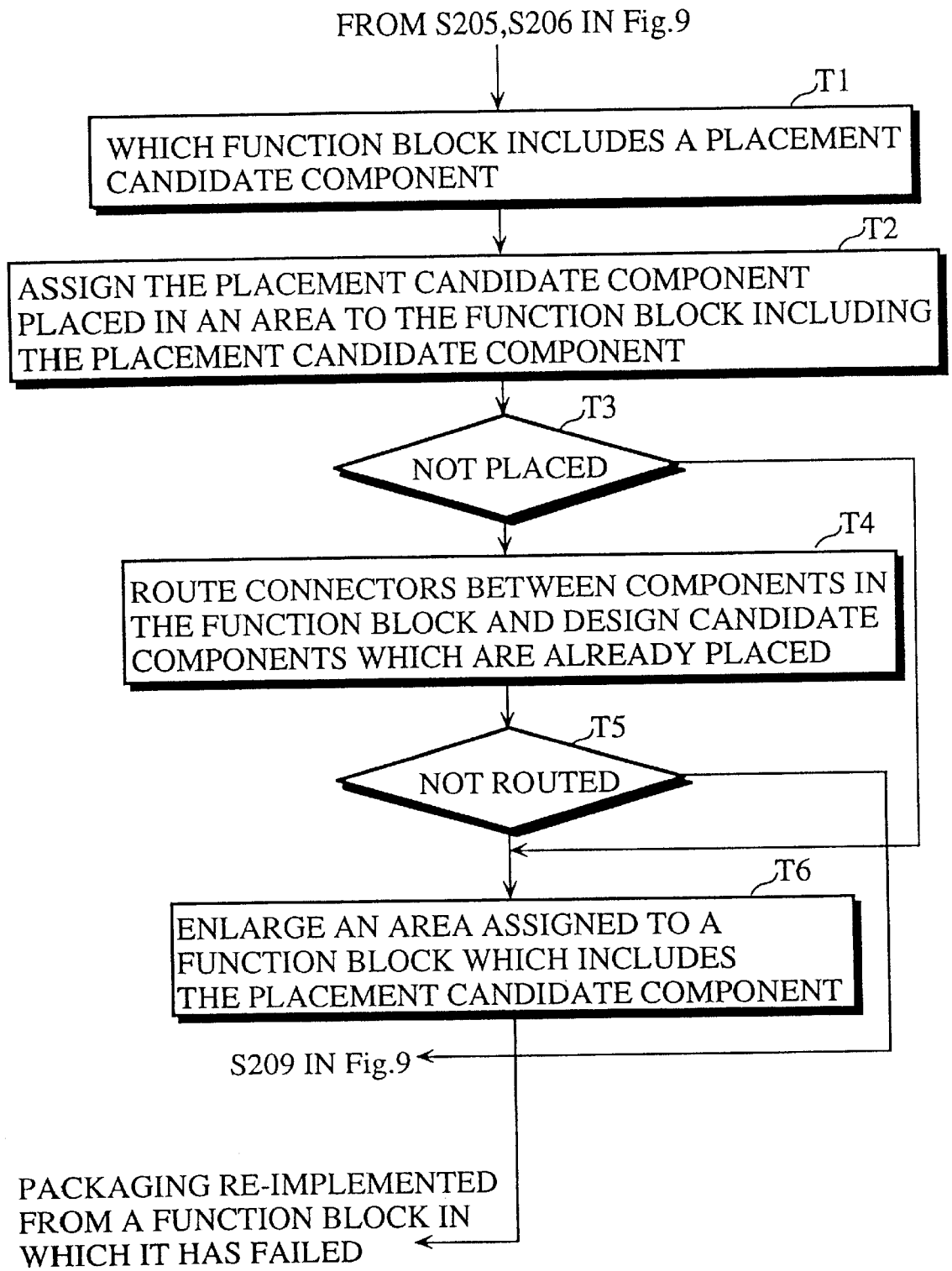
FIG. 46 shows steps which should be added to FIG. 9 in the tenth embodiment.

FIG. 46 shows a main flowchart for a printed circuit board CAD device of the tenth embodiment. The flowchart is composed of the following steps: it is determined which function block includes a placement target component (T1); a placement candidate component is placed in an area assigned to the function block which includes the placement candidate component (T2); it is determined whether the placement candidate component was placed (T3); connectors are routed between components income function block and design candidate components which are already placed (T4); it is determined whether connectors are routed (T5); and an area assigned to the function block which includes the placement candidate component is enlarged (T6). A loop of above mentioned steps are repeated to all components.

Function block information describes which function block includes a placement candidate component and which area on a circuit board is assigned to each function block. An example is shown in FIG. 47B.

Function block information is composed of: a function block name; component numbers of a component included in the function block in the schematic circuit diagram; and assignment information describing which function block is assigned to which area on the circuit board.

The function block information is inputted when interactive edit mode is selected during circuit board design or packaging design. The function block information is stored in storage device 1 as a file, read out to a various work buffer and used.

How packaging on a circuit board is implemented can be explained as follows.

Microprocessor 6 determines which function block includes a placement candidate component (T1 in FIG. 46), places the placement candidate component in an area assigned to the function block which includes the placement candidate component (T2), and determines whether the placement candidate component was placed (T3). After enlargement, components IC11, IC12, and IC13 are placed in order. When the last component IC14 is about to be placed, microprocessor 6 determines function block 1 includes component IC14. Then, microprocessor 6 places component IC14 in an area assigned to function block 1, which can be designated by (0, 0), (0, 40), (70, 40), and (70, 40) on the circuit board. Microprocessor 6 routes connectors, in function block 1, between the placement candidate component and an design candidate component which is already placed (T4), and determines whether connectors are routed (T5). As connectors are routed, microprocessor 6 sets the next component as a placement candidate component.

The above mentioned processing is applied to function blocks 1 through 5. When the last component IC54 of function block 5 is about to be placed, microprocessor 6 determines function block 5 includes component IC54. Then, microprocessor 6 places component IC54 in an area assigned to function block 1, which can be designated by (0, 80), (0, 120), (70, 80), and (70, 120) on the circuit board. Microprocessor 6 routes connectors, in function block 5, between the placement candidate component and a design candidate component which is already placed (T4), if connectors cannot be contained in the area assigned to function block 5, microprocessor 6 enlarges the area, as shown by K100 in FIG. 47C, and re-implements packaging from function block 5.

According to the present embodiment, packaging is implemented by function block unit. So when a failure of packaging occurs, re-implementation of packaging is carried out within a function block, which increases efficiency of packaging design.

The present embodiment can modified as long as main points are not changed. It is possible to implement processing in the present embodiment after evacuating obstacle components and connectors in the second embodiment. Or it is also possible to implement shortening of connectors in the fourth embodiment after routing connectors in the present embodiment.

Eleventh Embodiment

In an eleventh embodiment, all sides of a circuit board are categorized into two groups: fixed sides; and extensible sides for enlarging a circuit board area.

Figure 48:
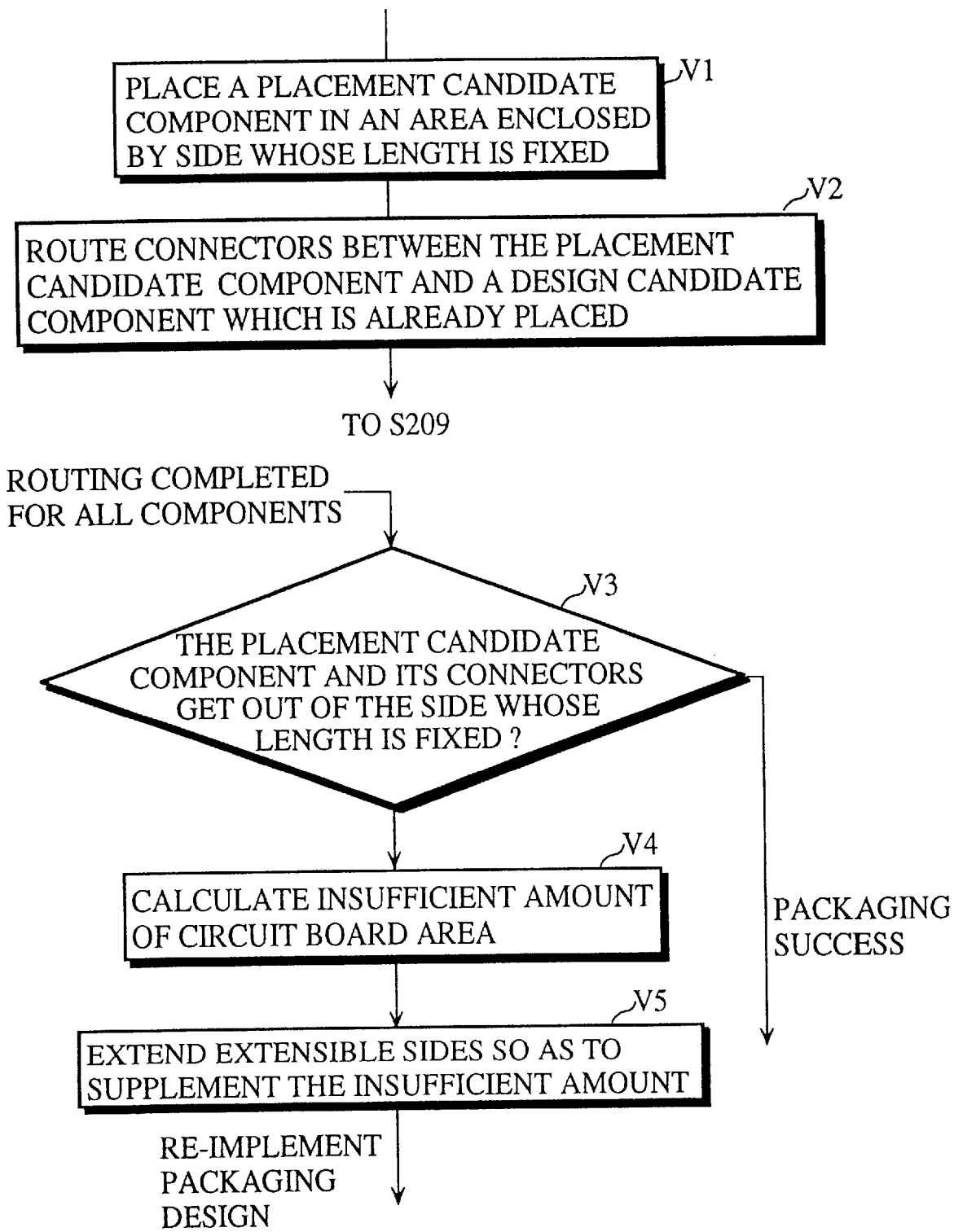
FIG. 48 shows steps which should be added to FIG. 9 in the eleventh embodiment.

FIG. 48 shows a main flowchart for a printed circuit board CAD device of the eleventh embodiment. The following two steps are repeated for all components: a placement candidate component is placed on a circuit board (V1); and connectors are routed between the placement candidate component and a design candidate component which is already placed (V2). After that, it is determined whether the placement candidate component and its connectors are contained on the circuit board (V3); it is calculated how much should an outline of the circuit board should be enlarged (V4); and the circuit board is enlarged by extending sides whose length can be changed (V5).

Which should be fixed sides and which should be extensible sides is set when interactive edit mode is selected during circuit board design or packaging design, stored in storage device 1 as a file, read out to a various work buffer area and used.

Figure 49:
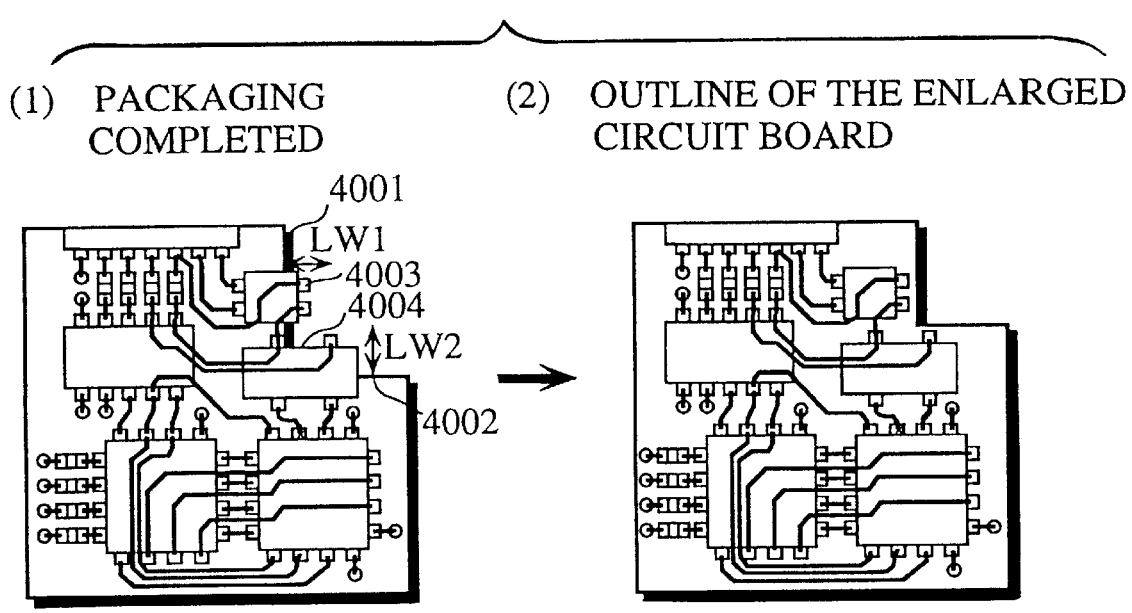
FIG. 49 shows how a circuit board area is enlarged by extending extensible sides.

In FIG. 49, sides 4001 and 4002 are set as extensible sides.

Microprocessor 6 places a placement candidate component on a circuit board (V1), routes connectors between the placement candidate component and a design candidate component which is already placed (V2). Steps V1 and V2 are applied to all components. After that, microprocessor 6 determines whether the placement candidate component and its connectors are contained on the circuit board (V3). In FIG. 49, components 4003 and 4004 are not contained on the circuit board. So microprocessor 6 calculates how much area is insufficient (insufficient distance LW1 and LW2) (V4). Microprocessor 6 recognizes insufficient distance LW1 as enlargement distance of side 4001, and the same thing can be said for insufficient distance LW2. After that, microprocessor 6 extends extensible sides so as to supplement insufficient areas (V5).

According to the present embodiment, even if components and connectors cannot be contained within a circuit board area, outline of the circuit board can be enlarged by extending extensible sides.

The present embodiment can be modified as long as main points are not changed. It is possible to implement processing of the present embodiment after evacuating obstacle connectors and obstacle components in the second embodiment. It is also possible to implement shortening of connectors in the fourth embodiment after connectors are routed in the present embodiment.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A printed circuit board CAD device for determining a placement position of each component and routing paths of connectors between them in a component group in a schematic circuit diagram comprising:

placement order storage means in which placement order included in the component group is stored;

read-out means for reading out, while avoiding any components whose placement positions are already determined, a next component waiting to be read out from the placement order storage means;

occupied area storage means in which occupied area information describing, when the next component is read out by the read-out means, an area occupied by a component whose placement position is already determined and connectors whose routing paths area are already determined on a circuit board is stored;

placement position determination means for determining a placement position of a latest component read out by the read-out means, while avoiding the occupied area on the circuit board by referring to the occupied area information already stored in the occupied area storage means;

routing path determination means for determining, during a period starting from a point when the placement position of the latest component is determined by the placement position determination means to a point when a placement position of the next component is determined by the placement position determination means, routing paths of connectors between terminals of the latest component and terminals of a component whose placement position is already determined, avoiding the occupied area on the circuit board by referring to the occupied area information already stored in the occupied area storage means;

write-in means for writing, when the routing paths of the connectors are determined, occupied area information describing an area occupied by the component whose placement position is already determined and by the connectors whose routing paths are already determined in a space area of the occupied area storage means; and instruction means for instructing, when the occupied area information, describing the area occupied by the component whose placement position is already determined and by the connectors whose routing paths are already determined, is written in the space area of the occupied area storage means, the read-out means to read out a next component waiting to be read out from the placement order storage means.

2. The printed circuit board CAD device of claim 1, wherein the placement position determination means includes:

calculation means for calculating, by placement position determination algorithm, a placement position of the latest component read out by the read-out means outside of areas occupied by components whose placement positions are already determined; and overlap determination means for determining whether the calculated placement position overlaps with the connectors whose routing paths are already determined;

change means for changing, when overlap of the calculated placement position and the connectors whose routing paths are determined is recognized, routing paths of obstacle connectors; and update means for updating, when the routing paths of the obstacle connectors are changed, occupied area information describing an area occupied by the obstacle connectors, the occupied area information being already stored in the occupied area storage means.

3. The printed circuit board CAD device of claim 2, wherein the change means includes:

space area determination unit for determining whether a space area is adjacent to the area occupied by the obstacle connectors, the space area being equal to or larger than the size of the area occupied by the obstacle connectors; and change unit for changing the routing paths of the obstacle connectors so that they pass through the space area when adjacency of the space area and the area occupied by the obstacle connectors is recognized.

4. The printed circuit board CAD device of claim 3, wherein the change means further includes:

read-out unit for reading out, when adjacency of the space area and the area occupied by the obstacle connectors is not recognized, occupied area information describing an area occupied by components and connectors in the vicinity of the area occupied by the obstacle connectors, the occupied area information being written in the occupied area storage means; and movement unit for moving, based on the occupied area information read out by the read-out unit, the components and connectors away from the obstacle connectors, wherein the change unit changes the routing paths of the obstacle connectors so that they pass through an area generated by the movement of the occupied area information, and the update means further updates occupied area information describing an area occupied by components and connectors to be moved when the component and connectors are moved, the occupied area information being written in the occupied area storage means.

5. The printed circuit board CAD device of claim 1 further includes:

net information storage means in which net information describing all connectors and terminals of components connected with the connectors in the schematic circuit diagram is stored, and wherein the routing path determination means includes:

fetch means for fetching, when a placement position of the latest component is determined by the placement position determination means, net information describing connection relation between terminals of the latest component and terminals of the component whose placement position is already determined; and routing path creation means for creating routing paths between terminals described by the fetched net information outside of areas occupied by connectors whose routing paths are already determined on the circuit board.

6. The printed circuit board CAD device of claim 5, wherein the routing path determination means includes:

overlap determination means for determining whether the routing paths created by the routing path creation means overlap with a component whose placement position is already determined;

change means for changing, when overlap of the routing paths created by the routing path creation means and the component whose placement position is already determined is recognized, placement position of the obstacle component and routing paths of its connectors; and update means for updating, when the placement position of obstacle component and routing paths of its connectors are changed, occupied area information written in the occupied area storage means, the occupied area information describing an area occupied by the obstacle component and an area occupied by the obstacle connectors.

7. The printed circuit board CAD device of claim 6, wherein the change means includes:

space area determination unit for determining whether a space area is adjacent to the area occupied by the obstacle connectors, the space area being equal to or larger than the size of the area occupied by the obstacle connectors; and change unit for changing, when adjacency of the space area and the area occupied by the obstacle connectors is recognized, the placement positions of the obstacle component so that it exists in the space area and routing paths of connectors of the obstacle component so that they pass through the space area.

8. The printed circuit board CAD device of claim 7, wherein the change means includes:

read-out unit for reading out, when adjacency of the space area and the area occupied by the obstacle connectors is not recognized, occupied area information describing an area occupied by components and connectors in the vicinity of the area occupied by the obstacle components, the occupied area information being written in the occupied area storage means; and movement unit for moving, based on the occupied area information read out by the read-out unit, the components and connectors away from the obstacle connectors, wherein the change unit changes placement position of the obstacle component so that it exists in the space area, and routing paths of connectors of the obstacle component so that they pass through the space area, wherein the update means further updates the occupied area information describing an area occupied by components and connectors to be moved when the occupied area information is moved, the occupied area information being written in the occupied area storage means.

9. The printed circuit board CAD device of claim 5, wherein information describing whether a connector is a critical path is added to the net information stored in the net information storage means, and wherein the printed circuit board CAD device further includes:

determination means for determining whether the net information fetched by the fetch means is about a critical path by referring to the net information storage means when routing paths are created by the routing path creation means for the component read out by the read-out means;

position moving means for moving, when a critical path is recognized, the component whose placement position is determined to a component which is connected to the component through the critical path, shortening length of the critical path; and update means for updating, when the placement position is moved, a placement position of the component read out by the read-out means from the occupied area storage means with a placement position after the movement, and routing paths of its connectors with routing paths after the movement.

10. The printed circuit board CAD device of claim 9, wherein the position moving means moves the component whose placement position is determined to a component which is connected to the component through a critical path in a broken line, reducing the critical path using a given scale.

11. The printed circuit board CAD device of claim 5, wherein the information describing whether a connector is included in a bus group is added to the net information stored in the net information storage means; and wherein the printed circuit board CAD device further includes:

determination means for determining whether the net information fetched by the fetch means is about a bus group by referring to the net information storage means when routing paths are created by the routing path creation means for a component read out by the read-out means;

position moving means for moving, when a bus group is recognized, the component whose placement position is determined to a component which is connected to the component through the bus group, shortening length of the bus group; and update means for updating, when the placement position is moved, a placement position of the component read out by the read-out means from the occupied area storage means with a placement position after the movement, and routing paths of its connectors with routing paths after the movement.

12. The printed circuit board CAD device of claim 11, wherein the position moving means moves the component whose placement position is determined to a component connected to the component through the bus group in broken lines, reducing the entire bus group using a given scale.

13. The printed circuit board CAD device of claim 1 further includes:

length and width measurement storage means for storing length and width measurements of each component in the component group;

component area calculation means for calculating, when the placement position determination means cannot determine a placement position of a component, area to be occupied by the component and subsequent components on the circuit board by referring to the length and width measurement storage means;

connector area estimation means for estimating area to be occupied by connectors between terminals of the component whose placement position cannot be determined and its subsequent components and terminals of a component whose placement position is already determined; and enlargement means for enlarging circuit board area by total of area to be occupied by the component whose placement position cannot be determined and subsequent components and area to be occupied by connectors between terminals of the component whose placement positions cannot be determined and its subsequent components and terminals of the component whose placement position is already determined.

14. The printed circuit board CAD device of claim 13, wherein the length and width measurement storage means stores length and width measurements of each component in the component group, wherein the component area calculation means calculates, when the placement position determination means cannot determine a placement position of a component, area to be occupied by the component and subsequent components on the circuit board by referring to the length and width measurement storage means, wherein the connector area estimation means estimates area to be occupied by connectors between terminals of the component whose placement position cannot be determined and its subsequent components and terminals of a component whose placement position is already determined, and wherein the enlargement means enlarges circuit board area by total of area to be occupied by the component whose placement position cannot be determined and subsequent components and area to be occupied by connectors between terminals of the component whose placement positions cannot be determined and its subsequent components and terminals of the component whose placement position is already determined.

15. The printed circuit board CAD device of claim 1 further includes:

function block storage means for storing all function blocks and components included in each of them in the schematic circuit diagram;

area storage means for storing all function blocks in the schematic circuit diagram and a circuit board area assigned to each of them; and wherein the placement position determination means determines placement positions of components included in a function block in a circuit board area assigned to the function block, referring to the area storage means, and the routing path determination means determines, when a placement position of a component is determined, routing paths of connectors between terminals of the component and terminals of a component whose placement position is already determined in a function block which includes the component.

16. The printed circuit board CAD device of claim 15 further includes:

function block determination means for determining, when the placement position determination means cannot determine a placement position of a component, which function block includes the component; and area enlargement means for enlarging a circuit board area assigned to the function block which includes the component.

17. The printed circuit board CAD device of claim 1 further includes:

outline generation means for generating, when placement positions of components in the schematic circuit diagram are determined and all routing paths between terminals of the components are determined, an outline of an area occupied by the components; and circuit board area creation means for creating a circuit board area enclosed by the outline.

18. The printed circuit board CAD device of claim 1 further includes extending means for extending, when routing paths of connectors of one component are determined by the routing path determination means, a given length of connector from terminals of a component which is to be connected with terminals of the next component.

19. The printed circuit board CAD device of claim 18 further includes:

occupied terminal storage means for storing a prohibition area around terminals of a chip component in an area occupied by components whose placement positions are determined, the prohibition information corresponding to net information on the terminals; and terminal presence determination means for determining whether net information is stored in the occupied terminal storage means, the net information including terminals of the latest component read out by the read-out means and terminals of a component which is already placed, wherein the placement position determination means determines a placement position of the component read out by the read-out means, allowing overlap of a pair of terminals included in the net information stored in the occupied terminal storage means.

20. The printed circuit board CAD device of claim 1, wherein the placement position determination means includes:

first calculation means for calculating, by placement position determination algorithm, a placement position of the latest component read out by the read-out means outside of areas occupied by components whose placement positions are already determined;

first determination means for determining whether the calculated placement position overlaps with connectors whose routing paths are already determined;

first change means for changing, when overlap of the calculated placement position and the connectors whose routing paths are already determined is recognized, routing paths of the obstacle connectors;

first update means for updating, when the routing paths of the obstacle connectors are changed, occupied area information describing an area occupied by the obstacle connectors, the occupied area information being written in the occupied area storage means;

second determination means for determining whether the routing paths created by the routing paths creation means overlap with a component whose placement position is already determined;

second change means for changing, when overlap of the routing paths created by the routing paths creation means and the component whose placement position is determined is recognized, a placement position of the obstacle component and routing paths of its connectors; and second update means for updating, when the placement position of the obstacle component and the routing paths of its connectors are changed, occupied area information written in the occupied area storage means, the occupied area information describing an area occupied by the obstacle component and an area occupied by the obstacle connectors.

21. A printed circuit board CAD device for determining a placement position of each component and routing paths of connectors between them in a schematic circuit diagram comprising:

placement order storage means in which placement order of components is stored;

read-out means for reading out, while avoiding any components whose placement positions are already determined, a next component waiting to be read out from the placement order storage means;

occupied area storage means in which occupied area information describing, when the next component is read out by the read-out means, an area occupied by a component whose placement position is already determined and connectors whose routing paths area are already determined on a circuit board is stored;

placement position determination means for determining a placement position of a latest component read out by the read-out means, while avoiding the occupied area on the circuit board by referring to the occupied area information already stored in the occupied area storage means, including determining a space area adjacent an occupied area on the circuit board;

routing path determination means for determining, during a period starting from a point when the placement position of the latest component is determined by the placement position determination means to a point when a placement position of the next component is determined by the placement position determination means, routing paths of connectors between terminals of the latest component and terminals of a component whose placement position is already determined, avoiding the occupied area on the circuit board by referring to the occupied area information already stored in the occupied area storage means, including the space area adjacent an occupied area which can be used for routing paths;

write-in means for writing, when the routing paths of the connectors are determined, occupied area information describing an area occupied by the component whose placement position is already determined and by the connectors whose routing paths are already determined in a space area of the occupied area storage means, including any adjacent space area that is now occupied; and instruction means for instructing, when the occupied area information, describing the area occupied by the component whose placement position is already determined and by the connectors whose routing paths are already determined, is written in the space area of the occupied area storage means, the read-out means to read out a next component waiting to be read out from the placement order storage means.

* * * * *